(12) United States Patent
Yoda

(10) Patent No.: US 6,654,100 B2
(45) Date of Patent: Nov. 25, 2003

(54) STAGE DEVICE AND EXPOSURE APPARATUS, AND METHOD OF MANUFACTURING A DEVICE

(75) Inventor: Yasushi Yoda, Chiba (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/801,683

(22) Filed: Mar. 9, 2001

(65) Prior Publication Data

US 2002/0015140 A1 Feb. 7, 2002

(30) Foreign Application Priority Data

Mar. 9, 2000 (JP) ........................................ 2000-064663

(51) Int. Cl.$^7$ ........................ G03B 27/42; G03B 27/52; G03B 27/32; A61N 5/00; G03C 5/00
(52) U.S. Cl. .......................... 355/53; 355/55; 355/72; 355/75; 355/77; 250/492.2; 250/492.22; 430/311
(58) Field of Search ............................. 355/53, 55, 72, 355/75, 77; 250/492.2, 492.22; 430/311

(56) References Cited

U.S. PATENT DOCUMENTS

| | | | |
|---|---|---|---|
| 5,031,976 A | | 7/1991 | Shafer |
| 5,220,454 A | | 6/1993 | Ichihara et al. |
| 5,365,342 A | * | 11/1994 | Ayata et al. |
| 5,488,229 A | | 1/1996 | Elliott et al. |
| 5,646,413 A | | 7/1997 | Nishi |
| 5,668,672 A | | 9/1997 | Oomura |
| 5,689,377 A | | 11/1997 | Takahashi |
| 5,715,064 A | | 2/1998 | Lin |
| 5,717,518 A | | 2/1998 | Shafer et al. |
| 5,801,832 A | * | 9/1998 | Van Den Brink |
| 5,812,407 A | * | 9/1998 | Sato et al. |
| 5,835,275 A | | 11/1998 | Takahashi et al. |
| 5,923,409 A | | 7/1999 | Hamada et al. |
| 5,969,441 A | | 10/1999 | Loopstra et al. |

FOREIGN PATENT DOCUMENTS

| | | |
|---|---|---|
| EP | 0 816 892 A2 | 6/1997 |
| JP | A-3-282527 | 12/1991 |
| JP | A-7-176448 | 7/1995 |
| JP | A-8-6323 | 1/1996 |
| JP | A-8-51069 | 2/1996 |
| JP | A-8-171054 | 7/1996 |
| JP | A-8-334695 | 12/1996 |
| JP | A-9-320956 | 12/1997 |
| JP | A-10-3039 | 1/1998 |
| JP | A-10-20195 | 1/1998 |
| JP | A2001-203140 | 7/2001 |
| WO | WO 98/24115 | 6/1998 |

* cited by examiner

Primary Examiner—Frank G. Font
Assistant Examiner—Khaled Brown
(74) Attorney, Agent, or Firm—Oliff & Berridge PLC

(57) ABSTRACT

A stage device includes a switching device that switches between a first state in which a stage can move along a first movement reference surface, and a second state in which the stage can move along a second movement reference surface. The stage device can have first and second stages, and the switching device can switch both stages between the first and second states, such that the first stage is switched to the first movement reference surface while the second stage is switched to the second movement reference surface and vice-versa. Because of this, even if the first movement reference surface is formed on a first reference member (e.g., a holding plate) and the second reference surface is formed on a second reference member (e.g., guides), no problems are generated due to movement of the first and second stages. Compared to a case on which the first and second movement reference surfaces are formed on a single reference member, the first reference member can be made smaller. Therefore, difficulty of processing the reference surfaces can be overcome because it is easier to precisely process smaller surfaces.

41 Claims, 18 Drawing Sheets

STAGE DEVICE AND EXPOSURE APPARATUS, AND METHOD OF MANUFACTURING A DEVICE

BACKGROUND OF THE INVENTION

1. Field of Invention

This invention relates to a stage device and an exposure apparatus, and to a method of manufacturing a device, and more specifically to a stage device that drives a stage on which an object is mounted, an exposure apparatus provided with the stage device as, for example, a driving device of a substrate, and to a method of manufacturing a device using the exposure apparatus.

2. Description of Related Art

Conventionally, in a lithographic process to manufacture a semiconductor element, a liquid crystal display element, or the like, an exposure apparatus has been used that transfers a pattern formed on a mask or a reticle (hereafter referred to as "reticle") onto a substrate (hereafter referred to as "wafer") such as a glass plate or a wafer, where a resist or the like is coated, through a projection optical system.

In this type of exposure apparatus, in order to position a wafer at an exposure position with high accuracy, a stage device has been used to control a position and a posture in six degrees-of-freedom, such as X, Y, Z, $\theta_X$, $\theta_Y$, $\theta_Z$, of a wafer holder that holds the wafer. It is common in this type of stage device to drive an XY stage in the two-dimensional X-Y direction by a Y-axis driving linear motor and a pair of X-axis driving linear motors. In addition, a $\theta_Z$ table mounted on the X-Y stage, and a three degrees-of-freedom driving table (Z leveling table), mounted on the $\theta_Z$ table, drive a wafer holder that holds a wafer in three degrees-of-freedom directions such as Z, $\theta_X$, and $\theta Y$.

In general, the XY stage moves on a holding plate (a stage base) having a smooth reference surface. Additionally, the XY stage is non-contactingly supported over the reference surface by a non-contact bearing, for example, an air bearing, arranged at the bottom of the XY stage with a clearance of several $\mu$m. Therefore, a posture of the XY stage with respect to the reference surface can be constantly maintained, and a long life expectancy can be expected by avoiding the effects of mechanical friction.

Meanwhile, in a conventional exposure apparatus, when an exposure operation for a wafer mounted on an XY stage is completed, wafer replacement and alignment (search alignment, fine alignment) are performed, then exposure is performed, and then wafer replacement is again performed. Thus, three significant operations, such as: (1) wafer replacement; (2) alignment; (3) exposure; and (4) wafer replacement, or the like, are repeated. Because of this, time (hereafter referred to as "overhead time") for wafer replacement and alignment causes deterioration of throughput. Therefore, many "plurality of stages" arrangements have been suggested in which a plurality of stages are prepared, wafer replacement and alignment are performed on a separate stage during wafer exposure on one stage, and throughput is improved by such simultaneous parallel processing (e.g., see Japanese Laid-Open Patent Application No. 8-51069 and WO98/24115).

In an exposure apparatus with a plurality of stages as described above, compared to a single-stage type exposure apparatus, a stage moving area is naturally enlarged. Therefore, a reference surface used during stage movement, and as a result, a holding plate on which the reference surface is formed, needs to be enlarged (making its area large). The holding plate, particularly the reference surface, becomes a reference during stage movement. Thus, extremely high accuracy processing for the surface is required in order to suitably maintain stage stability and position controllability. However, it is extremely difficult to fabricate a large holding plate with a high surface accuracy. In addition, the cost increases as the reference surface area increases. Furthermore, as the holding plate becomes enlarged, it is difficult to support the holding plate without affecting the reference surface by warping due to its own weight. As a result, this deteriorates controllability of the position of the stage.

These shortcomings are not limited to a plurality of stages, but apply to an exposure apparatus with a single stage as well. In addition, in future exposure apparatus, as a wavelength for exposure is shortened, there is a high possibility of using a catadioptric system as a projection optical system. A diameter of a bottom part of this catadioptric system is large, so a distance between an exposure part and an alignment part or a wafer replacement part naturally becomes long. Furthermore, this is not limited to a catadioptric system, but even in a dioptric system, when a diameter of a projection optical system is enlarged in order to improve a numerical aperture, in the same manner, a distance between an exposure part and an alignment part or a wafer replacement part naturally becomes long. This causes enlargement of the holding plate due to an area increase in a range where the stage moves. In addition to this, the time between wafer replacement alignment and exposure naturally takes long, so this causes deterioration of throughput. Therefore, one problem to be solved is how this time can be shortened in order to improve throughput.

Additionally, when an exposure operation that improves throughput, an alignment operation, and a substrate replacement operation are simultaneously performed in a parallel manner by a plurality of stages, vibration due to driving one stage is transmitted to the other stages via the holding plate, so controlling the position of each stage deteriorates.

SUMMARY OF THE INVENTION

This invention is made in consideration of the above-mentioned circumstances. One object of the invention is to provide a stage device that can suitably maintain control of the position of the stage.

Another object of this invention is to provide an exposure apparatus that improves exposure accuracy with respect to a substrate on a stage and simultaneously improves throughput.

A further object of this invention is to provide a method of manufacturing a device with improved productivity, resulting in a device having a high level of integration.

A stage device according to one aspect of the invention is provided with a movable stage that holds an object. A first reference member on which a first movement reference surface is formed, is used as a reference when the stage moves. A second reference member on which a second movement reference surface, different from the first movement reference surface, is formed is provided. In addition, a switching device switches between a first state in which the stage is movable along the first movement reference surface, and a second state in which the stage is movable along the second movement reference surface.

According to this aspect of the invention, the switching device switches between a first state in which the stage is movable along the first movement reference surface and a second state in which the stage is movable along the second movement reference surface. Because of this, there is no inconvenience for stage movement even if the first reference member on which the first movement reference surface is formed is arranged physically separated from the second reference member on which the second movement reference surface is formed. Compared to the case on which the first movement reference surface and the second movement reference surface are formed on the same reference member, an area of the reference surface of the respective reference members can be made smaller. Therefore, for example, even if holding plates are used as the first reference member and as the second reference member, the respective reference surfaces can be processed with high accuracy. Thus, processing difficulty of the reference surfaces can be overcome. At the same time, stage stability can be ensured during movement in which the first and second reference surfaces are used as references, and positional controllability of the stage can be maintained.

In this case, the first and second reference members can be similar types of members, or can be constituted by different types of members. In the latter case, for example, the first reference member can be a holding plate, and the second reference member can be a pair of guides. In this case, compared to the case where the first and second reference members are holding plates, the entire stage device can be made more light-weight. Furthermore, for example, when highly accurate positional controllability (including stability) of the stage is required in a specified region and highly accurate positional controllability of the stage is not required outside the specified region, the first reference member on which the first movement reference surface is formed is located in the specified region and is constituted by a holding plate, and the second reference member on which the second movement reference surface is formed is located outside the specified region, and is constituted by the pair of guides. Therefore, the holding plate can be made smaller, and its processing can be simplified. Furthermore, the required accuracy of positional controllability of the stage can be obtained.

stage device according to another aspect of the invention includes a first stage and a second stage. The first stage moves within a first region that includes a specified region. The second stage moves within a second region that also includes the specified region. A first reference member includes a first movement reference surface that is located in the specified region. In addition, at least one second reference member is provided, and includes a second movement reference surface located outside the specified region. The second movement reference surface is used as a reference by a specified stage, which is at least one stage among the first and second stages. A switching device is provided to switch between a first state in which the specified stage can move within the specified region, and a second state in which the specified stage can move outside of the specified region.

Here, "at least one second reference member on which a second movement reference surface outside the specified region" refers to the following context, respectively, depending on whether the specified stage is one or both of the first and second stages and whether one or a plurality of second reference members are provided. (a) If the specified stage is one of the first and second stages, the second movement reference surface outside the specified region is formed on the second reference member, and a third movement reference surface outside the specified region is provided for the other stage. (b) If the specified stage refers to both the first and second stages, the second movement reference surface outside the specified region is formed on the second reference member for use by both stages. (c) In the case of a plurality of second reference members when the specified stage refers to both the first and second stages, the second movement reference surface outside the specified region can be formed on different second reference members.

According to this aspect of the invention, there is provided a first reference member on which a first movement reference surface in a specified region of the first and second stages is formed and at least one second reference member on which a second movement reference surface outside the specified region of a specified stage, which is at least one stage among the first and second stages. Additionally, a switching device switches between a first state in which the specified stage can move in the specified region along the first movement reference surface of the first reference member, and a second state in which the specified stage can move outside of the specified region along the second movement reference surface of the second reference member. Because of this, even if the first reference member on which the first movement reference surface in the specified region is formed is arranged physically separate from the second reference member on which the second movement reference surface outside the specified region is formed, there is no inconvenience for movement of the specified stage, which is at least one stage among the first and second stages, in the specified region and outside of the specified region. Therefore, compared to the case when the first movement reference surface of the specified region and the second movement reference surface outside of the specified region of the first and second stages are formed on the same reference member, an area of the respective reference members can be made smaller. In particular, when the specified stage is both the first and second stages and there are two second reference members, an area of the first movement reference surface in the specified region, that is, the first reference member, can be minimized.

Therefore, for example, even if a holding plate is used as the first and second reference members, the respective movement reference surfaces can be processed with high accuracy. Accordingly, processing difficulty of the movement reference surfaces can be overcome, stability of the respective stages can be ensured during movement when the first and second reference members are used as references, and the positional controllability of the stages can be suitably maintained.

In this case, a single second reference member in addition to the first reference member can also be used for both stages. However, it is preferable that two second reference members are separately arranged corresponding to the respective first and second stages. In this case, as described earlier, an area of the first movement reference surface of the first reference member can be minimized. At the same time, second reference members are separately arranged corresponding to the respective stages, so when the first and second states of the first and second stages are respectively switched by a switching device, it is possible for both stages to avoid the use of one reference member simultaneously. Therefore, vibration due to movement of one stage is not transmitted to the other stage via a reference member, and positional controllability of the respective stages can be improved.

The first and second reference members can be constituted by the same type of members, but can also be constituted by different types of members. In the latter case, for example, the first reference member can be a holding plate, and the second reference member can be a pair of guides. In this case, compared to the case when the first and second reference members are holding plates, the entire stage device can be made more light-weight. Furthermore, for example, when highly accurate positional controllability (including stability) of a stage in the specified region is required and highly accurate positional controllability is not as important outside of the specified region, the first reference member on which the first movement reference surface in the specified region of both stages is formed can be constituted by a highly accurate and precisely processed holding plate, and the second reference member on which the second movement reference surface outside the specified region of at least one stage is formed can be constituted by a pair of guides that do not need to be processed with as high a degree of accuracy as the holding plate. Therefore, the holding plate can be made smaller, enabling its processing to be simplified, and the required accuracy of positional controllability of the stage can be satisfied.

The switching device can include actuators the relatively move the first and second reference members in a direction perpendicular to the first and second movement reference surfaces, and drivers that drive the specified stage along the first movement reference surface. In this case, even if a positional relationship between the first movement reference surface in the specified region and the second movement reference surface outside the specified region formed on the second reference member is shifted from a desired positional relationship in a direction (hereafter referred to as "normal line direction") perpendicular to the first and second movement reference surfaces, by relatively moving the first and second reference members in the normal line direction by the actuators, they can be adjusted to the desired positional relationship. After this adjustment, by driving the specified stage along the first and second movement reference surfaces between the specified region and the region outside of the specified region by the driver, the specified stage can be switched between the first and second states.

Here, the actuators can drive either the first or second reference members in the normal line direction or can relatively drive both the first and second reference members in the normal line direction.

The actuators can include at least one of a mechanical actuator, an electromagnetic actuator, an actuator that converts electrical power to mechanical power, and an actuator using a vacuum.

The switching device can switch between a first support state that supports the specified stage over the first reference member due to a balance of a vacuum preload force and a hydrostatic pressure of pressurized gas between the specified stage and the first reference member, and a second support state that supports the specified stage over the second reference member due to a balance of a vacuum preload force and a hydrostatic pressure of pressurized gas between the specified stage and the second reference member.

In this case, the switching device, as the specified stage is switched between the first and second states, mutually switches from the first support state to the second support state of the specified stage. Because of this, in the case of completely different areas of the first movement reference surface on the first reference member and the second movement reference surface on the second reference member, pressurized gas corresponding to the areas of the respective movement reference surfaces is emitted, so an appropriate emission state of pressurized gas corresponding to the respective support states can be accomplished. Because of this, wasteful emission of pressurized gas can be prevented.

Furthermore, in this case, a relative position in the normal line direction of at least one of the first and second reference members and the specified stage can be adjusted by adjusting the balance in at least one of the first and second support states of the specified stage. As a result, the relative position in a normal line direction of the first and second reference members can be substantially adjusted by adjusting the balance in at least one of the first and second support states of the specified stage.

The driver can include first actuators that drive the specified stage in the specified region and second actuators that drive the specified stage outside the specified region. Therefore, for example, when one stage is the specified stage, it is possible to prevent vibration that occurs when the specified stage moves using the second movement reference surface on the second reference member as a reference from being transmitted via that reference member to the other stage which moves using the first movement reference surface formed on the first reference member as a reference. In addition, it is also possible to prevent vibration from being transmitted to the other stage via the driver. Therefore, positional controllability of the stages can also be further improved.

A stage device according to another aspect of the invention includes a first stage that moves within a first region that includes a specified region, and a second stage that moves within a second region that also includes the specified region. In addition, a stage base is provided, and includes a first movement reference surface that is used as a reference when the first and second stages move in the specified region, and second and third movement reference surfaces that are positioned on opposite sides of the first movement reference surface in the moving directions of the first and second stages and that are used as references when the first and second stages respectively move outside the specified region. A surface accuracy of the second and third movement reference surfaces is rougher than a surface accuracy of the first movement reference surface.

According to this aspect of the invention, when highly accurate positional controllability (including stability) of the stages is required when moving in the specified region, and highly accurate positional controllability (including stability) of the stages is not required when moving outside the specified region, the positional controllability of both stages that is required inside the specified region and outside the specified region can be maintained. In this case, it suffices to increase only the surface accuracy of the first movement reference surface among the first, second, and third movement reference surfaces formed on the stage base. Therefore, even if movement reference surfaces that are used as references when the first and second stages are moved are formed on one stage base, a reference surface of the stage base can be easily processed.

In this aspect of the invention, a clearance changing device may be further provided that changes a clearance between the first movement reference surface and the first and second stages when the first and second stages move in the specified region, and a clearance between the second and third movement reference surfaces and the first and second stages when the first and second stages move outside the specified region. In this case, when the respective stages move by using the first movement reference surface, which has high surface accuracy, as a reference, the clearance changing device improves positional controllability by making the clearance between the stage and the movement reference surface small. When the respective stages move by using the second or third movement reference surfaces, which have a lower surface accuracy, as a reference, the clearance changing device makes the clearance between the stage and the movement reference surface larger. Thus, the stage can be prevented from contacting a movement reference surface with low surface accuracy.

It is also possible to provide first and second actuators that respectively drive the first and second stages along the first movement reference surface, and third and fourth actuators that are arranged independently from the first and second actuators, and respectively drive the first and second stages along the second and third reference surfaces. In this case, vibration that occurs when one stage moves is not transmitted to the other stage via the actuators, so positional controllability of both stages can be further improved.

The first and third actuators may be linear motors having (i.e., sharing) a common movable part, and having mutually different stationary parts. The second and fourth actuators may be linear motors having a common movable part and having mutually different stationary parts, and the first and second actuators may have a common stationary part. In this case, the first stage is driven by the first and third actuators, and the second stage is driven by the second and fourth actuators. Additionally, the movable part that drives the respective stages is common, and the stationary part that drives both stages in the specified region is common. Therefore, even though the stage device has four pairs of actuators, it is only necessary to provide three pairs of stationary parts and two pairs of movable parts. Therefore, the entire stage device can be made lighter in weight. Furthermore, for example, if both stages are not simultaneously located in the specified region, vibration of one stage is not transmitted to the other stage via the actuators, so positional controllability of the respective stages can also be improved.

Another aspect of the invention relates to an exposure apparatus that exposes substrates with an energy beam and transfers a predetermined pattern onto the substrates. Such an exposure apparatus includes the stage device according to any of the aspects of the invention mentioned above. The stage device can be used to hold the substrates, for example.

The positional controllability of the respective stages can be suitability maintained whether they are located in the specified region or outside of the specified region, depending on the required accuracy. Furthermore, exposure is performed for the substrates on the first and second stages when located in the specified region, and at least one of substrate alignment and substrate replacement is performed on the first and second stages when located outside of the specified region, so simultaneous parallel processing of the two stages can be performed. Therefore, exposure accuracy and throughput can be simultaneously improved.

In this case, the first and second stages may be provided with moving tables on which the substrates are respectively mounted and moving guides that drive the moving tables in a first direction and can be moved in a second direction perpendicular to the first direction. The first and second stages may be further provided with a controller that causes the one moving table on which the substrate alignment is completed to wait in the vicinity of the position in which the exposure is performed during the performance of substrate exposure on the other moving table. In this case, the respective stages are provided with moving tables on which substrates are mounted and moving guides that drive the moving tables in a first direction and can be moved in a second direction perpendicular to the first direction. Therefore, the respective moving tables (and substrates) can be moved in a two-dimensional direction. Furthermore, by providing a controller that causes one moving table on which substrate alignment is completed to wait in the vicinity of the position at which the exposure is performed during the substrate exposure on the other moving table, the exposure operation of the substrate on the other stage can begin immediately after exposure of the one stage is completed, and throughput can be further improved. Additionally, even when the distance between the exposure position and the alignment position becomes long, deterioration of throughput can be controlled.

Another aspect of the invention relates to a method of manufacturing a device including a lithography process that performs exposure using the exposure apparatus described above.

According to this aspect of the invention, productivity of manufacturing devices having a high degree of integration can be improved due to improvement of exposure accuracy and throughput.

BRIEF DESCRIPTION OF THE DRAWINGS

The invention will be described in conjunction with the following drawings in which like reference numerals designate like elements and wherein.

DETAILED DESCRIPTION OF PREFERRED EMBODIMENTS

[First Embodiment]

The following explains a first embodiment of this invention with reference to FIGS. 1–14.

Figure 1:
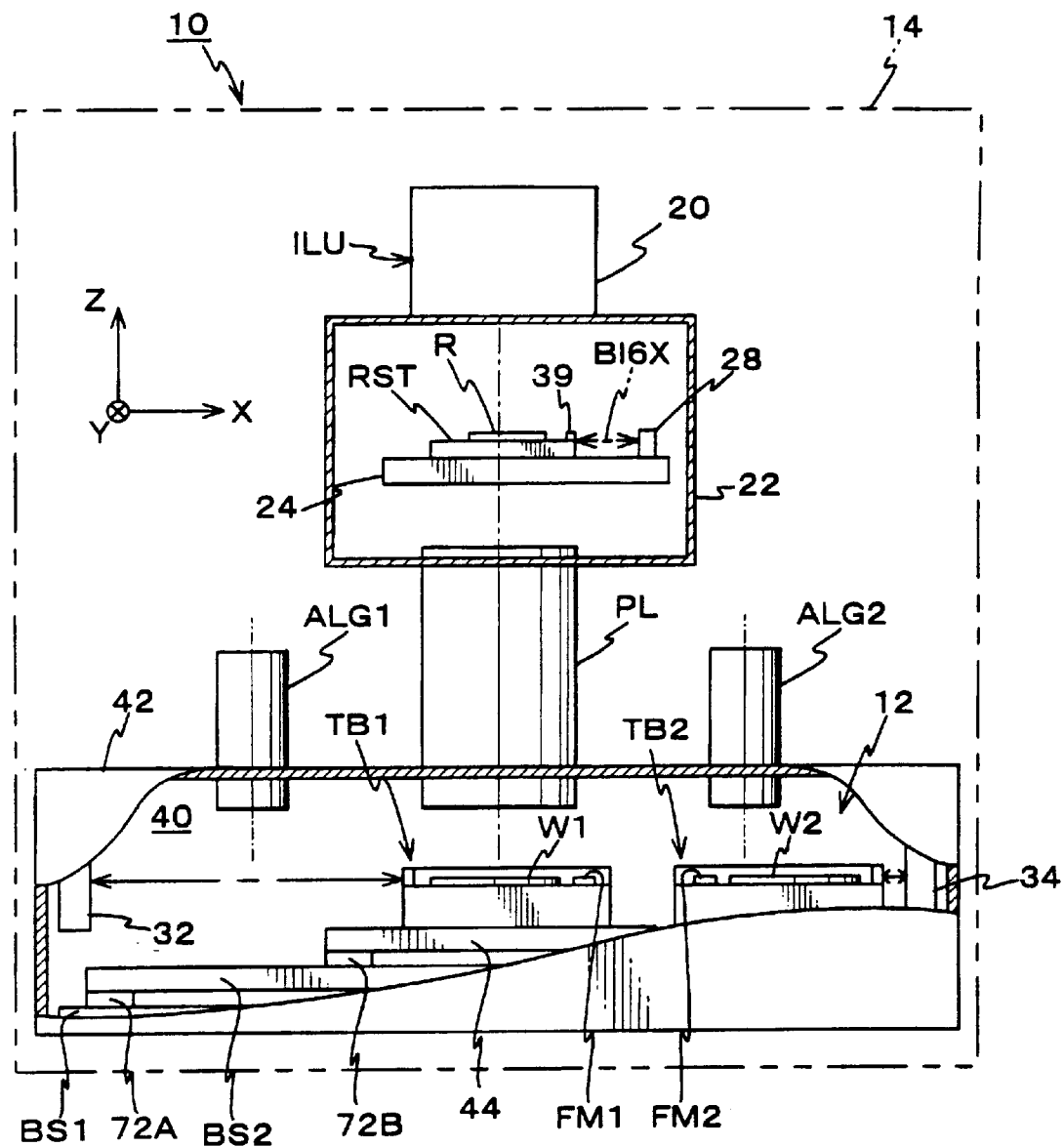
FIG. 1 is a schematic diagram showing a structure of an exposure apparatus according to a first embodiment of the invention.

FIG. 1 shows a schematic structure of an exposure apparatus 10 according to the first embodiment. This exposure apparatus 10 is a so-called step-and-scan type scanning exposure apparatus, that is, a so-called scanning stepper.

This exposure apparatus 10 includes an illumination system that includes an undepicted light source and an illumination unit ILU and illuminates a reticle R as a mask from an upper direction by an exposure illumination light. In addition, a reticle driving system is included that drives the reticle R mainly in a predetermined scanning direction, that is, a Y-axis direction (direction perpendicular to the plane of the paper in FIG. 1). Apparatus 10 also includes a projection optical system PL which is arranged under the reticle R as an optical system for exposure. A stage device 12 as a substrate driving device is included that includes wafer tables TB1 and TB2, which are arranged under the projection optical system PL and hold respective wafers W1 and W2 as substrates (objects), and move independently in an XY two-dimensional plane, and/or the like.

The above-mentioned components, excluding the undepicted light source, are stored within an environment control chamber (hereafter referred to as "chamber") 14 that is arranged on a floor surface of a super-clean room and in which temperature, humidity, and the like is accurately controlled.

The light source can be, for example, a pulse laser light source that outputs a pulsed ultraviolet ray in a vacuum ultraviolet wavelength region. Such light sources can be, for example, an $F_2$ laser light source (output wavelength 157 nm), an ArF excimer laser light source (output wavelength 193 nm), or the like. This light source can be arranged in another clean room in which the degree of cleanliness is lower than that of the super-clean room in which the compartment 14 is arranged. The light source could also be arranged in a service space beneath the floor of the clean room and be connected to the illumination unit ILU within the compartment 14 via an undepicted connecting optical system.

Figure 9:
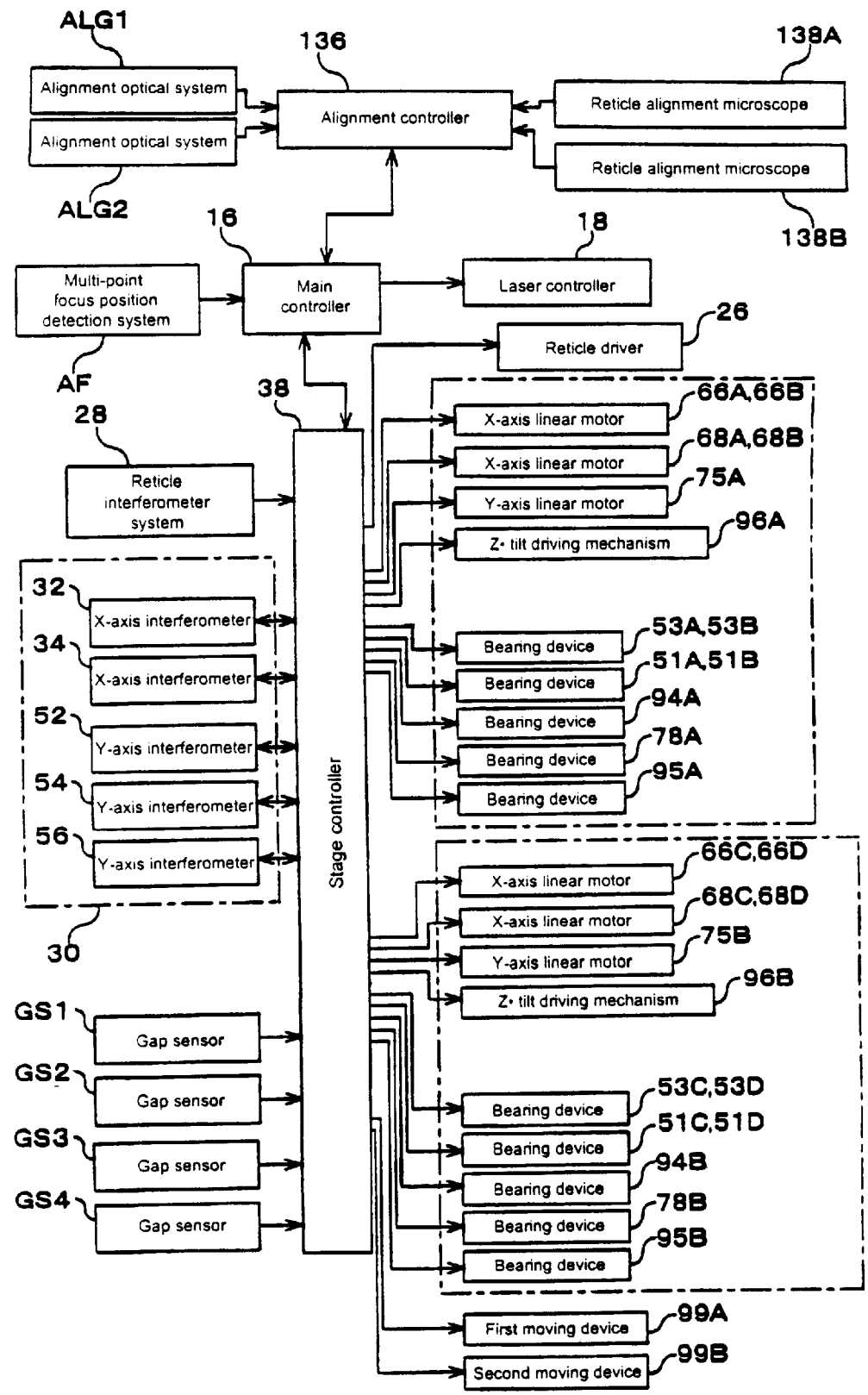
FIG. 9 is a block diagram showing a structure of a control system in an exposure apparatus according to the first embodiment.

The repeating frequency (oscillating frequency) of the pulse emitting light, pulse energy, or the like emitted by the light source is controlled by a laser controller 18 (not depicted in FIG. 1, but depicted in FIG. 9) under the instructions of a main controller 16 (not depicted in FIG. 1, but depicted in FIG. 9).

Furthermore, as a light source, an ultraviolet light source such as a KrF excimer laser light source (output wavelength 248 nm) or another vacuum ultraviolet light source such as an $Ar_2$ laser light source (output wavelength 126 nm) can be used.

The illumination unit ILU is constituted by an illumination system housing 20, which is air-tight with respect to outside air, and which holds at a predetermined positional relationship an illumination optical system constituted by a secondary light-source forming optical system, a beam splitter, a light-collecting lens system, a reticle blind, an imaging lens system (all undepicted), and the like. The illumination unit ILU illuminates a rectangular (or arcuate) illumination region IAR (see FIG. 2) on the reticle R with uniform illumination. The same structure of illumination optical system which is disclosed in, for example, Japanese Laid-Open Patent Application No. 9-320956 is used.

Clean helium gas (He), dry nitrogen gas ($N_2$), or the like having an air (oxygen) concentration that is less than several ppm is supplied within the illumination system housing 20.

The reticle driving system is housed within a reticle chamber 22 shown in FIG. 1. Furthermore, in a connecting part between the reticle chamber 22 and the illumination housing 20, a light transmission window formed of fluorite or the like is formed. Furthermore, clean helium gas (He), dry nitrogen gas ($N_2$), or the like having an air (oxygen) concentration that is less than several ppm is supplied within the reticle chamber 22.

The reticle driving system is provided with a reticle stage RST which can move within an XY two-dimensional plane along a reticle base plate 24 shown in FIG. 1 while holding reticle R. The reticle driving system also includes a reticle driver 26 (not depicted in FIG. 1, but depicted in FIG. 9) including an undepicted linear motor or the like which drives the reticle stage RST, and a reticle interferometer system 28 that measures the position of the reticle stage RST.

The reticle stage RST is floatingly supported on (over) the reticle base plate 24 via an undepicted non-contact bearing, for example, a vacuum preload gas hydrostatic bearing device. Additionally, the reticle stage RST is constituted by a reticle coarse stage and a reticle fine-moving stage. The reticle coarse stage is driven in a predetermined stroke range in a Y-axis direction, which is the scanning direction. The reticle fine-moving stage is driven, with respect to the reticle coarse stage, minutely in an X-axis direction, a Y-axis direction, and a $\theta_Z$ direction (rotational direction about the Z-axis) by a driving mechanism formed by a voice coil motor or the like. The reticle R is adsorptively held on the reticle fine-moving stage by an electrostatic chuck or a vacuum chuck, which are not depicted. Additionally, in this embodiment, although not depicted, it is preferable to provide structure whereby a reaction force that is generated by movement of the reticle coarse stage can be absorbed (i.e., prevented from causing vibration or other movement of the structure that supports the reticle stage RST) by relatively moving the moving parts and the stationary parts of the linear motors that drive the reticle coarse stage in mutually opposite directions with respect to the reticle base plate 24. Such an arrangement is disclosed in, for example, Japanese Laid-Open Patent Application No. 8-6323.

As described above, the reticle stage RST is actually constituted by two stages; however, in order to simplify the explanation, it is explained as one stage in which scanning and driving in the Y-axis direction, minute-rotation in the Oz direction, and minute-driving in the X- and Y-axis directions are performed by the reticle driver 26. Furthermore, the reticle driver 26 is a mechanism that uses a linear motor, a voice coil motor, or the like as a driving source, but this is shown as a block in FIG. 9 in order to simplify the drawing.

Figure 2:
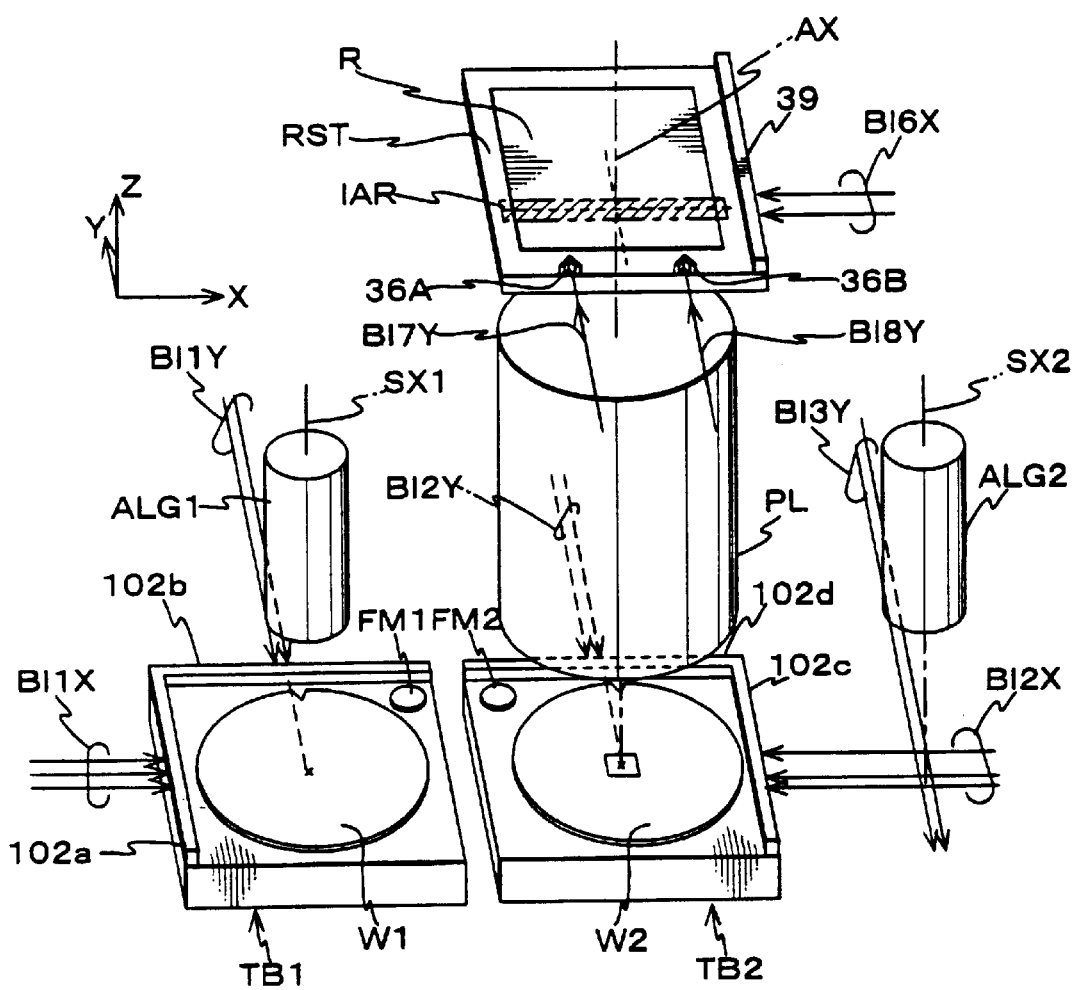
FIG. 2 is a perspective view showing a positional relationship of two wafer tables, a reticle stage, a projection optical system, and two alignment optical systems.

As shown in FIG. 2, a planar moving mirror 39 that is formed of the same material as the reticle stage RST (e.g., ceramic or the like) extends in the Y-axis direction and is located on one X-direction side (+X side) of the reticle stage RST. A reflective surface is formed on the one side surface of the X-axis of the moving mirror 39 by a mirror surfacing process. An interferometer beam supplied from an interferometer that is part of the interferometer system 28 of FIG. 1 is irradiated toward the reflective surface of the moving mirror 39 along a measurement axis BI6X. By receiving the reflected light in the interferometer and measuring a relative displacement with respect to a reference surface, the position of the reticle stage RST is measured. The interferometer having measurement axis BI6X actually has two interferometer optical axes that can be independently measured, so as to enable the positional measurement of the reticle stage RST in the X-axis direction and a yawing amount. The interferometer with this measurement axis BI6X is used in order to rotate and control the reticle stage RST in the direction that cancels the relative rotation (rotational discrepancies) between the wafer and the reticle based on the X-axis positional information and the yawing information of the wafer table TB1 (or TB2), which is supplied from the interferometer 32 (or 34) (see FIG. 3) having the measurement axis BI1X (or BI2X) in the wafer stage side, which will be described later. Using the information from the interferometers enables the performance of X-direction synchronization control (positioning).

A pair of corner cube mirrors 36A and 36B are arranged at one side (the front side of the paper plane of FIG. 1) in the Y-axis direction, which is a scanning direction of the reticle stage RST. Furthermore, interferometer beams shown by the measurement axes BI7Y and BI8Y in FIG. 2, which are supplied from a pair of double pass interferometers, not depicted, irradiate the corner cube mirrors 36A and 36B and are reflected by the cube mirrors 36A and 36B to an undepicted reflective surface arranged on the reticle base plate 24. The light then is reflected from the reflective surface on the reticle base plate 24 and returns along the same optical path so as to be received by the respective double pass interferometers, which then provide data by which to determine the relative displacement of the respective corner cube mirrors 36A and 36B from a reference position (the reflective surface on the reticle base plate 24 at the reference position). The measurement values of the double pass interferometers are supplied to the stage controller 38 (not depicted in FIG. 1, but depicted in FIG. 9), and based on the average of their values, the position of the reticle stage RST in the Y-axis direction is measured. The information of the Y-axis direction position is used for calculation of the relative position between the reticle stage RST and the wafer tables TB1 and TB2 based on the measurement value provided by the interferometer 54 having the measurement axis BI2Y (see FIG. 3) in the wafer side, which will be discussed later. Using the information from these interferometers, synchronization control of the wafer and the reticle in the scanning direction (Y-axis direction) is performed during scanning exposure.

Thus, in this embodiment, a reticle interferometer system 28 is constituted by a pair of double pass interferometers shown by the measurement axes BI7Y and BI8Y and an interferometer shown by the measurement axis BI6X.

Furthermore, the material used to form the glass substrate that constitutes the reticle R is selected based upon the light source to be used. For example, when a vacuum ultraviolet light source such as an $F_2$ laser light source or the like is used for a light source, fluoride crystal such as fluorite, magnesium fluoride, lithium fluoride, or the like, or a quartz composition (fluorine doped quartz) or the like, having a hydroxide density that is less than 100 ppm, and containing fluorine, is used. When using an ArF excimer laser light source or a KrF excimer laser light source, a quartz composition other than the above-mentioned respective substances can also be used.

In FIG. 1, the periphery of the top end portion of the lens barrel of the projection optical system PL is connected to the reticle compartment 22 without any space therebetween. The projection optical system PL is a projection optical system in which both the object surface (reticle R) side and the image surface (wafer W) side are telecentric and is a reduction system of, e.g., ¼ (or ⅕) reduction magnification. Because of this, when illumination light (ultraviolet pulse light) is irradiated from the illumination unit ILU onto the reticle R, an imaging light beam from a portion of the circuit pattern of the reticle R that has been illuminated by the ultraviolet pulse light is incident to the projection optical system PL. This imaging light beam contains a partial inverted image of the circuit pattern, has the shape of a slit (it can have a shape that is rectangular or polygonal, for example), and is imaged at a center of a visual field of the image surface side of the projection optical system PL whenever pulse irradiation of the ultraviolet pulse light occurs. By this process, the projected partial inverted image of the circuit pattern is reduced and transferred to a resist layer in one shot region among a plurality of shot regions on the surface of the wafer W, which is arranged on the imaging surface of the projection optical system PL.

When using an ArF excimer laser light source or a KrF excimer laser light source for a light source, a dioptric system formed of dioptric elements (refractive lens elements) only (i.e., reflective elements such as mirrors are not used) is suitably used for the projection optical system PL. However, in the case of using an $F_2$ laser light source, an $Ar_2$ laser light source, or the like, as disclosed in, for example, Japanese Laid-Open Patent Application No. 3-282527, a so-called catadioptric system that is a combination of dioptric elements and catoptric elements (reflective elements such as concave mirrors, beam splitters, or the like) or a catoptric system formed of catoptric elements only is suitably used. However, in the case of using of an $F_2$ laser light source, a dioptric system also can be used.

A catadioptric system having a beam splitter and a concave mirror as catoptric elements can also be used for a catadioptric type projection optical system as disclosed in, for example, Japanese Laid-Open Patent Applications Nos. 8-171054 and 10-20195 in addition to the above-mentioned publication. Furthermore, a catadioptric system having a concave mirror or the like can also be used without using a beam splitter as a catoptric element as disclosed in Japanese Laid-Open Patent Applications Nos. 8-334695 and 10-3039.

In addition, a catadioptric system can also be used in which a plurality of dioptric elements and two mirrors (a main mirror that is a concave mirror and a sub-mirror that is a planar mirror formed by back-coating a reflective material on a side opposite to an incident surface side of a parallel flat plate or a lens element) are arranged on the same axis and an intermediate image of a reticle pattern formed by the plurality of dioptric elements is re-imaged onto a wafer by the main mirror and the sub-mirror as disclosed in U.S. Pat. Nos. 5,031,976; 5,488,229; and 5,717,518. In this catadioptric system, the main mirror and the sub-mirror follow the plurality of dioptric elements, illumination light passes through an aperture in the main mirror and is reflected by the sub-mirror and the main mirror in order, and then passes through an aperture in the sub-mirror, and reaches the wafer.

The lens material (glass material) of the lens elements that constitute the projection optical system PL also needs to be selected based upon the light source to be used. In the case of using an ArF excimer laser light source or a KrF excimer laser light source, both quartz composition and fluorite can be used, but in the case of using a vacuum ultraviolet light source such as an $F_2$ laser light source or the like as a light source, it is preferable to use only fluorite.

In this embodiment, clean helium gas (He) or dry nitrogen gas ($N_2$) having an air (oxygen) concentration that is less than several ppm is filled within the lens barrel of the projection optical system PL.

As shown in FIG. 1, the stage device 12 is disposed within the compartment 42, which forms a wafer chamber 40 therein. The periphery of the lower end portion of the lens barrel of the projection optical system PL is connected (sealed) to the top wall of the compartment 42.

Figure 3:
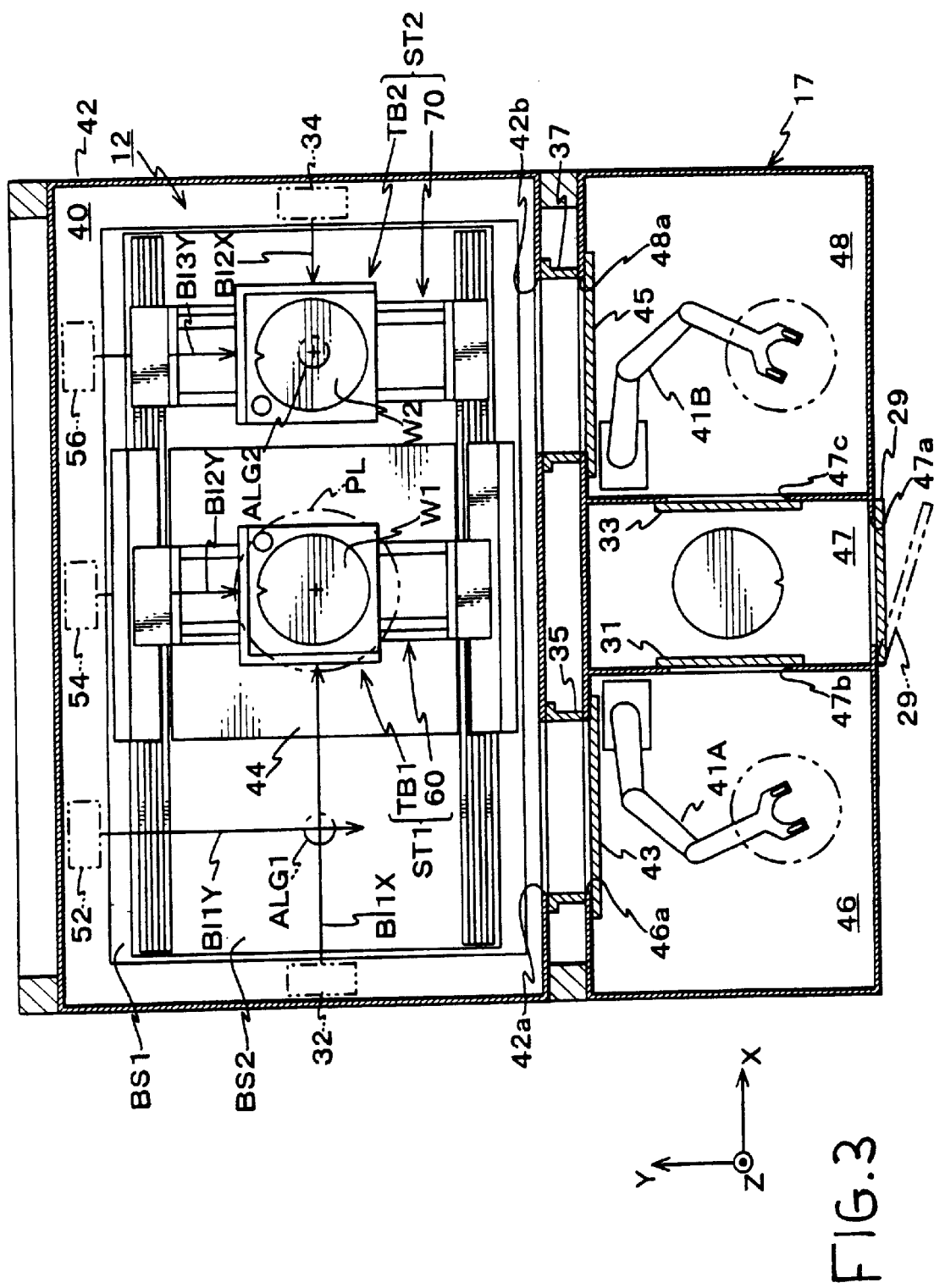
FIG. 3 is a plan view schematically showing a chamber housing a stage device and wafer loader compartments within a wafer loader chamber arranged adjacent to this stage device chamber.

Clean helium gas (He) or dry nitrogen gas ($N_2$) having an air (oxygen) concentration that is approximately several ppm is filled within the wafer chamber 40. Furthermore, although not depicted in FIG. 1, but as shown in FIG. 3, a wafer loader compartment 17 having inner loader chambers is disposed adjacent to the compartment 42 that has the wafer chamber 40 on a −Y side (front side in a paper plane of FIG. 1) of the compartment 42. The wafer loader compartment is divided into three chambers 46, 47, and 48 adjacent to each other in the X-axis direction. An external propagation entrance 47a through which a wafer moves from outside is located at a position on a −Y side of the chamber 47 positioned at the center. In this external propagation entrance 47a, an opening/closing door 29 is arranged. Furthermore, at the center of the chamber 47, an undepicted table which mounts a wafer is arranged. Additionally, the sidewall on the both sides of the X-axis direction of this chamber 47 includes opening portions 47b and 47c formed at a predetermined height. The opening portions 47b and 47c can be opened and closed by sliding doors 31 and 33 that are movable in an upward/downward direction.

Disposed within the wafer loader chambers 46 and 48 positioned on both sides of the chamber 47 are wafer loaders 41A and 41B that are constituted by a horizontal multi-jointed robot (learning robot). Additionally, the +Y side sidewall of the chambers 46 and 48 includes opening portions 46a and 48a formed at a predetermined height. The opening portions 46a and 48a can be opened and closed by sliding doors 43 and 45 that are movable in an upward/downward direction.

Outside of the opening portions 46a and 48a, connection portions 35 and 37 are respectively disposed. These connection portions 35 and 37 connect wafer insertion ports 42a and 42b disposed in the −Y side sidewall of the compartment 42 with the opening portions 46a and 48a.

In this embodiment, a wafer can be replaced between the chambers 47 and 46 by the wafer loaders 41A and 41B. Furthermore, a wafer can be replaced between the wafer tables TB1 and TB2 within the wafer chamber 40 and the chambers 46 and 48. Although not depicted, wafer carriers that store a plurality of wafers are arranged in the chambers 46 and 48.

Helium gas or dry nitrogen gas is also injected into the three chambers 46, 47, and 48; however, the purity of the helium gas or the like within the chamber 47 may be set low and the purity of the helium gas or the like within the chambers 46 and 48 is set slightly higher than the purity within the chamber 47 and slightly lower than that in the wafer chamber 40. That is, the purity of helium gas within the chambers 47, 46, and 48, and the wafer chamber 40 is set to become gradually higher in this order.

In FIG. 1, the stage device 12 is provided with a first base BS1, which is rectangular from a plan view, that is horizontally arranged on an internal bottom surface of the compartment 42, and is supported parallel to a second base BS2, which is rectangular from a plan view, via a plurality of vibration control units 72A on the first base BS1. In this case, the second base BS2 is formed half smaller than the first base BS1. Furthermore, the stage holding plate 44, which functions as a holding plate (and the first reference member), is substantially horizontally supported via a plurality of vibration control units 72B located on the upper surface of the second base BS2. The vibration control units 72A and 72B prevent minute vibrations from being transmitted to the second base BS2 via the first base BS1 from the floor surface and minute vibrations from being transmitted to the stage holding plate 44 via the first and second bases BS1 and BS2 from the floor surface at a micro G level, respectively. Furthermore, a so-called active vibration controller that actively controls the positions of the second base BS2 and the stage holding plate 44, respectively, based on the output of vibration sensors such as semiconductor accelerators or the like respectively fixed at predetermined positions of the stage device 12 can be used as these vibration control units 72A and 72B.

As shown in FIG. 3, the stage device 12 is mainly constituted by first and second stages ST1 and ST2 and driving systems or the like which drive these stages ST1 and ST2 in addition to the respective first and second bases BS1 and BS2 and the stage holding plate 44. This stage device 12 will be explained in detail.

Figure 4:
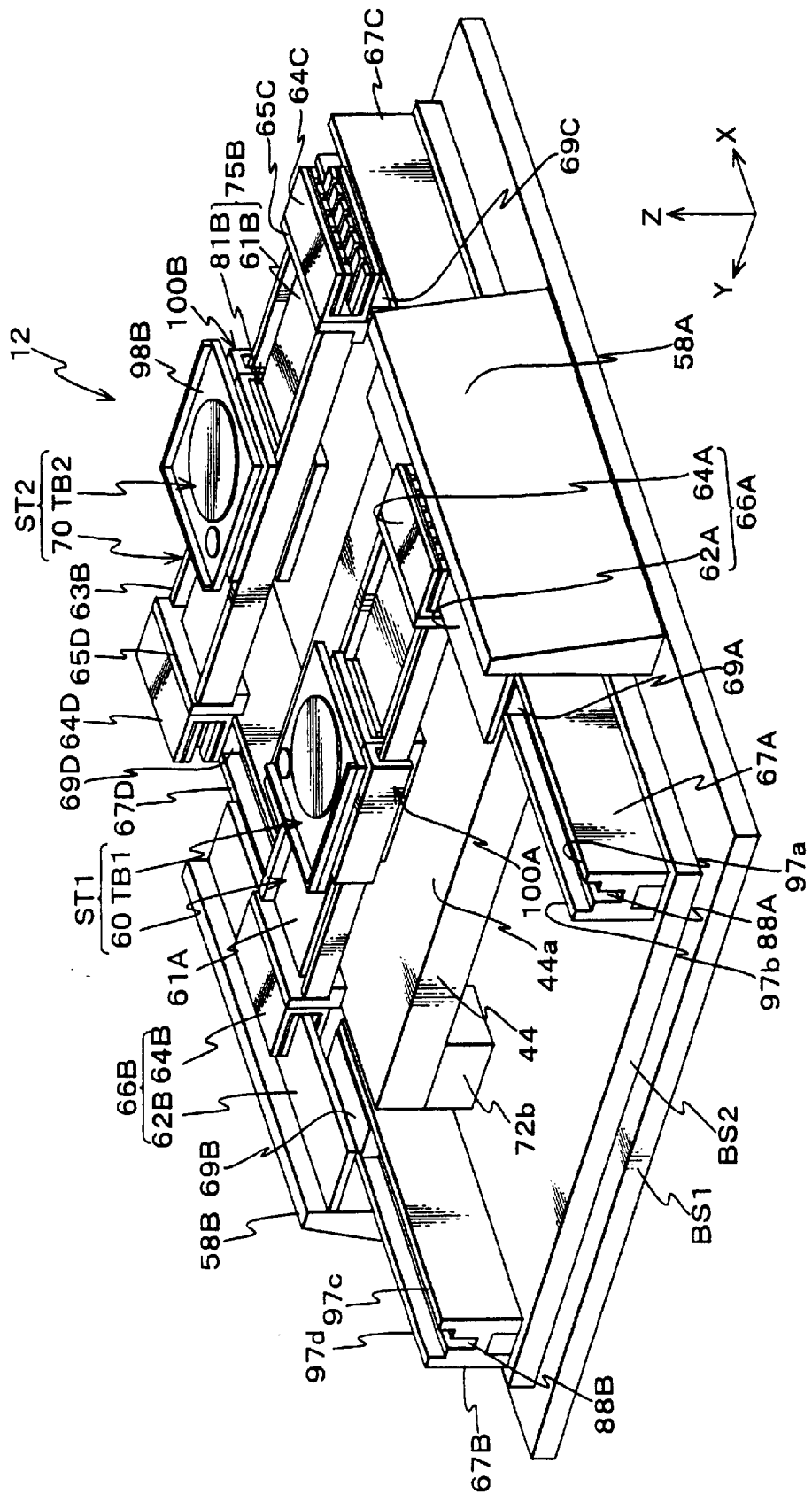
FIG. 4 is a schematic perspective view showing the stage device of FIG. 1.

FIG. 4 shows a schematic perspective view of the stage device 12 disposed within the compartment 42. In FIG. 4, the first stage ST1 includes a first moving body 60 that extends in the Y-axis direction and which can be moved in the X-axis direction (second direction) perpendicular to the Y-axis direction as a moving guide due to an electromagnetic force to be discussed below. The first stage ST1 also includes the wafer table TB1, which can be moved in the Y-axis direction along the first moving body 60. In the same manner, the second stage ST2 includes a second moving body 70 that extends in the Y-axis direction and which can be moved in the X-axis direction perpendicular to the Y-axis direction as a moving guide due to an electromagnetic force to be discussed below. The second stage ST2 also includes the wafer table TB2 which can be moved in the Y-axis direction along the moving body 70.

A pair of magnetic pole units 64A and 64B, each having a U-shaped YZ cross-section, are provided at opposite ends in the lengthwise direction of the first moving body 60 of the first stage ST1. A pair of armature units 62A and 62B corresponding to the respective magnetic pole units 64A and 64B are arranged extending along the X-axis direction and parallel to the XY plane. These armature units 62A and 62B are respectively fixed in a one-side holding support state at the same height position relative to the top surface of the first base BS1 on the internal side of the respective frames 58A and 58B, which in turn are fixed on the top surface of the first base BS1. Frames 58A and 58B function as a reference with respect to the X-axis direction, and are located on both sides in the Y-axis direction of the stage holding plate 44 on the top surface of the first base BS1.

Figure 5:
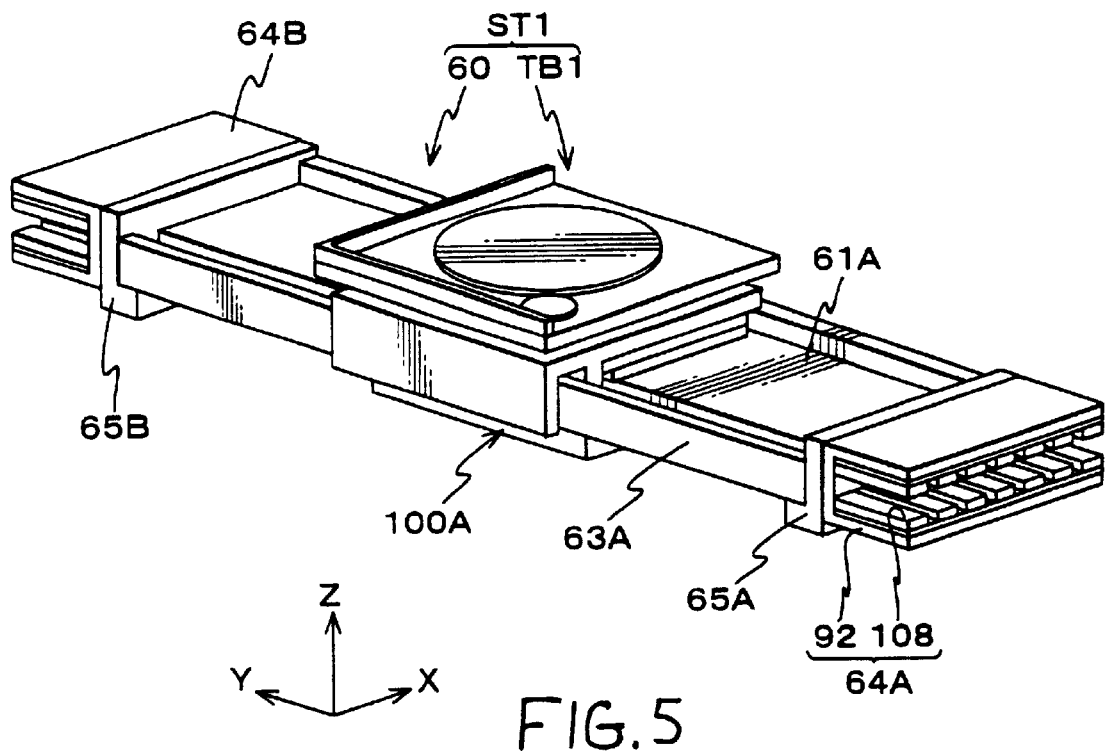
FIG. 5 is a perspective view showing a first stage of FIG. 4 removed.

As shown in FIG. 5, the one magnetic pole unit 64A is provided with a yoke 92, having a U-shaped cross-section, and a plurality of field magnets 108 spaced from each other by a predetermined interval in the X-direction and arranged facing downward on an upper portion of the yoke 92, and arranged facing upward on the lower portion of the yoke 92. At this time, the polarity of adjacent field magnets 108 in the X-axis direction are arranged opposite to each other, as is the polarity of adjacent field magnets 108 in the Z-axis direction. Thus, an alternating magnetic field is generated with respect to the X-axis direction in the space of the yoke 92.

The other magnetic pole unit 64B is constituted in the same manner as in the magnetic pole unit 64A.

Therefore, magnetic pole units 64A and 64B (and therefore the first moving body 60) are driven in the X-axis direction along the armature units 62A and 62B by a Lorentz force generated by electromagnetic mutual reaction between magnetic fields (alternating magnetic fields) generated by field magnets that respectively form the magnetic pole units 64A and 64B, and an electric current passing through armature coils that respectively form the armature units 62A and 62B. That is, in this embodiment, a pair of X-axis linear motors 66A and 66B, functioning as a first actuator, are respectively provided, and are formed of moving magnet type linear motors by the magnetic pole units 64A and 64B and the armature units 62A and 62B (see FIG. 9). Therefore, hereafter, the armature units 62A and 62B are referred to as stationary parts 62A and 62B, respectively, and the magnetic pole units 64A and 64B are referred to as movable parts 64A and 64B, respectively.

As shown in FIG. 5, the first moving body 60 is provided with an armature unit 61A, having an L-shaped cross-section, extending in the Y-axis direction, a guide 63A extending in the Y-axis direction and spaced by a predetermined interval from one side of the armature unit 61A in the X-axis direction (-X side). The first moving body 60 also includes attaching members 65A and 65B arranged at opposite ends of the armature unit 61A and the guide 63A in the lengthwise direction and that are integral with the armature unit 61A, the guide 63A, and the movable parts 64A and 64B, which are fixed to the surfaces the fixing member 65A and 65B, respectively, on the sides opposite to the armature unit 61A and guide 63A.

Figure 6:
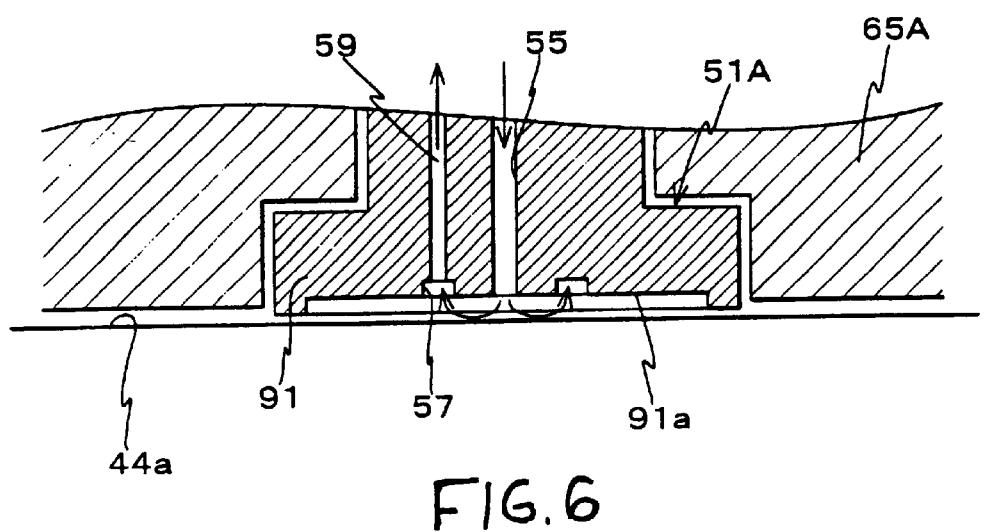
FIG. 6 is a cross-sectional view showing a bearing device.

The fixing members 65A and 65B have L-shaped cross-sections in the YZ plane, and their bottom surfaces have vacuum preload gas hydrostatic bearing devices (hereafter referred to as "bearing device") 51A and 51B (see FIGS. 6, 9 and 14). Therefore, when this moving body 60 is located over the stage holding plate 44, it can be floatingly supported with approximately several $\mu$m of clearance in the upper direction of the first reference surface 44a due to a hydrostatic pressure of pressurized gas (e.g., helium or nitrogen gas (or clean air) or the like), emitted toward the first reference surface 44a formed on the top surface of the stage holding plate 44 from the bearing devices 51A and 51B.

As shown in FIG. 6, the bearing device 51A is fixed to the bottom portion of the fixing member 65A by undepicted adhesive or the like. In this bearing device 51A, a bearing surface 91a, which is slightly concave compared to the surrounding, is fixed to the bottom surface of a main body 91. At the substantial center of this bearing surface 91a, an air supply path 55 formed in the main body 91 is provided. The air supply path 55 is connected to an undepicted pressurized gas source (e.g., a helium gas supply, a nitrogen gas supply, or the like) via an undepicted supply pipe arrangement. Additionally, ring-shaped concave grooves 57 are formed in the bearing surface 91a so as to surround the air supply path 55. An air outlet path 59 formed in the main body 91 is opened in a part of the internal bottom portion of the ring-shaped concave grooves 57. This air outlet path 59 is connected to a vacuum source such as an undepicted vacuum pump or the like. The bearing device 51B is constructed in the same manner as in the bearing device 51A and is fixed to the bottom portion of the fixing member 65B.

Therefore, the first moving body 60 in which these bearing devices 51A and 51B are fixed via the fixing member 65A and 65B is floatingly supported over the first movement reference surface 44a via the clearance due to the balance between a downward force and an upward force. The downward force is the sum of preload (a vacuum preload force) given via the air outlet path 59 of the bearing devices 51A and 51B and the weight of the moving body 60. The upward force is generated by a hydrostatic pressure (a so-called pressure between spaces) between the first movement reference surface 44a and the bearing surface of the bearing devices 51A and 51B due to pressurized gas emitted from path 55 toward the first movement reference surface 44a facing the bearing devices 51A and 51B. In this case, by adjusting a hydrostatic pressure of pressurized gas and a vacuum preload force, the clearance can be adjusted. In this embodiment, the stage controller 38 adjusts the clearance in response to the instructions from the main controller 16 (see FIG. 9).

Additionally, pressurized gas emitted toward the first movement reference surface 44a from the bearing devices 51A and 51B is emitted into the air outlet path 59 via the ring-shaped convex grooves 57, so pressurized gas leakage to outside of the bearing devices 51A and 51B can be prevented. Therefore, for example, even if pressurized air or the like is used, deterioration of purity such as helium or the like within the wafer chamber 40 can be prevented. Additionally, the air outlet path can have a plurality of air outlet paths so as to increase a degree of the vacuum so that there is a greater vacuum near the center of the bearing as compared to the peripheral portions of the bearings.

Furthermore, in the bottom surface of the fixing members 65A and 65B, a gap sensor GS1 (see FIG. 9) is arranged which measures a gap between the first movement reference surface 44a and the bottom surface (or a plurality of bearing devices 51A and 51B) of the fixing members 65A and 65B. Based on the measurement value of this gap sensor GS1, the stage controller 38 can adjust the clearance. However, in this embodiment, this gap sensor GS1 is mainly used when the movement reference surface of the stage is switched, which will be discussed later.

A plurality of armature coils are arranged at a predetermined interval along the Y-axis direction inside the armature unit 61A.

Figure 14A:
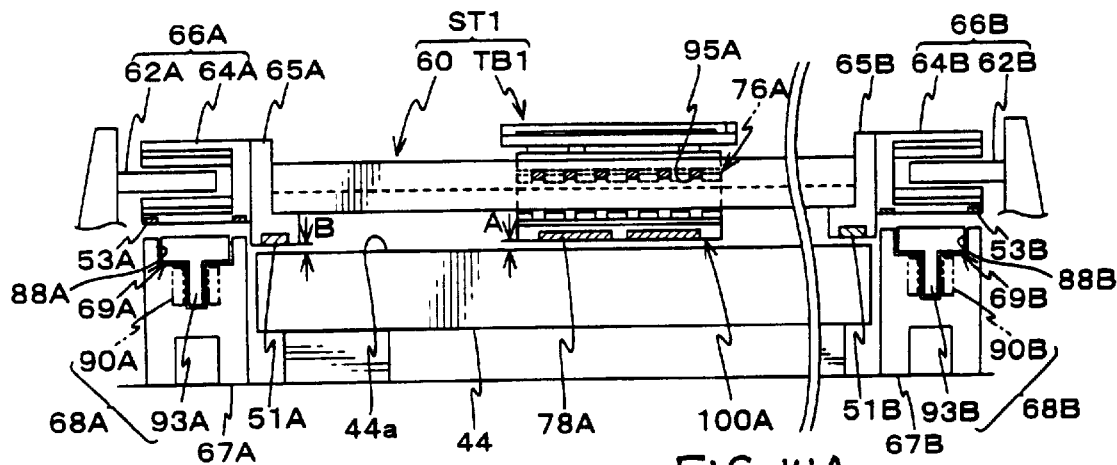
FIGS. 14A–C are diagrams explaining switching of X-axis linear motors and switching of movement reference surfaces in the device of the first embodiment.

Furthermore, as shown in FIG. 14A, a plurality of vacuum preload gas hydrostatic bearing devices (hereafter referred to as "bearing device") 53A are spaced at a predetermined interval in the Y-axis direction and arranged at a predetermined interval along the X-axis direction in the bottom surface of the movable part 64A. In the same manner, a plurality of vacuum preload gas hydrostatic bearing devices (hereafter referred to as "bearing device") 53B (see FIG. 9) are arranged in the bottom surface of other movable part 64B. The same structure as in the bearing device 51A is used for these bearing devices 53A and 53B. The reason why these bearings devices 53A and 53B are provided will be discussed later.

Figure 7:
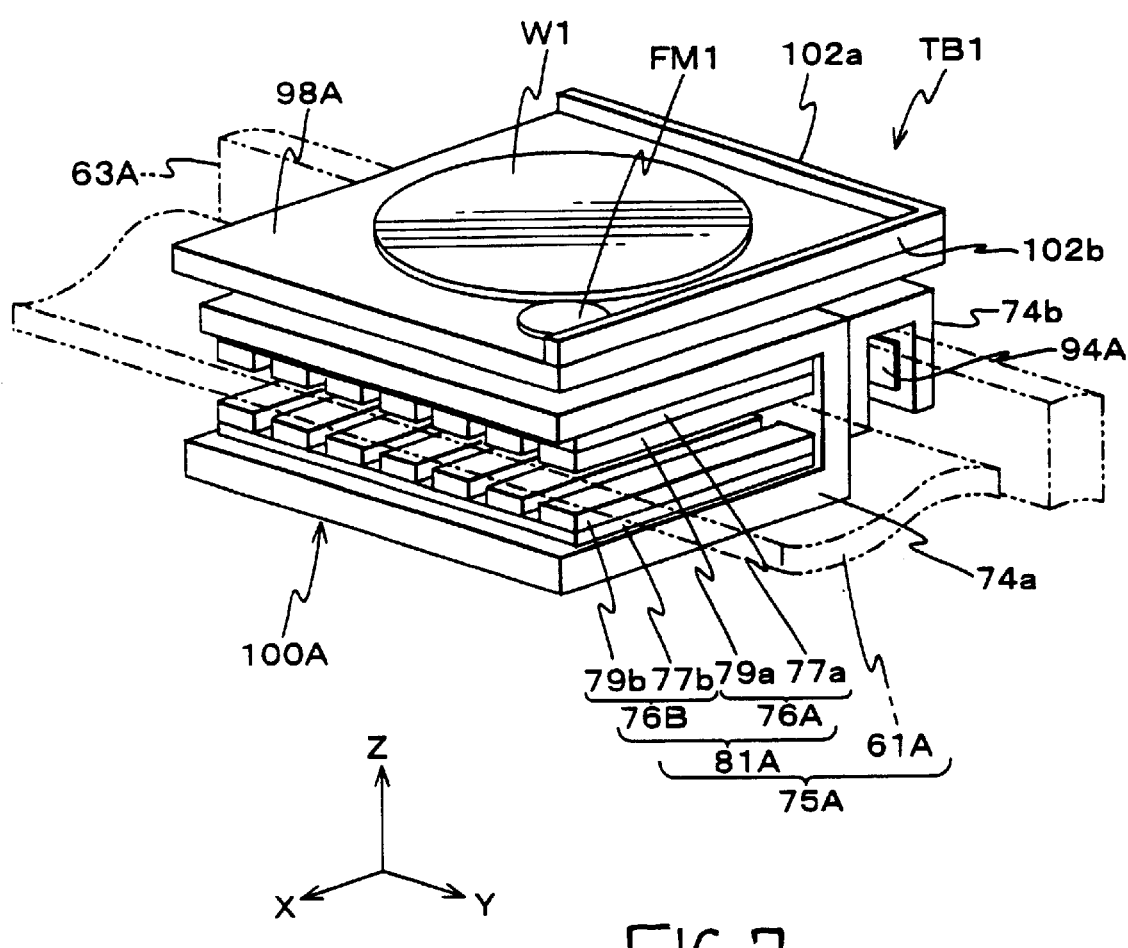
FIG. 7 is a perspective view showing a first table removed.

As shown in FIG. 7, the wafer table TB1 is provided with a substrate table 98A holding the wafer W1 and a stage main body 100A holding the substrate table 98A via a Z-tilt driving mechanism 96A (not depicted in FIG. 7, but depicted in FIG. 9).

The stage main body 100A is provided with a magnetic holding portion 74a having a U-shaped XZ plane cross-section and a pair of magnetic pole units 76A and 76B which are respectively arranged on upper and lower surfaces of the magnetic holding portion 74a. These magnetic pole units 76A and 76B mutually face each other with the armature unit 61A therebetween when incorporated into the stage device (see FIGS. 4, 5, or the like).

The magnetic pole units 76A and 76B are constituted by magnetic body members 77a and 77b respectively fixed to upper and lower surfaces of the magnetic holding member 74a and a plurality of field magnets 79a and 79b respectively arranged at a predetermined interval along the Y-axis direction to upper and lower surfaces of the magnetic body members 77a and 77b.

The polarity of adjacent field magnets 79a and field magnets 79b are opposite to each. In addition, the polarity of field magnets 79a and 79b that face each other also are opposite. Therefore, an alternating magnetic field is generated with respect to the X-axis direction in the space between the magnetic pole units 76A and 76B.

Therefore, the wafer table TB1 is driven in the Y-axis direction due to a Lorentz force generated by an electromagnetic interaction between an alternating magnetic field formed between the magnetic pole units 76A, 76B of the stage main body 100A and a current supplied to a plurality of armature coils of the armature unit 61A. That is, a moving magnetic Y-axis linear motor 75A (see FIG. 9) which drives the wafer table TB1 in the Y-axis direction, i.e., the scanning direction, is constituted by the armature unit 61A and the magnetic pole units 76A, 76B. In the following explanation, the armature unit 61A is referred to as "stationary part 61A", and the magnetic pole units 76A, 76B are referred to as "movable part 81A".

The stage main body 100A further has a bearing attaching member 74b, having an upside-down U-shaped cross-section, fixed to a −X side surface of the magnetic holding member 74a. The lower surface of the bearing attaching member 74b is open, and the guide 63A is inserted into the space inside of it when incorporated into the stage device (see FIG. 7). In the opposite surface of this bearing attaching member 74b, at least two gas hydrostatic bearing devices (hereafter referred to as "bearing device") 94A are arranged at a predetermined interval in the Y-axis direction.

A clearance between the guide 63A and the respective bearing devices 94A can be adjusted by altering the balance of a hydrostatic pressure of pressurized gas (e.g., helium or nitrogen gas (or clean air) or the like) respectively emitted to the guide surfaces of both sides in the X-axis direction of the guide 63A from the respective bearing devices 94A. Therefore, by constantly maintaining this clearance, generation of the θZ rotation (yawing) of the wafer table TB1 can be prevented when the stage main body 100A, that is, the wafer table TB1 is driven in the Y-axis direction by the Y-axis linear motor 75A. An emitting amount and an emitting pressure of pressurized gas from the respective bearing devices 94A can be controlled by the stage controller 38 in response to instructions from the main controller 16 (see FIG. 9).

Furthermore, as shown in FIG. 14A, in the bottom surface of the magnetic holding portion 74a of the stage main body 100A, when the stage main body 100A is located over the stage holding plate 44, a plurality of vacuum preload gas hydrostatic pressure bearing devices (hereafter referred to as "bearing device") 78A are arranged which emit pressurized gas (e.g., helium or nitrogen gas (or clean air) or the like) with respect to the first movement reference surface 44a. In this embodiment, in the same manner as described above, as the stage controller 38 adjusts a hydrostatic pressure of pressurized gas and a vacuum preload force by the plurality of bearing devices 78A in response to instructions from the main controller 16, the stage main body 100A, that is, the wafer table TB1 can be non-contactingly supported via a clearance of approximately several μm over the first movement reference surface 44a.

Additionally, in the bottom surface of the stage main body 100A, although not depicted in FIG. 14 or the like, a gap sensor GS2 (see FIG. 9) is arranged which measures a gap between the first movement reference surface 44a and the bottom surface (or a plurality of bearing devices 78A) of the stage main body 100A. Based on the measurement value of the gap sensor GS2, the clearance can be adjusted by the stage controller 38. However, this gap sensor GS2 is mainly used when the movement reference surface of the stage, which will be discussed later, is switched in this embodiment.

Furthermore, as shown in FIG. 14A, vacuum preload gas hydrostatic bearing devices (hereafter referred to as "bearing device") 95A are also arranged in the space between the adjacent field magnet 79a of the magnet pole unit 76A. The reason why the bearing devices 95A are arranged will be described later.

In FIG. 7, on the top surface of the substrate table 98A, an X moving mirror 102a, extending in the Y-axis direction, at one side (end portion of the −X side) in the X-axis direction is arranged. A Y moving mirror 102b, extending in the X-axis direction, is arranged at one side (end portion of the +Y side) in the Y-axis direction. Furthermore, the wafer W1 is fixed to the top surface of the substrate table 98A by vacuum absorption or electrostatic absorption via an undepicted wafer holder. Also provided on the substrate table 98A is a reference mark plate FM1 having a surface that is arranged at substantially the same height as the height at which the wafer W1 is fixed. Various reference marks, which will be discussed later, are formed in the reference mark plate FM1. The reference mark plate FM1 is used, for example, when the reference position of the wafer table TB1 is detected.

With respect to the Z-tilt driving mechanism 96A, on the top surface of the stage main body 100A, three voice coil motors (undepicted) are fixed substantially at the vertex positions of an equilateral triangle. These motors support the substrate table 98A, and are minutely driven in the Z-axis direction independently. Therefore, the substrate table 98A is minutely driven with respect to three degrees-of-freedom directions, i.e., in the Z-axis direction, the θx direction (rotation about the X-axis), and the θY direction (rotation about the Y-axis). In this embodiment, the Z-tilt driving mechanism 96A is controlled by the main controller 16 via the stage controller 38. This will be discussed later.

The second stage ST2 has right-left symmetrical structure with respect to the above-mentioned first stage ST1, but otherwise has the same structure.

That is, the second moving body 70 of the second stage ST2 is provided with an armature unit 61B, having an L-shaped cross-section extending in the Y-axis direction, a guide 63B, extending in the Y-axis direction, spaced at a predetermined interval at the other side (+X side) in an X-axis direction of the armature unit 61B, fixing members 65C, 65D integrated with the armature unit 61B and the guide 63B and respectively arranged at both end portions of a longitudinal direction of the armature unit 61B and the guide 63B, and magnetic pole units (movable parts) 64C, 64D respectively fixed to opposite ends of the armature unit 61B and the guide 63B by the fixing members 65C, 65D.

The bearing devices 51C and 51D (see FIG. 9) whose structures are the same as the bearing devices 51A and 511B are arranged in the bottom surfaces of the fixing members 65C and 65D. Although not depicted in FIG. 14 or the like, a gap sensor GS3 (see FIG. 9) is arranged which measures a gap between the first movement reference surface 44a and the bottom surfaces (or a plurality of bearing devices 51C and 51D) of the fixing members 65C and 65D. Furthermore, a plurality of bearing devices 53C and 53D (see FIG. 9)

whose structures are the same as the bearing device 51A are arranged at a predetermined interval in the X-axis direction and spaced at a predetermined interval in the Y-axis direction in the bottom surfaces of the movable parts 64C and 64D. The reason why these bearing devices 53C and 53D are arranged will be discussed later.

Figure 8:
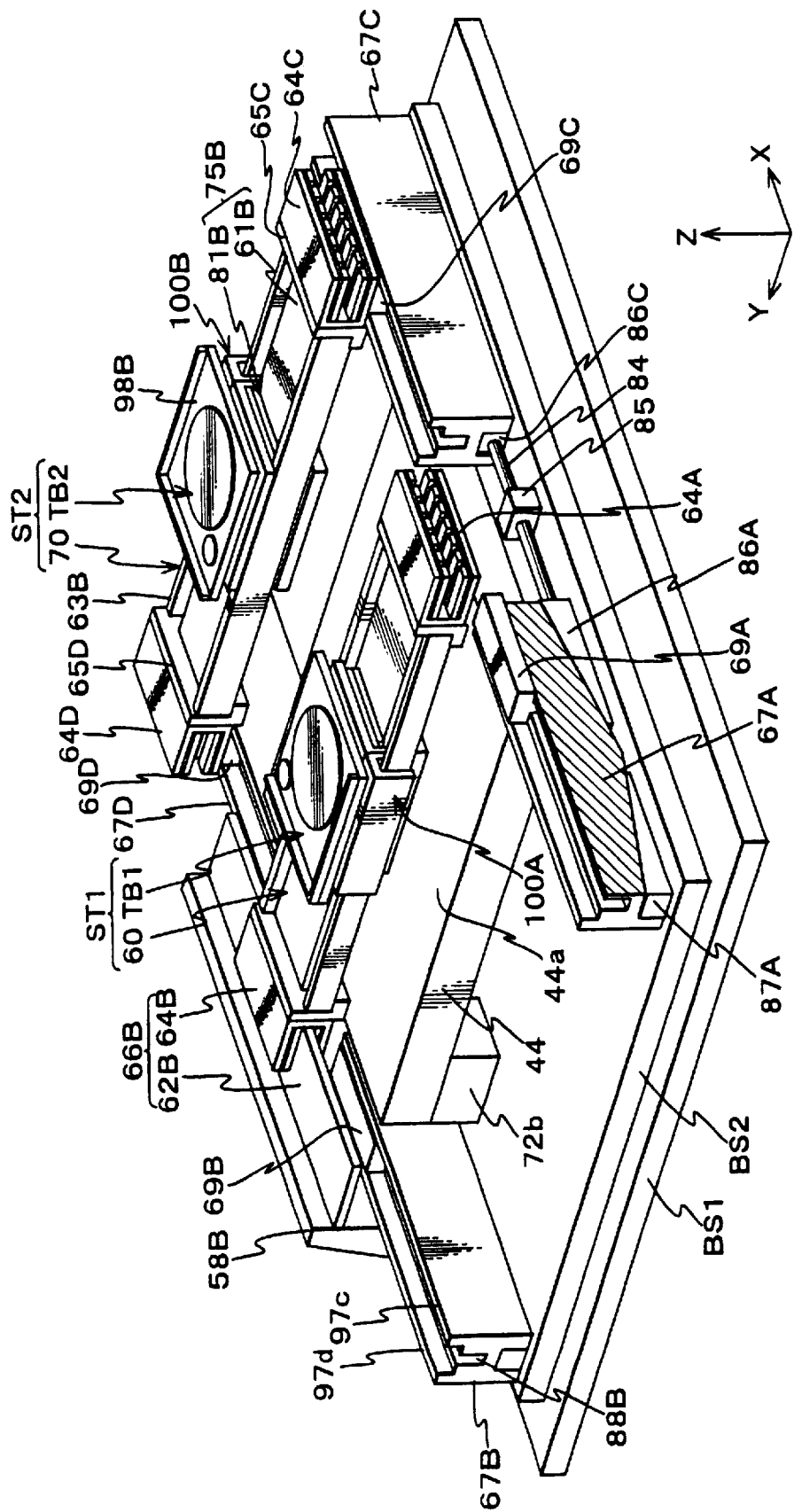
FIG. 8 is a diagram showing a frame 58A and a stationary part 62A of FIG. 4 removed and a guide 67A of FIG. 4 in cross-section.

As shown in FIG. 8, the wafer table TB2 is provided with a substrate table 98B holding the wafer W2 and a stage main body 100B holding the substrate table 98B via a Z·tilt driving mechanism 96B (see FIG. 9) and has a right-left symmetrical structure that is otherwise similar to that used with the wafer table TB1.

As shown in FIG. 2, on the top surface of the wafer table TB2 (on the top surface of the substrate table 98B), an X moving mirror 102c, a Y moving mirror 102d, and a reference mark plate FM2 are fixed.

Furthermore, the wafer table TB2 is driven in the Y-axis direction along the stationary part 61B by a Y-axis linear motor 75B (see FIG. 9) which is structured in the same manner as the Y-axis linear motor 75A. The Y-axis linear motor is formed by stationary part 61B and the movable part 81B.

In the magnetic holding member of the stage main body 100B, a bearing device 94B (see FIG. 9) is arranged whose structure is the same as the bearing device 94A emitting pressurized gas (e.g., helium or nitrogen gas (or clean air) or the like)) with respect to the guide surface on both sides in the X-axis direction of the guide 63B. Because of this, generation of θZ rotation (yawing) of the wafer table TB2 can be prevented when the stage main body 100B, that is, the wafer table TB2 is driven by the Y-axis linear motor 75B in the Y-axis direction. An emitting pressure and amount of pressurized gas from the respective bearing devices 94B can be controlled by the stage controller 38 in response to instructions from the main controller 16 (see FIG. 9).

Furthermore, a plurality of bearing devices 78B (see FIG. 9) whose structures are the same as the bearing device 51A are arranged in the bottom surface of the stage main body 100B. In this embodiment, when the wafer table TB1 is located on the stage holding plate 44 by stage switching which will be described later, the stage controller 38 adjusts the hydrostatic pressure of pressurized gas and a vacuum preload force by the plurality of bearing devices 78B in response to the instructions from the main controller 16, in the same manner as described above, so that the wafer table TB1 can be non-contactingly supported via approximately several μm of clearance over the first movement reference surface 44a.

Furthermore, a gap sensor GS4 (see FIG. 9) is arranged in the bottom surface of the stage main body 100B.

In the space between the adjacent field magnets of the magnetic pole units of the stage main body 100B side, a plurality of bearing devices 95B (see FIG. 9) whose structures are the same as the bearing device 51A are arranged. The following is the reason why these bearing devices 95B are arranged. That is, in a state shown in FIG. 4, the stage holding plate 44 does not exist (i.e., is not located) under the wafer table 100B. Therefore, a floating force of the wafer table TB2 cannot be obtained by using the plurality of bearing devices 78B arranged in the bottom surface of the stage main body 100B. Because of this, if there is no support force to support the stage main body 100B, the movable part of the Y-axis linear motor of the stage main body 100B contacts the stationary part 61B due to the weight of the stage main body 100B. In this embodiment, in order to prevent occurrence of this situation, when the stage main body 100B is not located over the stage holding plate 44, the movable part 81B of the Y-axis linear motor 75B of the stage main body 100B is non-contactingly supported with respect to the stationary part 61B due to a hydrostatic pressure of pressurized gas by emitting the pressurized gas onto the top surface of the stationary part 61B from the bearing device 95B. That is, the bearing devices 95B are arranged for this purpose. In the same manner, the bearing device 95A non-contactingly supports the movable part 81A of the Y-axis linear motor 75A of the stage main body 100A with respect to the stationary part 61A when the stage main body 100A is not located over the stage holding plate 44.

Furthermore, in this embodiment, as shown in FIG. 4, a pair of guides 67A and 67B are mounted to extend in the X-axis direction in the vicinity of both sides in the Y-axis direction on the top surface of the second base BS2.

As shown in FIG. 4, on the top surface of the guide 67A, a guide groove 88A forming a gap on the top surface extends in the X-axis direction. As shown in FIG. 14A, both sidewalls of the guide groove 88A include a stationary part 90A formed of, for example, magnetic pole units implanted therein. A T-shaped slider 69A, integrally provided with a movable part 93A formed of, for example, armature units, is arranged in guide groove 88A. In this case, an X-axis linear motor 68A (see FIG. 9), functioning as a second actuator that drives the slider 69A in the X-axis direction, is constituted by the stationary part 90A and the movable part 93A.

In the same manner, in the guide 67B, as shown in FIG. 4, a guide groove 88B is formed to extend in the X-axis direction. As shown in FIG. 14A, a T-shaped slider 69B, integrally provided with movable part 93B, is arranged in the guide groove 88B. In this case as well, as shown in FIG. 14A, an X-axis linear motor 68B (see FIG. 9), functioning as a second actuator that drives the slider 69B in the X-axis direction, is constituted by the stationary part 90B and the movable part 93B.

When the stage is switched, which will be discussed later, the movable parts 64A and 64B of both end portions of the first moving body 60 are supported by the sliders 69A and 69B from below.

Furthermore, as shown in FIG. 4, the guide groove 88A of the guide 67A has upper end surfaces 97a and 97b that are finished with high accuracy. In the same manner, the upper end surfaces 97c and 97d of the guide groove 88B of the guide 67B are finished with high accuracy. In this embodiment, a second movement reference surface of the first stage ST1 is formed by the surfaces 97a, 97b, 97c, and 97d, and a second reference member is constituted by the pair of guides 67A and 67B on which the second movement reference surface is formed.

Due to the stage switching which will be discussed later, when the first stage ST1 is mounted on the sliders 69A and 69B, the bearing device 53A arranged in the bottom surface of the movable part 64A faces the second movement reference surfaces 97a and 97b, and the bearing device 53B arranged in the bottom surface of the movable part 64B faces the second movement reference surfaces 97c and 97d (see FIG. 14C). That is, the bearing devices 53A and 53B are arranged in order to floatingly support the stage ST1 via a predetermined clearance over the second movement reference surface when the first stage ST1 moves by using the second movement reference surfaces (97a–97d) as a reference. Needless to say, while the sliders 69A and 69B are driven along the guides 67A and 67B, in order to avoid friction between these two parts, it is preferable that a gas hydrostatic pressure bearing device or the like be arranged between them.

In the same manner as described above, as shown in FIGS. 4 and 8, a pair of guides 67C and 67D that extend in the X-axis direction are mounted on opposite sides in the Y-axis direction on the top surface of the second base BS2. These guides 67C and 67D are structured in the same manner as the guides 67A and 67B. These sliders 69C and 69D which are the same as the sliders 69A and 69B can be moved. These sliders 69C and 69D can be driven by the X-axis linear motors 68C and 68D (see FIG. 9), functioning as second actuators that are structured in the same manner as the X-axis linear motors 68A and 68B.

Furthermore, the upper end portion of the guides 67C and 67D includes surfaces similar to the surfaces 97a and 97d and defines the second movement reference surface of the second stage ST2 whose surface is finished with high accuracy.

In FIGS. 4 and 8, the second stage ST2 is supported by the sliders 69C and 69D from below and can be driven by the X-axis linear motors 68C and 68D. In this state, the bearing devices 53C and 53D (see FIG. 9) arranged at the bottom surface of the movable parts respectively face the second reference surface formed in the guides 67C and 67D. That is, the bearing devices 53C and 53D are arranged in order to floatingly support the second stage ST2 via a predetermined clearance over the second movement reference surface when the second stage ST2 moves by using the second movement reference surface as a reference. When the sliders 69C and 69D are driven along the guides 67C and 67D, in order to avoid friction between these two parts, it is preferable that a gas hydrostatic pressure bearing device or the like be arranged between them.

As shown in FIG. 8 in cross-section, a V-shaped sloping surface is formed in the bottom surface of the guide 67A. The sloping surface of the −X side of the V-shaped vertex of this sloping surface is contactingly supported by a fixed wedge member 87A fixed on the second base BS2. The sloping surface of the +X side of the V-shaped vertex is contactingly supported by a movable wedge member 86A that is slidable in the X-axis direction. Therefore, as understood from FIG. 8, by sliding the movable wedge member 86A in the X-axis direction, the guide 67A can be driven in the upward and downward directions.

With respect to the guide 67C arranged on the same axis as the guide 67A, in the same manner as the guide 67A, a V-shaped sloping surface is formed in the bottom surface of guide 67C, and is supported by a movable wedge member 86C and a fixed wedge member (undepicted).

The movable wedge member 86A is fixed to one end of a shaft 84 extending in the X-axis direction over the top surface of the second base BS2, and the movable wedge member 86C is fixed to other end of the shaft 84. The shaft 84 is slidable in the X-axis direction by the driving device 85 arranged at the center in the X-axis direction on the −Y side end portion on the second base BS2. In this case, for example, the shaft 84 can be formed of a ball screw, and the driving device 85 can be formed of a ball screw engaged to the ball screw on shaft 84, a motor which rotatingly drives the ball screw via a driving mechanism, or the like.

In this case, when the shaft 84 is driven from the position of a neutral point toward the −X side by the driving device 85, the movable wedge member 86A is driven toward the −X side, and the guide 67A is upwardly driven from the position of an initial state in response to the driving amount. At the same time, the movable wedge member 86C is driven to the −X side, and the guide 67C is downwardly driven from the position of the initial state in response to the driving amount. On the contrary, when the shaft 84 is driven toward the +X side from the position of a neutral point, the movable wedge member 86C is driven toward the +X side, and the guide 67C is upwardly driven from the position of the initial state in response to the driving amount. At the same time, the movable wedge member 86A is driven toward the +X side, and the guide 67A is downwardly driven from the position of the initial state in response to the driving amount.

That is, in this embodiment, the guides 67A and 67C are simultaneously moved up and down by the pair of movable wedge members, the pair of fixed wedge members, the shaft 84, and the driving device 85, which together function as a first moving device 99A (see FIG. 9) that drives the guides 67A and 67C in the Z-axis direction with respect to the stage holding plate 44.

In the same manner as the first moving device 99A, including a driving device arranged at the center in the X-axis direction on the +Y side end portion on the second base BS2, a shaft that is slidable in the X-axis direction, a pair of movable wedge members fixed to both ends of the shaft, and a pair of fixed wedge member, the guides 67B and 67D are simultaneously moved up and down, thereby forming a second moving device 99B (see FIG. 9) that drives the guides 67B and 67D in the Z-axis direction with respect to the stage holding plate 44.

In this embodiment, in response to instructions from the main controller 16, the stage controller 38 constantly controls the driving devices that constitute the first and second moving devices 99A and 99B by the same amount. Therefore, the guides 67A and 67B and the guides 67C and 67D are constantly driven in the upward/downward direction by the same amount.

However, the structure of the moving devices 99A and 99B is one example. The invention is not limited to this structure, but by using other mechanical power transmission mechanisms, a moving device can also be used to move up and down the guides 67A, 67B, 67C and 67D. In addition, an electrical-mechanical conversion element such as a piezoelectric element or the like, can be used to define the moving device that moves the guides 67A, 67B, 67C and 67D up and down. In addition, a moving device can also be used that moves the guides 67A, 67B, 67C and 67D up and down by using a mechanism with an air pressure, or a moving device can also be used that moves the guides 67A, 67B, 67C and 67D up and down by an electromagnetic force generation mechanism such as a Lorentz force, a magnetic force, or the like due to an electromagnet. In these cases, in the same manner as described above, the guides 67A and 67B and the guides 67C and 67D can be simultaneously moved up and down, respectively, or the guides 67A, 67B, 67C, or 67D can be individually moved up and down.

The second reference member such as the guides 67A, 67B, 67C, and 67D, or the like is movable. Instead, however, a moving device can also be used that moves the stage holding plate 44 up and down, or a moving device can be used that relatively moves the second reference member and the stage holding plate 44 up and down.

Furthermore, in this embodiment, when a stage is switched from a state shown in FIG. 4, which will be discussed later, a movable part 64C is driven in the X-axis direction due to a Lorentz force generated by electromagnetic mutual interaction with the fixed part 62A. A movable part 64D is driven in the X-axis direction due to a Lorentz force generated by electromagnetic mutual interaction between the fixed part 62B and the movable part 64D. Therefore, the second stage ST2 is driven in the X-axis direction which is a non-scanning direction.

That is, in this embodiment, a pair of X-axis linear motors 66C and 66D, functioning as a first actuator, which is constituted by a moving magnet type linear motor and drives the second stage in the X-axis direction, are constituted by the magnetic pole units 64C and 64D and the armature units 62A and 62B (see FIG. 9).

The external surface sides of the respective moving mirrors 102a–102d arranged on the wafer tables TB1 and TB2 (more precisely, on the substrate tables) are reflective surfaces on which mirror finishing has been performed. As shown in FIG. 2, interferometer beams of the respective measurement axes that constitute an interferometer system 30 (see FIG. 9), which will be discussed later, are projected onto these reflective surfaces, and by receiving the reflected light in the interferometers, displacement from a reference position (in general, a fixed mirror is arranged in a projection optical system side surface and an alignment optical system side surface, and this is considered as a reference surface) is measured by the respective interferometers. In this manner, the two-dimensional position of the wafer tables TB1 and TB2 can be respectively measured. The structure of the measurement axes of the interferometer system 30 is described in detail later.

In this embodiment, the stage device 12 is structured as described above. Therefore, driving the wafer table TB1 in the X-axis direction is performed by any of a pair of X-axis linear motors 66A and 66B and a pair of X-axis linear motors 68A and 68B. Driving the wafer table TB2 in the X-axis direction is performed by any of a pair of the X-axis linear motors 66C and 66D and a pair of X-axis linear motors 68C and 68D.

That is, in this embodiment, during an exposure operation, driving the first stage ST1 (wafer table TB1) in the X-axis direction is performed by the X-axis linear motors 66A and 66B by using the first movement reference surface on the top surface 44a of the stage holding plate 44 as a reference. Similarly, driving the second stage ST2 (wafer table TB2) in the X-axis direction during exposure is performed by the X-axis linear motors 66C and 66D by using the first movement reference surface 44a on the top surface of the stage holding plate 44 as a reference.

Furthermore, during wafer alignment and wafer replacement, driving the first stage ST1 in the X-axis direction is performed by the X-axis linear motors 68A and 68B by using the second movement reference surface (surface 97a, 97b, 97c, 97d) in the upper end surface of the guides 67A and 67B as a reference. Similarly, driving the second stage ST2 in the X-axis direction is performed by the X-axis linear motors 68C and 68D by using the second movement reference surface in the upper end surface of the guides 67C and 67D as a reference. Furthermore, switching of the movement reference surface of the respective stages ST1 and ST2 and switching of the X-axis linear motors will be discussed in detail later.

In FIG. 1, on both sides of the projection optical system PL in the X-axis direction, off-axis type alignment optical systems ALG1, ALG2, having the same function, are arranged at a position separated from an optical axis center (matched with the projection center of the reticle pattern image) AX of the projection optical system PL by the same distance. These alignment optical systems ALG1, ALG2 have three types of alignment sensors: an LSA (Laser Step Alignment) system, an FIA (Field Image Alignment) system, and an LIA (Laser Interferometric Alignment) system, and can perform positional measurement of the alignment mark on the wafer and of the reference mark on the reference mark plate in two-dimensional X-Y directions.

The LSA system is a sensor that is most widely used in which a laser light is irradiated onto a mark, the diffracted and dispersed light is detected, and the mark position is measured, and is conventionally used for a variety of wafer processes. The FIA system is a sensor in which a mark is illuminated by a broad beam light such as supplied from a halogen lamp or the like, the mark image is image-processed, and the mark position is measured, and is effectively used with a non-symmetrical mark in a wafer surface and in an aluminum layer. The LIA system is a sensor in which a laser light with slightly changed frequency is irradiated from two directions onto a diffraction grid-shaped mark, two generated diffracted lights are interfered with each other, and the mark positional information is detected from the phase of the interfered lights, and is effectively used with a low gap and a wafer having a rough surface.

In this embodiment, these three types of alignment sensors are appropriately used depending on necessity, whereby so-called search alignment in which three one-dimensional mark positions on the wafer are detected, wafer schematic positional measurement, and fine alignment in which accurate position measurement for the respective shot regions on the wafer, or the like, are performed.

In this case, the alignment optical system ALG1 is used for positional measurement of a reference mark formed on the reference mark plate FM1 and an alignment mark on the wafer W1 held on the wafer table TB1. Furthermore, the alignment optical system ALG2 is used for positional measurement of a reference mark formed on the reference mark plate FM2 and an alignment mark on the wafer W2 held on the wafer table TB2.

Information from the respective alignment sensors that constitute this alignment optical system ALG is A/D converted by an alignment controller 136 (see FIG. 9), a digitized waveform signal is calculated and processed, and a mark position is detected. This result is sent to the main controller 16, and in response to the result, a synchronization positional change or the like during exposure is instructed from the main controller 16 to the stage controller 38.

Furthermore, although not depicted in FIG. 1, on the reticle R in the exposure apparatus 10 of this embodiment, a pair of reticle alignment microscopes 138A and 138B (see FIG. 9) are arranged that are formed of a TTR (Through The Reticle) alignment optical system. Such a system uses an exposure wavelength that simultaneously observes the mark on the reference mark plates FM1 or FM2 with a reticle mark (not depicted) on the reticle R via the projection optical system PL as disclosed in, for example, Japanese Laid-Open Patent Application No. 7-176468. The detection signals of the reticle alignment microscopes 138A and 138B are supplied to the main controller 16.

Furthermore, although not depicted in FIG. 1, autofocus/autoleveling measurement mechanisms (hereafter referred to as "AF/AL system") that check a focus position are respectively arranged in the projection optical system PL and the alignment optical systems ALG1 and ALG2.

For example, Japanese Laid-Open Patent Application No. 10-214783 discloses a structure of an exposure apparatus in which autofocus/autoleveling measurement mechanisms are arranged in the projection optical system PL and in the alignment optical systems ALG1 and ALG2, respectively. Since such systems are well known, no further explanation is provided.

Therefore, in this embodiment, in the same manner as the exposure apparatus disclosed in the above-mentioned Japanese Laid-Open Patent Application No. 10-214783, during the measurement by the alignment sensor of the alignment optical systems ALG1 and ALG2, measurement of the AF/AL system in the same manner as during exposure and autofocus/autoleveling control are performed, and positional measurement of alignment marks is performed, so alignment measurement with high accuracy is possible. In other words, off set (discrepancy) is not generated due to a change in the stage posture between the performance of exposure and the performance of alignment.

An interferometer system 30 that controls a position of the wafer tables TB1 and TB2 will be explained with reference to FIGS. 2 and 3.

As shown in these figures, an interferometer beam that intersects the projection center AX of the projection optical system PL and the respective detection centers SX1 and SX2 of the alignment optical systems ALG1 and ALG2 shown by the measurement axis BI1X from the interferometer 32 (see FIG. 1) is irradiated to an X moving mirror 102a on the wafer table TB1 along the X-axis. In the same manner, an interferometer beam that intersects the respective detection centers of the alignment optical systems ALG1 and ALG2 and the projection center of the projection optical system PL shown by the measurement axis BI2X from the interferometer 34 (see FIG. 1) is irradiated to the X moving mirror 102c on the wafer table TB2 along the X-axis. Furthermore, by receiving the reflected light beams in the interferometers 32 and 34, the relative displacement from the reference position of the respective reflection surfaces is measured, and the X-axis direction position of the wafer tables TB1 and TB2 is measured. As shown in FIG. 2, the interferometers 32 and 34 are three-axes interferometers having three optical axes, and therefore tilt measurement and yawing amount (θZ rotation) measurement are possible in addition to the measurement of the X-axis direction position of the wafer tables TB1 and TB2. The output values of the respective optical axes can be independently measured.

Furthermore, the respective interferometer beams of the measurement axes BI1X and BI2X contact the X moving mirrors 102a and 102c of the wafer tables TB1 and TB2 throughout the entire moving range of the wafer tables TB1 and TB2. Therefore, with respect to the X-axis direction, in the case of exposure using the projection optical systems PL and alignment using the alignment optical systems ALG1 and ALG2, the position of the wafer tables TB1 and TB2 is controlled based on the measurement value of the measurement axes BI1X and BI2X.

Furthermore, as shown in FIG. 3, an interferometer 54 having a measurement axis BI2Y intersecting perpendicular to the measurement axes BI1X and BI2X in the projection center AX of the projection optical system PL, an interferometer 52 having a measurement axis BI1Y intersecting perpendicular to the measurement axes BI1X and BI2X in the detection center SX1 of the alignment optical system ALG1, and an interferometer 56 having a measurement axis BI3Y intersecting perpendicular to the measurement axes BI1X and BI2X in the detection center SX2 of the alignment optical system ALG2 are arranged.

In this embodiment, the measurement value of the interferometer 54 having the measurement axis BI2Y that passes through the projection center of the projection optical system PL, i.e., the optical axis AX for the positional measurement of the Y direction of the wafer tables TB1 and TB2 is used during exposure with the projection optical system PL. Furthermore, the measurement value of the interferometer 52 having the measurement axis BI1Y that passes through the detection center of the alignment optical system ALG1, i.e., the optical axis SX1 for the positional measurement of the Y direction of the wafer table TB1 is used during alignment with the alignment optical system ALG1. Additionally, the measurement value of the interferometer 56 having the measurement axis BI3Y that passes through the detection center of the alignment optical system ALG2, i.e., the optical axis SX2 for the positional measurement of the Y direction of the wafer table TB2 is used during alignment with the alignment optical system ALG2.

Therefore, depending on each usage condition, the interferometer having a measurement axis in the Y-axis direction is reflected from the reflective surface 102b or 102d of the wafer tables TB1 and TB2. However, at least one measurement axis, that is, the measurement axes BI1X and BI2X are not reflected from one of the reflective surfaces of the X moving mirror (102a 102c) of the respective wafer tables TB1 and TB2. Because of this, an interferometer of the Y side can be reset at an appropriate position in which the interferometer having a measurement axis of the Y-axis direction is in use on the reflective surface of the moving mirror. The method of resetting an interferometer will be described in detail later.

Additionally, the respective interferometers having the measurement axes BI1Y, BI2Y, and BI3Y for the Y measurement are two-axis interferometers having two optical axes, respectively, and therefore, tilt measurement is possible in addition to the measurement in the Y-axis direction of the wafer tables TB1 and TB2. The output values of the respective optical axes can be independently measured.

In this embodiment, an interferometer system 30 which controls the two-dimensional coordinate position of the wafer tables TB1 and TB2 is constituted by a total of five interferometers 52, 54, and 56, having the respective measurement axes BI1Y, BI2Y, and BI3Y and interferometers 32 and 34, having the respective measurement axes BI1X and BI2X (see FIG. 9).

Furthermore, in this embodiment, as described later, during an exposure sequence of one of the wafer tables TB1 and TB2, one table performs wafer replacement and another table performs a wafer alignment sequence. Based on the output values of the respective interferometers, in response to the instructions from the main controller 16, movement of the wafer tables TB1 and TB2 is controlled by the stage controller 38 so as to prevent the wafer tables TB1 and TB2 from interfering with (physically contacting) each other.

FIG. 9 shows a main structure of a control system of an exposure apparatus 10 according to this embodiment. This control system is mainly constituted by a main controller 16 that controls the entire device overall, a stage controller 38 under the instructions of the main controller 16, and an alignment controller 136, or the like.

The following explains an operation during a step- and -scan exposure in the exposure apparatus 10 of this embodiment focusing on the operation of each part of the control system. Furthermore, as described earlier, when exposure is performed with respect to the wafer on the first stage ST1, the first stage ST1 is driven in the X-axis direction by the X-axis linear motors 66A and 66B, and when exposure is performed with respect to the wafer on the second stage ST2, the second stage ST2 is driven in the X-axis direction by the X-axis linear motors 66C and 66D.

When exposure is performed with respect to the wafer W1 on the wafer table TB1, in the stage controller 38, in response to the instruction given based on the alignment result from the main controller 16, the measurement values of the interferometer 30 having the measurement axes BI2Y and BI1X are monitored. While performing this monitoring, the X-axis linear motors 66A and 66B and the Y-axis linear motor 75A are controlled, and the wafer table TB1 is moved to a scanning start position for exposure of the first shot region of the wafer W1.

Next, in the stage controller 38, in response to the instruction of the main controller 16, when relative scanning in the Y-axis direction of the reticle R and the wafer W1, that is, the reticle stage RST and the wafer table TB1 begins, both stages RST and TB1 reach their target scanning speed and reach a uniform speed synchronized state, a pattern region of the reticle R begins to be illuminated by an ultraviolet pulse light beam from the illumination system unit ILU, and scanning exposure begins. The relative scanning is performed by controlling the reticle driver 26, the X-axis linear motors 66A and 66B, and the Y-axis linear motor 75A, while the stage controller 38 monitors the measurement values of the measurement axis BI6X and the measurement axes BI7Y and BI8Y of the reticle interferometer system 28 and the measurement axes BI1X and BI2Y of the interferometer system 30.

Prior to the start of scanning exposure, when the reticle stage RST and the wafer table TB1 reach their target scanning speed, in the main controller 16, pulse light emission is started by giving an instruction to the laser controller 18. Movement of a predetermined blade of a movable reticle blind located within the illumination unit ILU is performed via an undepicted blind driving device, which is synchronized and controlled with movement of the reticle stage RST by the stage controller 38. Accordingly, the irradiation of the ultraviolet pulse light beam is shielded from areas outside of the pattern region on the reticle R in the same manner as with an ordinary scanning-stepper.

In the stage controller 38, the reticle stage RST and the wafer table TB1 are synchronized and controlled via the reticle driver 26, the X-axis linear motors 66A and 66B, and the Y-axis linear motor 75A. The moving speed Vr in the Y-axis direction of the reticle stage RST and the moving speed Vw in the Y-axis direction of the wafer table TB1 can be maintained at a speed ratio that is a function of the projection magnification (¼× or ⅕×) of the projection optical system PL, particularly, during the scanning exposure.

After different pattern regions of the reticle R are consecutively illuminated by the ultraviolet pulse light beam and illumination of the entire pattern (on the reticle) is completed, scanning exposure of the first shot region on the wafer W1 is completed. By this operation, the pattern of the reticle R is reduced and transferred to the first shot region by the projection optical system PL.

Furthermore, in the undepicted blind driving device, based on the instructions from the stage controller 38, movement of a predetermined blade of the movable reticle blind is synchronized and controlled with movement of the reticle stage RST so that irradiation of the ultraviolet pulse light beam is shielded from areas other than the pattern region on the reticle R immediately after scanning exposure is completed.

As mentioned above, when scanning exposure of the first shot region is completed, based on the instruction from the main controller 16, the wafer table TB1 is stepped in the X and Y-axis directions by the X-axis linear motors 66A, 66B and the Y-axis linear motor 75A and moves to a scanning start position for exposure of the second shot region. During this stepping operation, in the stage controller 38, based on the measurement values of the interferometers having the measurement axes BI2Y and BI1X of the interferometer system 30, position displacement in the X, Y, and θz directions of the wafer table TB1 is measured in real time. Based on the results of these measurements, in the stage controller 38, the position of the wafer table TB1 is controlled so that the XY position displacement of the wafer table TB1 will be in a predetermined state. Furthermore, in the stage controller 38, based on the information of displacement in the θz direction of the wafer table TB1, the reticle driver 26 is controlled in order to rotate of the reticle stage RST (the reticle minute movement stage), and discrepancy of rotational displacement of the wafer side can be corrected.

Furthermore, in response to the instruction of the main controller 16, the stage controller 38 and the laser controller 18 control the respective parts in the same manner as described above so that scanning exposure is performed with respect to the second shot region on the wafer W1.

Thus, scanning exposure of a shot region on the wafer W1 and stepping operation for exposure of the following shot region are repeatedly performed, so that a pattern of the reticle R is sequentially transferred to all of the shot regions to be exposed on the wafer W1.

Exposure is performed with respect to the wafer W2 on the wafer table TB2 in the same manner as described above. That is, the stage controller 38 monitors the measurement values of the interferometer system 30 having the measurement axes BI2Y and BI2X, based on the instructions given from the main controller 16. While performing this monitoring, the X-axis linear motors 66C and 66D and the Y-axis linear motor 75B are controlled, a stepping operation for the scanning exposure and the following shot exposure on the wafer W2 is repeatedly performed, and a pattern of the reticle R is sequentially transferred to the exposure object shot region on the wafer W2.

Additionally, the accumulated (total) exposure amount that is to be given to the respective points on the wafer during the scanning exposure is controlled by the main controller 16, which controls the laser controller 18 and the stage controller 38 to control at least one of: (a) the scanning speed of the reticle stage and the wafer stage, (b) an extinction percentage of a light extinction unit within the illumination unit, (c) a pulse energy amount per pulse output from the light source, and (d) the oscillation frequency (pulse repeating frequency) of the undepicted light source.

Furthermore, in the main controller 16, for example, when a moving start position (synchronizing position) of the reticle stage and the wafer table is changed during scanning exposure, changes of the stage position are instructed corresponding to the change amount with respect to the stage controller 38 that moves and controls the respective stages.

Figure 10:
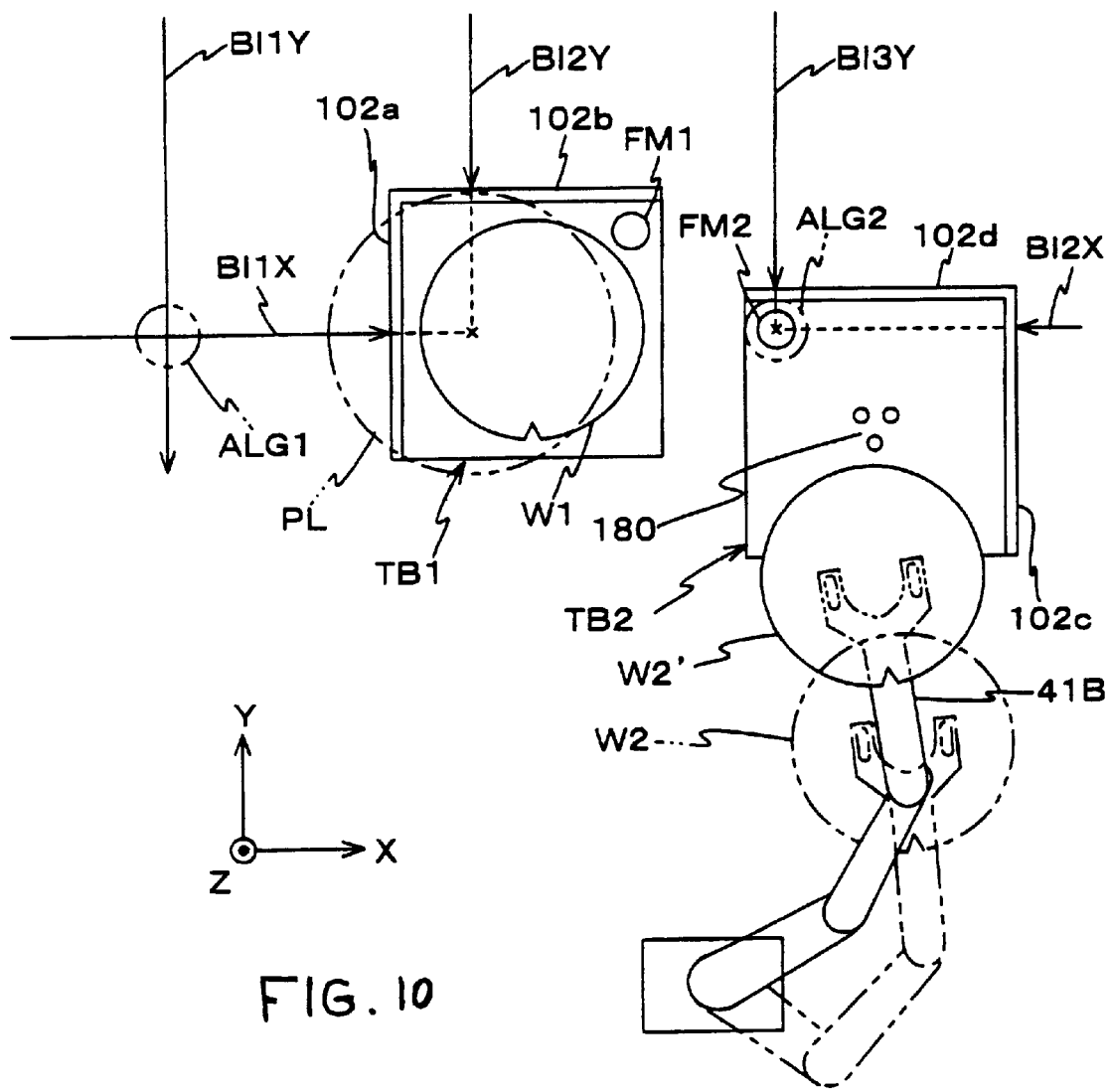
FIG. 10 is a diagram explaining a first step in simultaneous parallel processing by two wafer tables.

The following briefly explains the operation in the exposure apparatus 10 during wafer replacement. With reference to FIG. 10, replacement of the wafer W2' with the wafer W2 is performed on the wafer table TB2, which is at a right-side wafer loading position. This wafer replacement is performed by controlling each part as the main controller 16 and the undepicted wafer loader controller work together. However, explanation with respect to the main controller 16 and the wafer loader controller is omitted in order to simplify the explanation.

First, absorption of the wafer W2' due to an undepicted wafer holder on the wafer table TB2 is released. A substrate handling mechanism (hereafter referred to as "center-up") 180 on the wafer table TB2 is lifted by a predetermined amount, so that the wafer W2' is raised upward to a predetermined position.

Next, an arm of a wafer loader 41B moves below the raised wafer W2' on the wafer table TB2.

In this state, the center-up 180 is moved down to a predetermined position. Midway during the downward movement, the wafer W2' is handed to (i.e., contacts with) the arm of the wafer loader 41B.

Next, after the wafer loader 41B carries the wafer W2' to an undepicted carrier within the compartment 48, a new wafer W2 is held by an arm and carried over the wafer table TB2.

In this state, the center-up 180 is moved upward, and the wafer W2 is lifted by the center-up 180 from the arm of the wafer loader 41B. Next, the arm of the wafer loader 41B is moved away from the wafer table TB2. During this movement, the center-up 180 begins to go down, the wafer W2 is mounted to an undepicted wafer holder on the wafer table TB2, and vacuum absorption of the wafer holder is turned on. By this operation, a series of sequences is completed with respect to wafer replacement.

Figure 12:
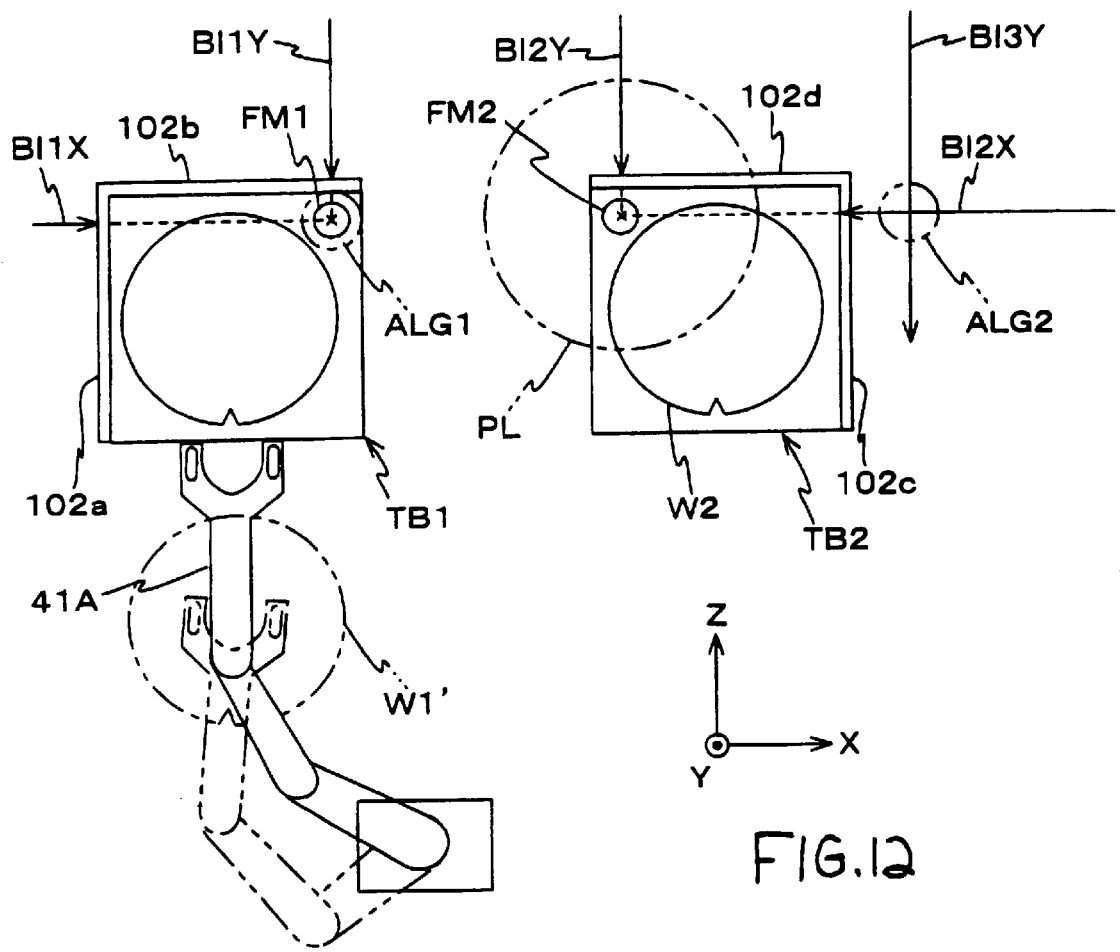
FIG. 12 is a diagram explaining a third step in simultaneous parallel processing by two wafer tables.

On another wafer table TB1 side, when the wafer is located on the left side of the loading position as shown in FIG. 12, wafer replacement is performed by the wafer loader 41A and an undepicted center-up in the same manner as described above.

Figure 11:
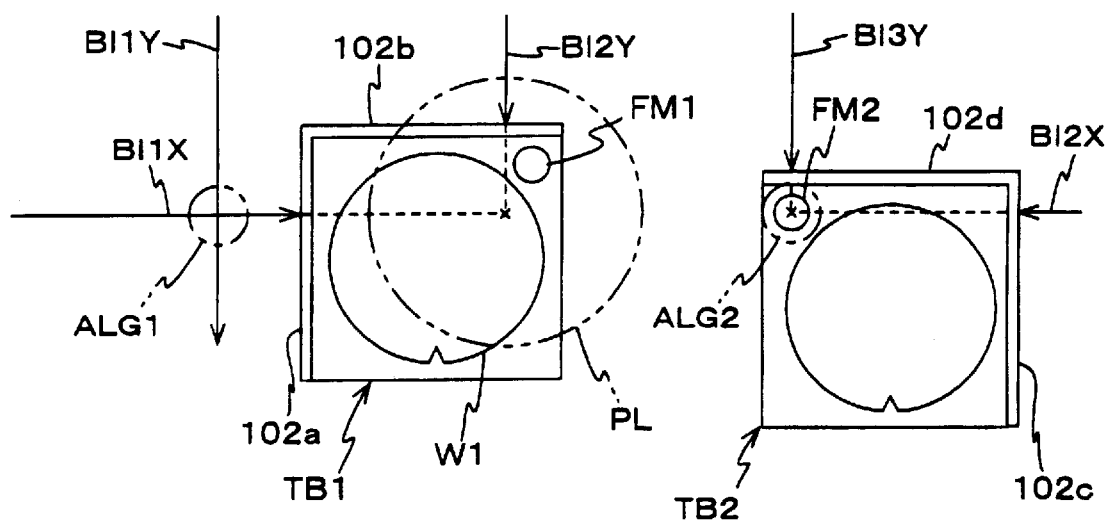
FIG. 11 is a diagram explaining a second step in simultaneous parallel processing by two wafer tables.
Figure 11:
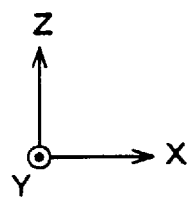
Figure 11:
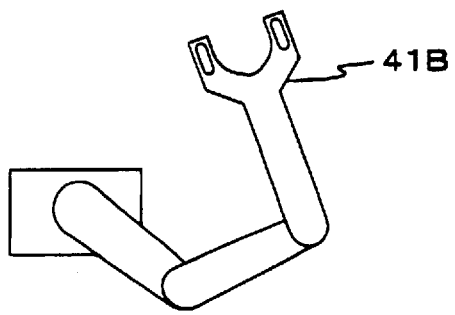

The following explains a parallel processing by the two wafer tables TB1 and TB2 with respect to FIGS. 10–12.

FIG. 10 shows a plan view of a state in which an exposure operation is performed with respect to the wafer W1 on the wafer table TB1 via the projection optical system PL, and wafer replacement is performed between the wafer table TB2 and the wafer loader 41B as described above at a right-side loading position. On the wafer table TB1, a wafer alignment operation is performed as described later following the wafer replacement. Furthermore, in FIG. 10, the position of the wafer table TB1 during the exposure operation is controlled as the stage controller 38 controls the X-axis linear motors 66A and 66B and the Y-axis linear motor 75A based on the measurement values of the interferometer system 30 having the measurement axes BI1X and BI2Y in response to instructions from the main controller 16. Furthermore, the position of the wafer table TB2 in which wafer replacement is performed is controlled as the stage controller 38 servo-controls the X-axis linear motors 68C and 68D and the Y-axis linear motor 75B based on the measurement values of the interferometer system 30 having the measurement axes BI2X and BI3Y in response to instructions from the main controller 16.

In this case, at the right-side loading position shown in FIG. 10, the reference mark MK2 (see FIG. 13) on the reference mark plate FM2 of the wafer table TB2 is arranged so as to be moved directly under the alignment optical system ALG2. In the main controller 16, prior to detecting the reference mark MK2 on the reference mark plate FM2 by the alignment optical system ALG2, the interferometer system 30 having the measurement axis BI3Y is reset through the stage controller 38.

In the case of detecting the reference mark MK2, an image of the reference mark MK2 is taken in from the FIA system sensor of the alignment optical system ALG2, and the image signal is sent to the alignment controller 136 (see FIG. 9). In the alignment controller 136, a predetermined processing is performed with respect to the image signal. By analyzing the processed signal, the position of the reference mark MK2 is detected while using a target center of the FIA system sensor of the alignment optical system ALG2 as a reference. In the main controller 16, based on the measurement result of the interferometer having the measurement axes BI2X and BI3Y and the detection result of the position of the reference mark MK2, the coordinate position of the reference mark MK2 on the reference mark plate FM2 in the coordinate system using the measurement axes BI2X and BI3Y is calculated.

After the coordinate position of the reference mark MK2 is calculated, search alignment is performed. This search alignment after wafer replacement has significant positional errors if pre-alignment is only used when the wafer W2 is initially loaded, so reference is made to pre-alignment that is again performed on the wafer table TB2. Specifically, the positions of three search alignment marks (not depicted) formed on the wafer W2 mounted on the wafer table TB2 are measured by using a sensor or the like of the LSA system of the alignment optical system ALG2. Based on the measurement result, a positional shift in the X, Y and θz directions of the wafer W2 is measured. Operation of the respective parts during the search alignment is controlled by the main controller 16.

After this search alignment is completed, fine alignment is performed in which the arrangement of the shot regions on the wafer W2 is obtained by using the EGA (Enhanced Global Alignment) process. Specifically, based on the measurement values of the interferometer system 30 having the respective measurement axes BI2X and BI3Y, the position of the wafer table TB2 is controlled. At the same time, based on the shot alignment data (alignment mark positional data), which depends on the design of the circuit being patterned, the wafer table TB2 is sequentially moved, and the alignment mark position of a predetermined sample shot region on the wafer W2 is measured by a sensor or the like of the FIA system of the alignment optical system ALG2. Based on the design coordinate data of the shot arrangement and the measurement result, the entire shot arrangement data is statistically calculated by a least squares method. By this operation, a coordinate position of respective shot regions can be calculated on the coordinate system using the measurement axes BI2X and BI3Y. Additionally, the operation of the respective parts during this EGA process is controlled by the main controller 16, and the calculation is performed by the main controller 16.

Figure 13:
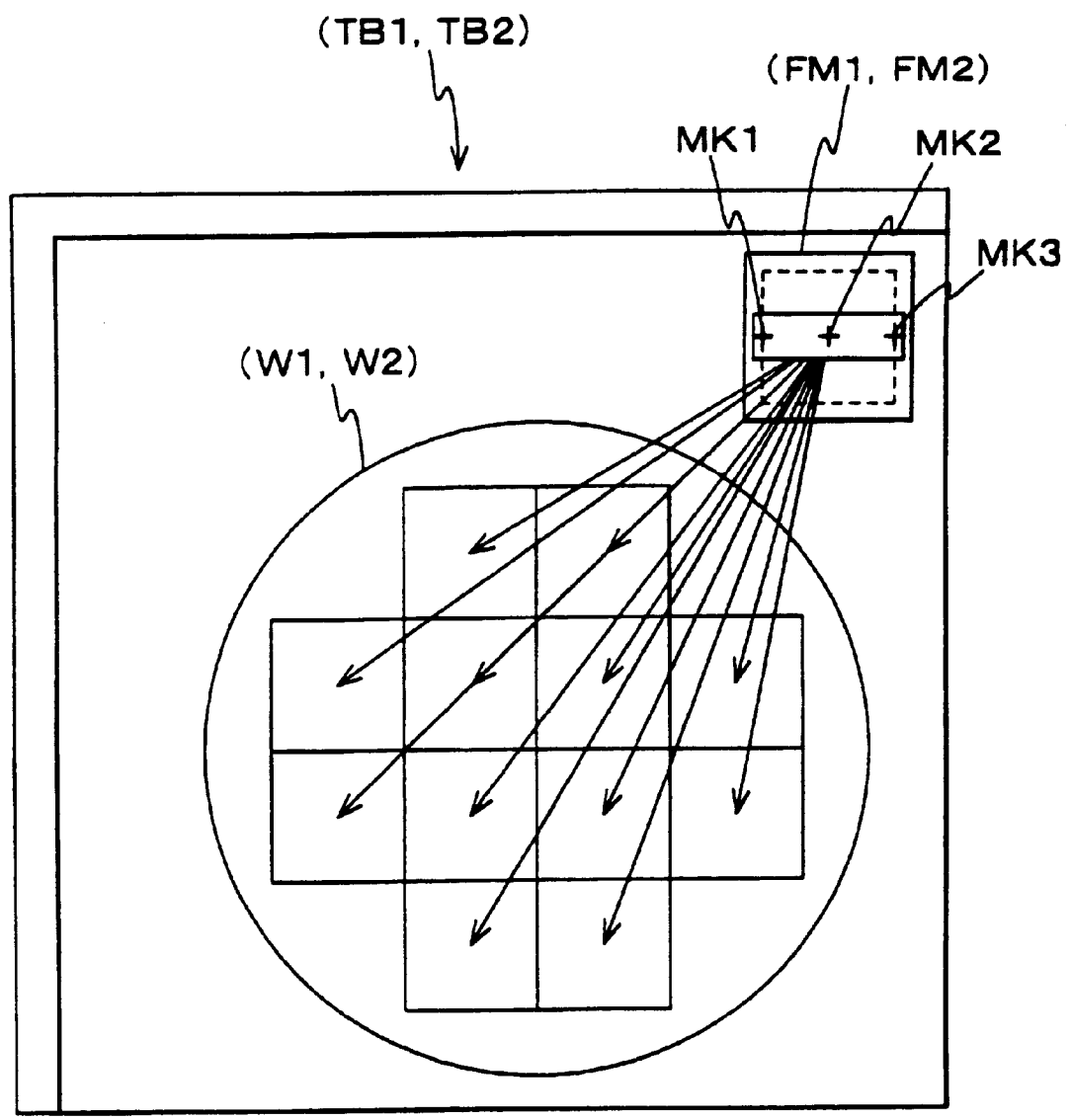
FIG. 13 is a diagram schematically showing a relative positional relationship of each shot region to a reference mark plate used as a reference.

Furthermore, in the main controller 16, by subtracting the coordinate position of the reference mark MK2 from the coordinate position of the respective shot regions, the relative positional relationship of the respective shot regions to the reference mark MK2 is calculated as shown in FIG. 13.

The pattern of the reticle R is transferred to the respective shot regions on the wafer W1 by the step-and-scan method in the wafer table TB1 side while the wafer replacement and alignment operation is being performed in the wafer table TB2 side.

Specifically, the relative positional relationship of the respective shot regions with respect to the reference mark MK2 on the reference mark plate FM1 is calculated in advance in the same manner as the wafer W2 side. As a result, based on the result of the relative positional detection of the reference marks MK1 and MK3 on the reference mark plate FM1 due to a pair of reticle alignment microscopes 138A and 138B and of a projection image on the wafer surface of the mark on the reticle corresponding to the reference marks MK1 and MK3, the wafer table TB1 is sequentially positioned at a scanning start position for exposure of the shot regions on the wafer W1. Furthermore, while positioning the wafer table TB1, every time exposure is performed for the respective shot regions, by synchronizing the reticle stage RST and wafer table TB1 and relatively scanning them in a scanning direction (Y-axis direction), a reticle pattern is transferred to each respective shot region by a scanning exposure method.

With respect to the exposure sequence and the wafer replacement alignment sequence that are performed in parallel on the two wafer tables TB1 and TB2 as shown in FIG. 10, the wafer replacement·alignment sequence is normally completed first. Because of this, the wafer table TB2 in which alignment is completed is in a waiting state at a predetermined waiting position (which will be discussed later). However, in this embodiment, due to the following reasons, prior to moving the wafer table TB2 to the waiting position, as shown in FIG. 11, the wafer table TB2 temporarily returns to the right-side loading position which was described earlier.

That is, after the alignment sequence is performed, when it moves to start the exposure sequence, the wafer table TB2 moves to the reference position during exposure in which the reference mark MK2 on the reference mark plate FM2 is positioned directly below the optical axis AX center (projection center) of the projection optical system PL shown in FIG. 12. Midway during the movement, the interferometer beam from the interferometer having the measurement axis BI3Y is not incident to the Y moving mirror 102d of the wafer table TB2, so it is difficult to move the wafer table TB2 to a position of FIG. 12 immediately after the alignment is completed. Therefore, as described earlier, in this embodiment, when the wafer table TB2 is located at the right-side loading position, it is set so that the reference mark plate FM2 comes right under the alignment optical system ALG2 (see FIG. 11). At this position, the interferometer having the measurement axis BI3Y is reset, so the wafer table TB2 temporarily returns to this position. The distance (hereafter referred to as "BL") between the detection center of the alignment optical system ALG2 and the optical axis center of the projection optical system PL (projection center) are known in advance. Thus, while monitoring the measurement value of the interferometer 34 having the measurement axis BI2X, the wafer table TB2 moves to the –X side only by the distance BL. Accordingly, the wafer table TB2 can be moved to a position shown in FIG. 12.

The wafer table TB2 moves in the –X direction from the position shown in FIG. 11 after waiting at a predetermined waiting position.

Then, when exposure with respect to the wafer W1 on the wafer table TB1 is completed, the respective wafer tables TB1 and TB2 (that is, the first and second stages ST1 and ST2) move to a reference surface switching position, which will be described later, and switch the X-axis linear motor and the movement reference surface at the reference surface switching position. These will be discussed in detail later.

Furthermore, after switching of the movement reference surface and the X-axis linear motor is completed, the wafer tables TB1 and TB2 are driven to the position shown in FIG. 12 via the X-axis linear motors 68A and 68B and the X-axis linear motors 66C and 66D, respectively.

Subsequently, in the main controller 16, the relative position of a projected image of the wafer surface of marks on the reticle corresponding to the reference marks MK1 and MK3 on the reference mark plate FM2 is detected by a pair of reticle alignment microscopes (not depicted) using an exposure light beam.

Here, in the main controller 16, prior to detecting the relative position (taking in of the image signal of the respective mark images by the reticle alignment microscopes), the interferometer having the measurement axis BI2Y is reset. A reset operation is performed when the measurement axis to be subsequently used is capable of irradiating the Y-moving mirror.

Because of this, with respect to the relative position detection, a coordinate position of the reference marks MK1 and MK3 on the reference mark plate FM2 in the coordinate system using the measurement axes BI2X and BI2Y and the projection image coordinate position on the wafer surface of the mark on the reticle R is detected. Furthermore, a relative positional relationship of the coordinate position of the reference marks MK1 and MK3 on the reference mark plate FM2 and an exposure position (projection center of the projection optical system PL) can be obtained from the difference.

Furthermore, in the main controller 16, based on the relative positional relationship between the respective shot regions on the wafer W2 previously determined for the reference mark MK2 on the reference mark plate FM2 and a relative positional relationship between the coordinate position of the pair of reference marks MK1 and MK3 on the reference mark plate FM2 and the exposure position, the relative positional relationship can be ultimately calculated between the respective shot regions and the exposure position. Then, based on the result of this calculation, in the same case as for the wafer W1 described earlier, scanning exposure is performed by sequentially positioning the wafer table TB2 at a scanning start position for exposure of the respective shot regions on the wafer W2, and then exposing each shot region by synchronously scanning the reticle stage RST and the wafer table TB2 in the scanning direction.

Meanwhile, at the left-side loading position shown in FIG. 12, in the same manner as the right-side loading position, the reference mark MK2 on the reference mark plate FM1 is set so as to be positioned under the alignment optical system ALG1, and the wafer replacement operation is performed. The reset operation of the interferometer system 30 of the interferometer 52 having the measurement axis BI1Y is performed prior to detection of the reference mark MK2 on the reference mark plate FM1 by the alignment optical system ALG1.

As described above, even if the reset operation of the interferometer is performed, alignment with high accuracy is possible. This is because, after the reference mark on the reference mark plate FM1 is measured by the alignment optical system ALG1, by measuring the alignment marks of the respective shot regions on the wafer W1, the interval between the reference mark and the imaginary position calculated by the measurement of the wafer marks is calculated. At this point, the relative positional relationship (relative distance) of the position to be exposed and the reference mark is obtained. Therefore, if the reference mark position corresponds to the exposure position by the reticle alignment microscopes prior to exposure, by adding the relative distance to the calculated value, even if the interferometer beam of the interferometer in the Y-axis direction is turned off during the wafer stage movement and resetting is again performed, an exposure operation with high accuracy can be performed.

While the wafer table TB2 moves from the alignment completion position to the position of FIG. 12, eventually the measurement axis BI3Y will no longer intersect the mirror 102d. However, the wafer table TB2 can move to the position of FIG. 12 in a straight line manner. In this case, the measurement axis BI2Y, which intersects the optical axis AX of the projection optical system PL, contacts the Y moving mirror 102d of the wafer table TB2, and a reset operation of the interferometer is performed at the point prior to the relative position of detection of the projected image on the wafer surface of the marks on reticle corresponding to the reference marks MK1 and MK3 on the reference mark plate FM2 by the reticle alignment microscope.

When the wafer table TB1 moves from the exposure completion position to the left-side loading position shown in FIG. 12, in the same manner as described above, the reset operation of the interferometer having the measurement axis BI1Y is performed.

In this embodiment, as described above, when exposure is completed with respect to the respective shot regions for the entire wafer on one wafer table, one wafer table is moved to the alignment operation area for performance of wafer replacement, and the other wafer table moves to the exposure operation area from its alignment operation area. During this time, switching of the movement reference surface that is used as a reference when the first and second stages ST1 and ST2 move, and switching of the X-axis linear motor that is a driving device in the X-axis direction is performed.

Figure 14B:
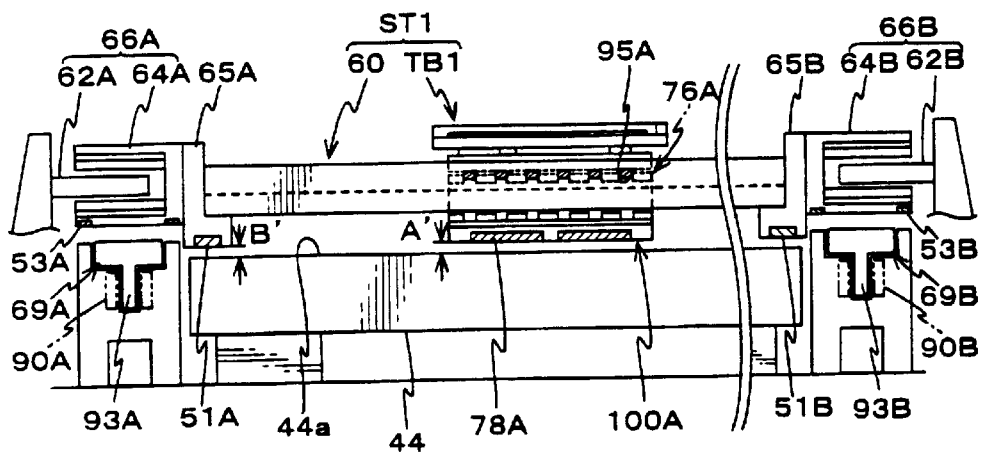
Figure 14C:
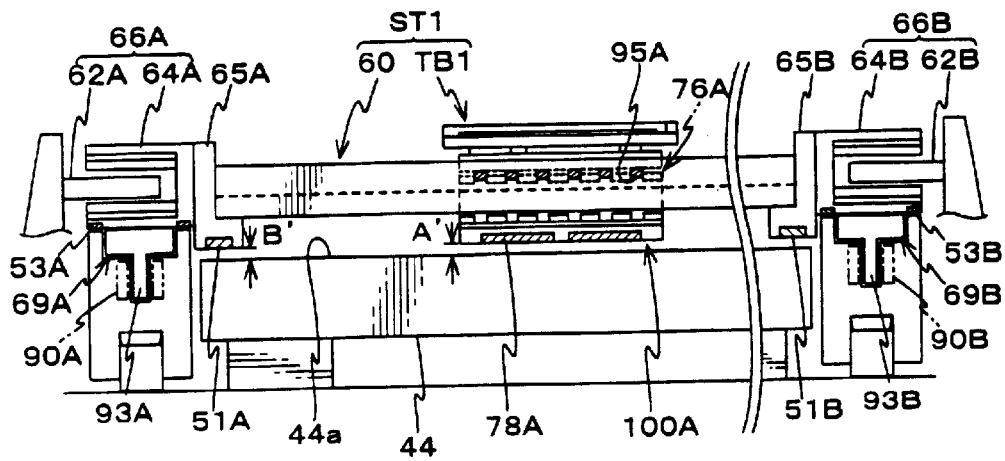

The following explains switching of the movement reference surface and the X-axis linear motor with reference to FIGS. 14A–14C.

FIG. 14A is a schematic diagram of a state in which the exposure operation (exposure sequence) has been completed for wafer table TB1, which is located over the stage holding plate 44. The view is from the +X direction (in the −X direction). In a state when exposure is completed shown in FIG. 14A, the first stage ST1 can be driven in the X-axis direction by the X-axis linear motors 66A and 66B by using the first movement reference surface 44a on the stage holding plate 44 as a reference. At this time, the wafer table TB1 is floatingly supported over the first movement reference surface 44a with a predetermined clearance as described earlier with the bearing device 78A arranged in the bottom surface of the wafer table TB1 (stage main body 100A). Here, as shown in FIG. 14A, the clearance is A $\mu$m as one example, and this clearance A $\mu$m is measured by the gap sensor GS2 arranged in the bottom surface (or in the plurality of bearing devices 78A) of the stage main body 100A.

Furthermore, in FIG. 14A, the first moving body 60 is floatingly supported over the first movement reference surface 44a in the same manner as the wafer table TB1 with the bearing devices 51A and 51B arranged in the bottom surface of the fixing members 65A and 65B arranged in the vicinity of both end portions of body 60. Clearance between the first movement reference surface 44a and the bottom surface (specifically, the bottom surface of the bearing devices 51A and 51B) of the first movement body 60 is measured to be B $\mu$m by the gap sensor GS1. Here, the clearance A $\mu$m can be the same value as the clearance B $\mu$m, or they can be different values.

Furthermore, in FIG. 14A, the sliders 69A and 69B are located at a limit position (reference surface switching position) in the vicinity of the end portion in the −X direction of the stage holding plate 44. FIGS. 4 and 8 show a state in which the sliders 69A and 69B are located at this reference surface switching position.

According to FIG. 14A, the first stage ST1 performs an alignment sequence for the following wafer during and after wafer replacement; therefore, it moves in the −X direction (out of the paper plane in FIG. 14A) toward the left-side loading position (see FIG. 12). This movement is performed by the stage controller 38 via the X-axis linear motors 66A and 66B. Midway during this movement, switching of the X-axis linear motor and the movement reference surface takes place for the first stage ST1.

This switching operation is performed by the stage controller 38 under the instructions of the main controller 16. First, in the stage controller 38, before the first stage ST1 reaches the reference surface switching position, an operation is performed that increases a floating force of the bearing devices 51A and 51B arranged in the bottom surface of the fixing members 65A and 65B and the bearing device 78A arranged in the bottom surface (bottom surface of the stage main body 100A) of the wafer table TB1 so as to further float the wafer table TB1 and the first moving body 60 above the position of FIG. 14A. Here, "increasing a floating force" means making a hydrostatic pressure of pressurized gas between the movement reference surface 44a and the respective bearing devices larger with respect to a vacuum preload pressure by adjusting at least one of a vacuum preload force of the bearing devices 78A, 51A and 51B, a pressure of a pressurized gas, or an exhaust flowing amount so as to enlarge the clearance with respect to the movement reference surface 44a. Here, by suspending an operation of a vacuum source such as a vacuum pump or the like and making a vacuum preload force 0, the most simplified method is used to increase the floating force of the bearing devices 78A, 51A and 51B.

During the above-mentioned operation, when the wafer table TB1 and the first moving body 60, that is, the first stage ST1, begins floating higher (moves in the +Z direction), the measurement values of the gap sensors GS1 and GS2 are monitored by the stage controller 38. Furthermore, when the first stage ST1 reaches the reference surface switching position and the measurement values of the gap sensors GS1, GS2 become a predetermined A'(=A+$\alpha$) $\mu$m, B' (=B+$\gamma$) $\mu$m (here, $\alpha$ and $\gamma$ are, for example, several 10 $\mu$m), a pressure of pressurized gas or the like from the bearing devices 78A, 51A, and 51B is controlled so as to maintain these clearances A'$\mu$m, B'$\mu$m. FIG. 14B shows this state. Furthermore, $\alpha$=$\gamma$ is preferable, but the invention is not limited to this. It is preferable that $\alpha$ and $\gamma$ are within a predetermined range.

Subsequently, in the stage controller 38, the guides 67A and 67B are driven in an upward direction (+Z direction) by controlling the first moving device 99A and the second moving device 99B. Accordingly, the sliders 69A and 69B are lifted integrally with the guides 67A and 67B. The sliders 69A and 69B are lifted along with the guides 67A and 67B by a predetermined amount (the guides 67C and 67D go down integrally with the sliders 69C and 69D by the same amount), and when the bottom surface of the movable parts 64A and 64B contacts the top surface of the sliders 69A and 69B, the driving is suspended. FIG. 14C shows this state.

Subsequently, in the stage controller 38, emission of pressurized gas from the bearing devices 51A and 51B arranged in the bottom surface of the fixing members 65A and 65B and the bearing device 78A arranged in the bottom surface of the wafer table TB1 is respectively suspended. At the same time, in the stage controller 38, emission of pressurized gas and vacuum absorption from the bearing device 95A arranged in the space between the field magnets 79a of the wafer table TB1 begins, and a pressure within the space between the stationary part 61A and the bearing surface of the bearing device 95A is set at a predetermined value. At the same time, emission of pressurized gas and vacuum absorption from the bearing devices 53A and 53B arranged in the bottom surface of the movable parts 64A and 64B, respectively, begin, and a pressure within a space between the second movement reference surfaces 97a, 97b, 97c, and 97d which are the top end surfaces of the guides 67A and 67B and the bearing surface of the bearing devices 53A and 53B is set at a predetermined value.

By this operation, the first stage ST1 is floatingly supported via a predetermined clearance over the second movement reference surfaces 97a, 97b, 97c, and 97d, which are the top end surfaces of the guides 67A and 67B. Thus, the first stage ST1 is in a state in which it can be driven in the X-axis direction by the X-axis linear motors 68A and 68B by using the second movement reference surfaces 97a, 97b, 97c, and 97d.

Switching of the movement reference surface of the first stage ST1 and switching of the X-axis linear motor is completed. Then, the first stage ST1 can be driven toward the left-side loading position via the X-axis linear motor 68A and 68B by the stage controller 38.

Meanwhile, while the first stage ST1 moves from the exposure completion position to the reference surface switching position and switches the reference surface or the like, the following operation is performed in the second stage ST2 side.

That is, when exposure is completed in the wafer table TB1 side, the second stage ST2 awaits at a predetermined waiting position (position in the vicinity of the reference surface switching position, which is a limit position on the −X side of the sliders 69A and 69B in the vicinity of the end portion in the +X direction of the stage holding plate 44) as alignment is completed with respect to the wafer W2 on the wafer table TB2. At this time, the second stage ST2 is floatingly supported by the bearing devices 53C and 53D over the second movement reference surface on the guides 67C and 67D and is in a state in which it can be driven in the X-axis direction by the X-axis linear motors 68C and 68D by using the second movement reference surface as a reference.

Furthermore, the second stage ST2 moves to a reference surface switching position in order to perform an exposure sequence for the wafer W2. This movement is performed via X-axis linear motors 68C and 68D by the stage controller 38. Furthermore, when the second stage ST2 reaches the reference surface switching position, switching of the X-axis linear motor and switching of the movement reference surface is performed when the second stage ST2 moves.

When the second stage ST2 reaches the reference surface switching position, the wafer table TB2 and the second moving body 70 are positioned over the staging holding plate 44. In the stage controller 38, emission of pressurized gas from the bearing devices 51C and 51D arranged in the bottom surface of the fixing members 65C and 65D and the bearing device 78B arranged in the bottom surface of the wafer table TB2 begins. At the same time, in the stage controller 38, vacuum absorption and emission of pressurized gas from the bearing device 95B arranged in the space between the field magnets 79a of the wafer table TB2 is suspended, and vacuum absorption and emission of pressurized gas from the bearing devices 53C and 53D arranged in the bottom surface of the movable parts 64C and 64D is suspended.

Subsequently, in the stage controller 38, by controlling the first moving device 99A and the second moving device 99B, the guides 67C and 67D are driven in a downward direction (−Z direction). Furthermore, driving of the guides 67C and 67D in a downward direction is accompanied by lifting of the guides 67A and 67B when the movement reference surface of the first stage ST1 explained previously is switched. Therefore, the sliders 69C and 69D go down integrally with the guides 67C and 67D. After the sliders 69C and 69D go down by a predetermined amount along with the guides 67C and 67D (that is, when the sliders 69A and 69B are lifted along with the guides 67A and 67B), the driving is suspended. Accordingly, a predetermined clearance is generated between the bottom surface of the stationary parts 64C and 64D and the top surface of the sliders 69C and 69D. However, at this point, the wafer table TB2 and the second movement body 70 are floatingly supported over the first movement reference surface 44a on the stage holding plate 44, so no inconvenience (or problem) is caused.

By this operation, the movement reference surface during the movement of the second stage ST2 is switched from the second movement reference surface to the first movement reference surface. Hereafter, the second stage ST2 can be driven in the X-axis direction by the X-axis linear motors 66C and 66D by using the first movement reference surface 44a as a reference.

Subsequently, in order to expose the wafer W2 on the wafer table TB2, the second stage ST2 moves in the −X direction toward the reference position for use during the exposure. Before the second stage ST2 reaches this reference position, in the stage controller 38, vacuum absorption due to the bearing devices 51C and 51D arranged in the bottom surface of the fixing members 65C and 65D and the bearing device 78B arranged in the bottom surface of the wafer table TB2 begins, and the measurement values of the gap sensors GS4 and GS3 become A $\mu$m and B $\mu$m, respectively. This is why a pressure within the space of the respective bearing devices is adjusted.

Furthermore, when the alignment sequence and wafer replacement of the first stage ST1 is completed followed by the exposure sequence, switching of the X-axis linear motor and the movement reference surface is performed in the same manner as in the case of the second stage ST2. Furthermore, when the exposure sequence of the wafer W2 is completed followed by the wafer replacement alignment sequence, switching of the X-axis linear motor and the movement reference surface of the second stage ST2 is performed in the same manner as in the case of the first stage ST1.

Preferably, a control sequence is used that results in the position of the stages ST1 and ST2, when exposure is completed with respect to the wafer on the wafer tables TB1 and TB2, being closer to the reference surface switching position of the respective stages and results in the waiting position of the stages ST1 and ST2 when alignment is completed to be closer to the reference surface switching position of the respective stages. Accordingly, soon after exposure is completed with respect to the wafer on one wafer table, exposure can begin with respect to the wafer on the other wafer table, so the entire throughput can be improved.

As described in detail above, according to this embodiment, an exposure apparatus includes a stage holding plate 44 having a movement reference surface (first movement reference surface) 44a for a region (specified region) in which exposure is performed with respect to a wafer on the first and second stages ST1 and ST2. The exposure apparatus also includes respective pairs of guides 67A, 67B, 67C, and 67D having movement reference surfaces (the second movement reference surface) for the first and second stages ST1 and ST2 located at least partly outside of the specified region.

Furthermore, when the wafer on the wafer tables TB1 and TB2 is moved from the exposure sequence area to the wafer replacement sequence area, as described earlier, based on instructions from the main controller 16, the movement reference surface of the first and second stages ST1 and ST2 is switched from the first movement reference surface to the second movement reference surface by the stage controller 38. That is, a first state in which the first and second stages ST1 and ST2 can move in a specified region along the first movement reference surface is switched to a second state in which the first and second stages ST1 and ST2 can move outside the specified region along the second movement reference surface.

Meanwhile, when the wafer on the wafer tables TB1 and TB2 is moved from the alignment sequence area to the exposure sequence area, as described above, based on instructions from the main controller 16, the movement reference surface of the first and second stages ST1 and ST2 is switched by the stage controller 38 from the second movement reference surface to the first movement reference surface. That is, a second state in which the first and second stages ST1 and ST2 can move outside a specified region along the second movement reference surface is switched to a first state in which the first and second stages ST1 and ST2 can move in a specified region along the first movement reference surface.

Because of this, even if the stage holding plate 44 in which the movement reference surface 44a in the specified region is formed is physically distant from the guides 67A, 67B, 67C and 67D in which the movement reference surface outside the specified region is formed, this does not cause any problem with respect to the movement between the specified region and the region outside of the specified region by the first and second stages ST1 and ST2.

Therefore, compared to the case in which the movement reference surface of the specified region and the movement reference surface of the region outside the specified region of the first and second stages ST1 and ST2 are formed in the same reference member, the respective reference members, that is, the area of the stage holding plate 44, the guides 67A and 67B and the guides 67C and 67D can be made smaller. In this case, the movement reference surface can be processed (i.e., formed) with accuracy with respect to the stage holding plate 44 in addition to the guides 67A–67D. Difficulty of processing the movement reference surface can be overcome, and stability of the respective stages can be suitably assured in the case of movement that uses the movement reference surface of the stage holding plate 44, the guides 67A and 67B or the guides 67C and 67D as a reference. At the same time, controlling the position of the stages can be suitably maintained.

Furthermore, the respective pairs of guides 67A, 67B, 67C and 67D as second reference members are individually arranged (two pairs in this case) with respect to the first and second stages ST1 and ST2, so the area of the movement reference surface 44a of the stage holding plate 44 as a first reference member can be minimized. At the same time, because the second reference members are separately arranged for each of the stages, as described above, when the first and second stages switch between the first state and the second state, it is possible that both stages do not use the same reference member simultaneously.

Therefore, vibration due to the movement of one stage is not transmitted to the other stage via the reference member, and controlling the position of the respective stages can be more easily accomplished.

Furthermore, the first reference member on which the movement reference surface of the specified region is formed is the stage holding plate 44, and the second reference members are the respective pairs of guides, so compared to the case in which the first and second reference members are holding plates, the entire stage device 12 can be designed with a lighter weight.

Furthermore, in this embodiment, in the region (specified region) in which exposure is performed in which positional controllability (including stability) with high accuracy of the first and second stages ST1 and ST2 is required, the stage holding plate 44 in which the movement reference surface 44a for both stages is formed is used as a reference member, and in the region outside the specified region in which wafer replacement and wafer alignment is performed, in which positional controllability with high accuracy is not required with respect to the stages, pairs of guides 67A, 67B, 67C, and 67D on which the movement reference surface of the respective stages is formed are used as reference members. Because of this, the stage holding plate 44 can be made smaller, and of course, processing of the surface of the movement reference surface 44a can be simplified. Positional controllability with the accuracy required for the stages can be assured.

Furthermore, as is clear from the above explanation, the stage device 12 of this embodiment includes the moving devices 99A and 99B, the X-axis linear motors 66A–66D and 68A–68D, and the stage controller 38 controlling these devices and motors, and the switching device. Because of this, even if a positional relationship in the Z-axis direction between the movement reference surface 44a of the specified region of the first and second stages ST1 and ST2 formed in the stage holding plate 44 and the movement reference surface outside the specified region formed in the guides 67A–67D is shifted, by moving the guides 67A and 67B or the guides 67C and 67D in the Z-axis direction by the moving devices 99A and 99B, the stage holding plate 44 and the guides 67A and 67B or the guides 67C and 67D can be adjusted with a desired positional relationship. After this adjustment, the first stage ST1 is driven by the X-axis linear motors 66A and 66B along the first movement reference surface 44a or the first stage ST1 is driven by the X-axis linear motors 68A and 68B along the second movement reference surface, so the first stage ST1 can be switched between the first and second states. In the same manner, after the above-described adjustment, as the second stage ST2 is driven by the X-axis linear motors 66C and 66D along the first movement reference surface 44a or the second stage ST2 is driven by the X-axis linear motors 68C and 68D along the second movement reference surface, the second stage ST2 can be switched between the first and second states.

Furthermore, in this embodiment, when the first stage ST1 is switched between the first and second states, the switching device switches a first support state that supports the first stage ST1 over the stage holding plate 44 due to a balance between a hydrostatic pressure of pressurized gas and a vacuum preload force between the stage holding plate 44 and the first stage ST1, with a second support state that supports the first stage ST1 over the guides 67A and 67B due to a balance of a hydrostatic pressure of pressurized gas and a vacuum preload force between the guide 67A and 67B and the first stage ST1. Because of this, in response to the respective areas between the second movement reference surface on the guides 67A and 67B and the first movement reference surface 44a of the stage holding plate 44, emission of pressurized gas is performed. Because of this, an emitting state of appropriately pressurized gas corresponding to the respective support states can be accomplished. Accordingly, wasteful emission of pressurized gas can be prevented. Furthermore, in this case, due to the balance adjustment in at least one of the first and second support states of the first stage ST1, a relative position in the Z-axis direction of at least one of the guides 67A and 67B, the stage holding plate 44, and the first stage ST1 can be adjusted. As a result, due to the balance adjustment in at least one of the first and second support states of the first stage ST1, a relative position in the Z-axis direction between the stage holding plate 44 and the guides 67A and 67B can be substantially adjusted.

In the same manner as described above, in the case of switching between the first and second states of the second stage ST2, the switching device can switch the first and second support states of the second stage ST2, so that an emission state of appropriately pressurized gas can be accomplished in response to the respective support states. Accordingly, wasteful emission of pressurized gas can be prevented. Furthermore, in this case as well, in the same manner as described above, due to the balance adjustment in at least one of the first and second support states of the second stage ST2, a relative position in the Z-axis direction between the stage holding plate 44 and the guides 67C and 67D can be substantially adjusted.

Furthermore, in this embodiment, a driving device of the first stage ST1 includes the X-axis linear motors 66A and 66B for driving the first stage ST1 in the specified region and the X-axis linear motors 68A and 68B for driving the first stage ST1 outside the specified region. In addition, a driving device of the second stage ST2 includes the X-axis linear motors 66C and 66D for driving the second stage ST2 in the specified region and the X-axis linear motors 68C and 68D for driving the second stage ST2 outside the specified region. Because of this, a reaction force generated by movement of one stage is prevented from being transmitted via the reference member and the driving device to the other stage, so movement of one stage does not cause vibration of the other stage. Therefore, controlling of positioning of the respective stages can be further improved.

Furthermore, in the exposure apparatus 10 of this embodiment, as two wafer tables TB1 and TB2 are independently moved in the two-dimensional direction, an exposure sequence on wafer W1 and a wafer replacement·alignment sequence on wafer W2 are performed in parallel. Because of this, compared to the case when wafer replacement→alignment→exposure is sequentially performed, throughput can be improved.

Furthermore, in the stage device 12 of this embodiment, as described earlier, the one stage is affected by vibration due to movement of the other stage. Because of this, an operation performed on one wafer table does not negatively affect an operation performed on the other wafer table. Therefore, it is not necessary to alter the timing of each operation so that the exposure and replacement·alignment operations can be simultaneously performed. Rather, each operation can be performed independently without a concern that they will adversely affect the other.

[Second Embodiment]

Figure 15:
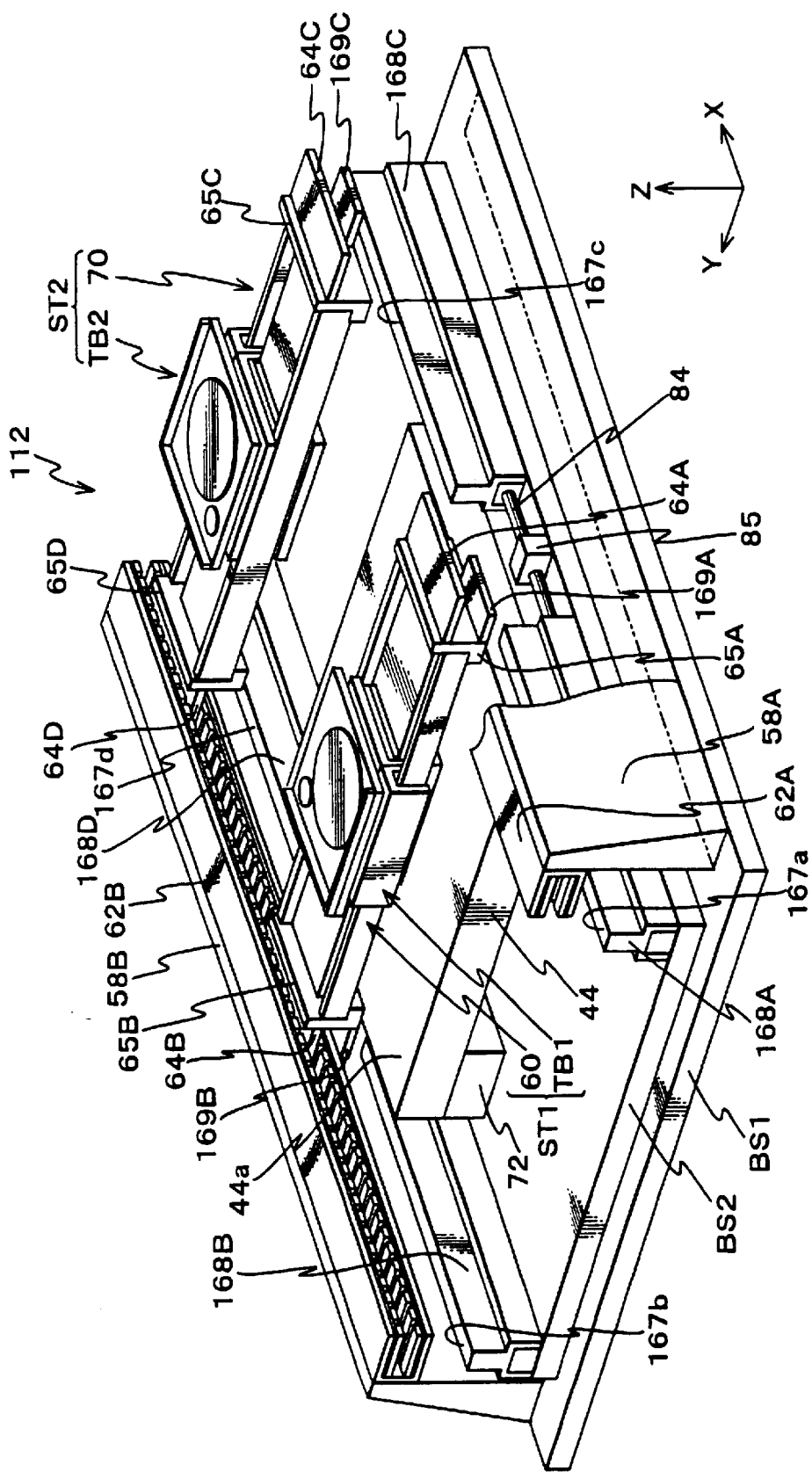
FIG. 15 is a schematic perspective view showing a stage device according to a second embodiment of the invention.

The following explains the second embodiment of this invention with respect to FIGS. 15 and 16. Here, the parts whose structures are the same as or equivalent to the first embodiment are identified by the same symbols, and their explanation is simplified or omitted.

With respect to the exposure apparatus of the second embodiment, compared to the exposure apparatus 10 of the first embodiment, the structure of the stage device is partially different, but other structures are the same. Therefore, the following explains the differences.

FIG. 15 schematically shows a perspective view in which the stage device 112 of the second embodiment is partially cut away. This stage device 112 has a characteristic in which the first and second stages ST1 and ST2 are driven by the same linear motors along the X-axis direction during an exposure operation and wafer replacement·alignment.

As shown in FIG. 15, the stage device 112 is arranged at the center in the X-axis direction on the second base BS2 and is provided with the stage holding plate 44 on which the first movement reference surface 44a is formed over the second base BS2, first and second stages ST1 and ST2, and pairs of guides 168A and 168B and 168C and 168D, which are arranged to extend in the X-axis direction and are located at both ends of the second base BS2 with respect to the Y-axis direction.

As shown in FIG. 15, the guides 168A and 168B have a reversed (upside-down) T-shaped cross-section and extend in the X-axis direction. The second movement reference surfaces 167a and 167b are formed on the upper end surfaces of guides 168A and 168B, and are the reference surfaces that are used when the first stage ST1 is moved during wafer replacement and alignment. The guides 168C and 168D also have a reversed T-shaped cross-section and are arranged right-left symmetrically to the guides 168A and 168B. On the upper surfaces of guides 168C and 168D, second movement reference surfaces 167c and 167d are formed, and are reference surfaces that are used when the second stage ST2 is moved during wafer replacement and alignment. Furthermore, the guides 168A and 168C and the guides 168B and 168D can be minutely driven in the Z-axis direction (upward/downward direction) by the first moving device 99A and the second moving device 99B including a shaft 84, a driving device 85, a movable wedge member, and a fixed wedge member in the same manner as in the first embodiment.

In this embodiment, both ends in the longitudinal direction of the first moving body 60 have movable parts 64A and 64B, which are constituted by an armature unit housing a plurality of armature coils arranged at a predetermined interval in the X-axis direction. In correspondence with these movable parts, stationary parts 62A and 62B are arranged that are structured by magnetic pole units, respectively. Additionally, at both ends in the longitudinal direction of the second moving body 70, movable parts 64C and 64D are respectively arranged, and are structured similar to the armature unit of the stationary parts 64A and 64B.

One stationary part 62A is provided with a stationary yoke extending in the X-axis direction in a U-shaped cross-section and has a plurality of field magnets that are respectively arranged in the upper and lower facing surfaces of the stationary yoke at a predetermined interval in the X-axis direction. This stationary part 62A is supported over the first base BS1 via a frame 58A. In this case, the polarity of adjacent field magnets are opposite to each other, as are the polarities of opposing field magnets. An alternating magnetic field is generated with respect to the X-axis direction in the space inside the stationary yoke. The other stationary part 62B is supported over the first base BS1 via a frame 58B and is right-left symmetrical to the stationary part 62A, but otherwise has the same structure.

Thus, the moving body 60 and the wafer table TB1 are driven in the X-axis direction due to a Lorentz force generated by an electromagnetic interaction between a current passing through the armature coils of the movable parts 64A and 64B and an alternating magnetic field formed in the space inside the stationary parts 62A and 62B. In the same manner, the moving body 70 and the wafer table TB2 are driven in the X-axis direction due to a Lorentz force generated by an electromagnetic interaction between a current passing through the armature coils of the movable parts 64C and 64D and an alternating magnetic field formed in the space inside the stationary parts 62A and 62B. That is, a moving coil type X-axis linear motor that drives the first stage ST1 in the X-axis direction is structured by the stationary parts 62A and 62B and the movable parts 64A and 64B. At the same time, a moving coil type X-axis linear motor that drives the second stage ST2 in the X-axis direction is constituted by the stationary parts 62A and 62B and movable parts 64C and 64D.

Furthermore, as shown in FIG. 15, below the movable parts 64A and 64B on the −X side end portion of the fixing members 65A and 65B, bearing fixing members 169A and 169B are respectively fixed. In the bottom surface of the bearing fixing members 169A and 169B, vacuum preload type gas hydrostatic pressure bearing devices (hereafter referred to as "bearing devices" 73A, 73B) (see FIG. 16A) are respectively fixed that floatingly support the first stage ST1 due to a hydrostatic pressure of the pressurized gas by emitting pressurized gas toward the second movement reference surfaces 167a and 167b respectively formed on the upper surface of the guides 168A and 168B.

In the same manner, below the movable parts 64A and 64B on the +X side end portion of the fixing members 65C and 65D, the bearing fixing members 169C and 169D are respectively fixed. In the bottom surface of the bearing fixing members 169C and 169D, vacuum preload type gas hydrostatic pressure bearing devices (hereafter referred to as "bearing devices 73C and 73D") are respectively fixed that floatingly support the second stage ST2 by a hydrostatic pressure of the pressurized gas by emitting pressurized gas toward the second movement reference surfaces 167c and 167d respectively formed on the upper surface of the guides 168C and 168D.

The other structure of the stage device 112 is the same as the stage device 12 in the first embodiment.

In the exposure apparatus of this second embodiment, in the same manner as in the first embodiment, when exposure is completed with respect to a wafer on one wafer table, the wafer table moves to an area for wafer replacement and an area for alignment operation with respect to a new wafer after wafer replacement, and the other wafer table moves to an area for exposure operation from an alignment operation area. During this time, switching of the movement reference surface, which becomes a reference during the movement of the respective stages, is performed.

Figure 16A:
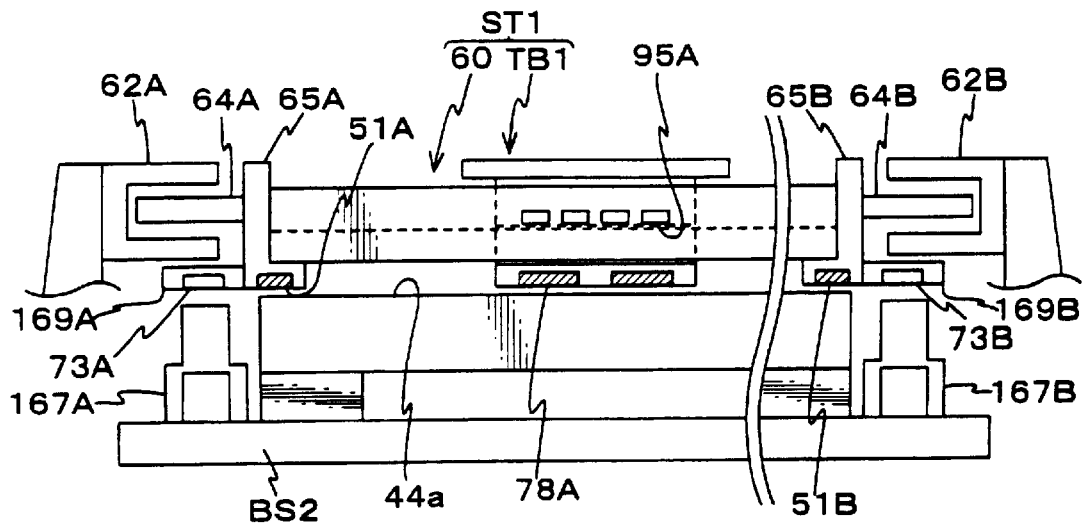
FIGS. 16A–C are diagrams explaining switching of movement reference surfaces in a device of the second embodiment.
Figure 16B:
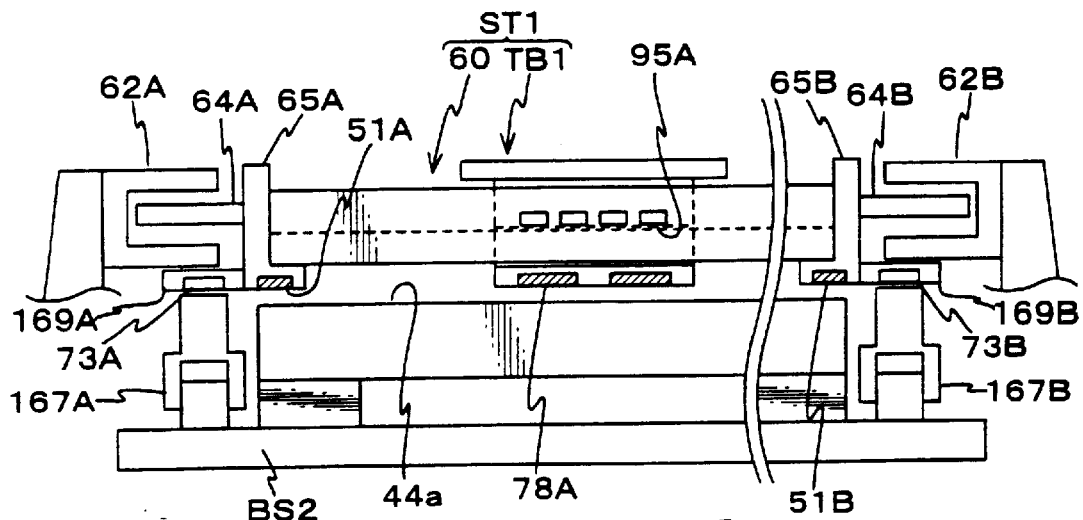
Figure 16C:
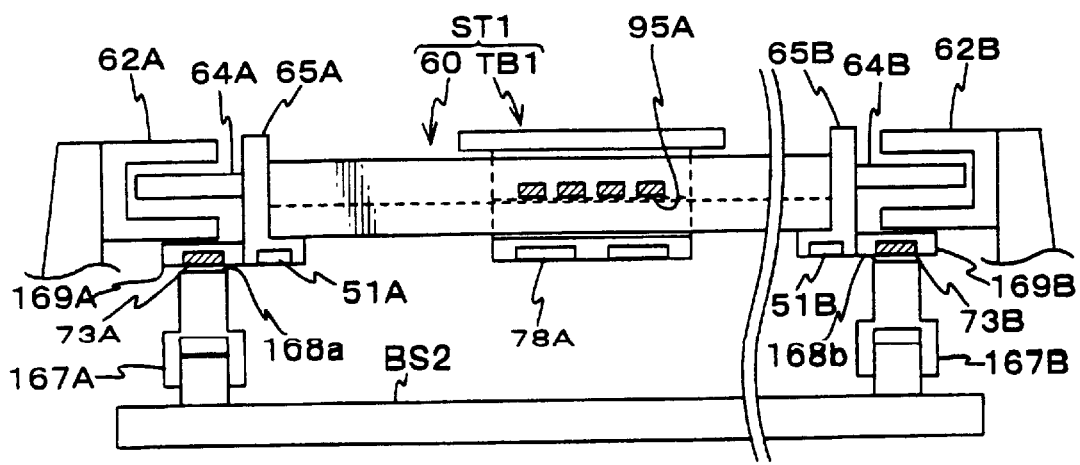

The following briefly explains switching of the movement reference surface with respect to FIGS. 16A–C. Furthermore, the bearing devices with diagonal lines (hatching) in these figures show bearing devices used at that point.

FIG. 16A schematically shows a diagram of a state in which one wafer table TB1 in which an exposure operation (exposure sequence) has been completed is located over the stage holding plate 44. In the state when exposure is completed as shown in FIG. 16A, the first stage ST1 can be driven in the X-axis direction while using the first movement reference surface 44a on the stage holding plate 44 as a reference. At this time, in the same case as in the first embodiment, the wafer table TB1 is floatingly supported with a predetermined clearance over the first movement reference surface 44a via the bearing device 78A arranged in the bottom surface of the wafer table TB1.

Additionally, in the state of FIG. 16A, the first moving body 60 is floatingly supported over the first movement reference surface 44a in the same manner as the wafer table TB1 via the bearing devices 51A and 51B arranged in the bottom surface of the fixing members 65A and 65B in the vicinity of both end portions.

According to the stage of FIG. 16A, the first stage ST1 moves in the −X direction (out of the paper plane in FIG. 16A) toward the left-side loading position in the same case as in the first embodiment in order to carry out wafer replacement and an alignment sequence with respect to a new wafer after replacement. Midway during this movement, switching of the movement reference surface occurs during the movement of the first stage ST1.

The switching operation is performed by the stage controller 38 under instructions of the main controller 16. First, in the stage controller 38, before the first stage ST1 reaches a predetermined reference surface switching position, an operation is performed to increase a floating force by making a vacuum preload force of the bearing devices 78A, 51A and 51B zero so as to further float the wafer table TB1 and the first moving body 60 from the position of FIG. 16A in an upper direction.

According to the above-described operation, the wafer table TB1 and the first moving body 60, i.e., the first stage ST1 begins to float higher (moves in the +Z direction), and by monitoring the gap sensors GS1 and GS2, a pressure of pressurized gas of the bearing device or the like is controlled so that the clearance becomes a desired value.

Subsequently, in the stage controller 38, the guides 168A and 168B are driven in an upper direction (+Z direction) in the same manner as in the first embodiment. The guides 168A and 168B are lifted by a predetermined amount. The driving is suspended when an interval between the second movement reference surfaces 167a and 167b facing the bearing surface of the bearing devices 73A and 73B becomes a desired interval. FIG. 16B shows this state.

Next, in the stage controller 38, emission of pressurized gas with respect to the stage holding plate 44 of the bearing devices 78A, 51A, and 51B is suspended. At the same time, in the stage controller 38, vacuum absorption and emission of pressurized gas from the bearing device 95A begins, and a pressure within the space between the stationary part 61A and the bearing surface of the bearing device 95A is set at a predetermined value. At the same time, vacuum absorption and emission of pressurized gas from the bearing devices 73A and 73B begins, and a pressure within the space between the second movement reference surfaces 167a and 167b and the bearing surface of the bearing devices 73A and 73B is set at a predetermined value.

Therefore, as shown in FIG. 16C, the first stage ST1 is floatingly supported via a predetermined clearance over the second movement reference surfaces 167a and 167b and can be driven in the X-axis direction by using the second movement reference surfaces 167a and 167b as a reference.

According to the above-mentioned operation, switching of the movement reference surface of the first stage ST1 is completed. Then, the first stage ST1 can be driven toward the left-side loading position explained in the first embodiment.

Meanwhile, while the first stage ST1 moves to the reference surface switching position from the exposure completion position as described above and switching of the reference surface is performed, the following operation is performed in the second stage ST2 side.

That is, when exposure is completed in the wafer table TB1 side, the second stage ST2 waits at a predetermined waiting position (position in the vicinity of the reference surface switching position in the vicinity of the −X side end portion of the guides 168C and 168D and in the vicinity of the +X side end portion of the stage holding plate 44) when alignment with respect to the wafer W2 on the wafer table TB2 is completed. At this time, the second stage ST2 is floatingly supported by the bearing devices 73C and 73D over the second movement reference surfaces 167c and 167d of the upper end surface of the guides 168C and 168D and can be driven in the X-axis direction.

Furthermore, the second stage ST2 moves to the reference surface switching position in order to carry out an exposure sequence of the wafer W2. Furthermore, when the second stage ST2 reaches the reference surface switching position, the following shows switching of the movement reference surface during the movement of the second stage ST2.

When the second stage ST2 reaches the reference surface switching position, the wafer table TB2 and the second moving body 70 are located over the stage holding plate 44. Then, in the stage controller 38, emission of pressurized gas from the bearing devices 78B, 51C, and 51D respectively begins. At the same time, in the stage controller 38, vacuum absorption and emission of pressurized gas from the bearing device 95B arranged in the space between the field magnets 79 of the wafer table TB2 is suspended. At the same time, vacuum absorption and emission of pressurized gas from the bearing devices 73C and 73D is suspended.

Subsequently, in the stage controller 38, the guides 168C and 168D are driven in a downward direction (−Z direction) by a predetermined amount in the same manner as in the first embodiment. Thus, a predetermined clearance is generated between the upper end surface of the guides 168C and 168D and the bottom surface of the bearing fixing members 169C and 169D. However, at this point, the wafer table TB2 and the second moving body 70 are floatingly supported over the first movement reference surface 44a on the stage holding plate 44, so no problem is caused.

Thus, the movement reference surface is switched from the second movement reference surface to the first movement reference surface during the movement of the second stage ST2. Hereafter, the second stage ST2 can be driven in the X-axis direction by using the first movement reference surface 44a as a reference.

Then, the second stage ST2 moves in the −X direction toward the reference position for use during exposure explained in the first embodiment in order to expose the wafer W2 on the wafer table TB2. Before the second stage ST2 reaches the reference position during exposure, in the stage controller 38, vacuum absorption by the bearing device arranged in the bottom surface of the fixing members 65C and 65D and the bearing device arranged in the bottom surface of the wafer table TB2 begins, and a pressure within the space of the respective bearing devices can be adjusted.

After wafer replacement and alignment sequence of the first stage ST1 is completed, when the first stage ST1 moves to the exposure sequence, switching of the movement reference surface is performed in the same case as for the second stage. Furthermore, after the exposure sequence of the wafer W2 is completed, when it moves to the wafer replacement·alignment sequence, switching of the movement reference surface of the second stage is performed in the same case as for the first stage.

In this embodiment, lifting of the guide 68A and lowering of the guide 68C, lifting of the guide 68B and lowering of the guide 68D is simultaneously performed, respectively, so it is preferable that switching of the movement reference surface of the first stage ST1 and switching of the movement reference surface of the second stage ST2 is simultaneously performed.

Additionally, in the case of switching the movement reference surface, in the same manner as in the first embodiment, the Z direction position of the stage changes. However, the changing amount is approximately several 10 μm as described earlier, so driving in the X-axis direction during exposure and during wafer replacement·alignment can be sufficiently performed by the same X-axis linear motor.

As explained above, according to the exposure apparatus and the stage device 112 of the second embodiment, the same effect can be obtained as in the first embodiment. In addition, the first and second stages ST1 and ST2 are driven by the same X-axis linear motor during exposure and during wafer replacement and alignment, so the structure of the driving system of the respective first and second stages ST1 and ST2 can be simplified. However, the linear motor driving the first stage ST1 in the X-axis direction and the linear motor driving the second stage ST2 in the X-axis direction use the same stationary parts 62A and 62B, so there is a possibility that driving of one stage in the X-axis direction may cause vibration that affects the driving of the other stage. Thus, the structure that divides the stationary parts 62A and 62B at an appropriate location can also be used in order to avoid the above-described possibility.

Furthermore, in the first and second embodiments, the first movement reference surface which becomes a reference of movement during exposure of the first and second stages ST1 and ST2 is formed on the holding plate 44, and the second movement reference surface which becomes a reference of movement during wafer replacement and alignment is formed in a pair of guides. However, this invention is not limited to this particular arrangement. Furthermore, the invention is not limited to the particular structure of the first and second stages described herein.

The movement reference surface 44a within the specified region (e.g., moving region during exposure) of both stages can be formed in the stage holding plate 44, and the movement reference surface outside the specified region of both stages can be formed in the same holding plate that is different from the stage holding plate 44. In addition, the two stages can alternately communicate over the respective holding plates. Thus, compared to the case when the entire movement reference surface is formed in one stage holding plate, processing difficulty can be overcome. At the same time, vibration when one stage is driven is not transmitted to the other stage via the reference member on which the movement reference surface is formed. Because of this, regardless of the specified region and outside the specified region, stability and controlling the position of the respective stages can be suitably obtained.

Alternatively, three stage holding plates can be prepared as reference members and aligned along, for example, a non-scanning direction. The movement reference surface within the specified region of both stages can be formed on the top surface of the stage holding plate at the center, and the movement reference surface outside the specified region of the stages can be formed on the top surface of the stage holding plates located on both ends. In this case, a specified region can be considered as a stage moving region during exposure, and at least part of the outside specified region can be considered as a moving region during alignment and wafer replacement of the respective stages. Even with this arrangement, an area of the respective stage holding plates is not enlarged very much, so the surface with high accuracy can be relatively easily finished. Regardless of the specified region and outside specified region, stability and controllability of the position of the respective stages can be suitably obtained.

Alternatively, a first stage holding plate having a large area with a relatively long length and a second stage holding plate whose length and area are substantially half that of the first stage holding plate can be prepared and are aligned in the longitudinal direction of the first stage holding plate. The movement reference surface within the specified region of both stages is formed in one half of the first stage holding plate, and the movement reference surface outside the specified region of the specified stage can be formed on the top surface of the second stage holding plate. In this case, the movement reference surface outside the specified region of the remaining stage can be formed in the remaining half of the first stage holding plate. Even with this arrangement, compared to the case when the movement reference surface in an entire moving range of the two stages is formed in one holding plate, processing difficulty of a holding plate can be improved. Of course, instead of the second stage holding plate, a pair of guides can also be arranged.

Additionally, in the same manner as the first embodiment, a driving device driving the specified stage can also be provided with a first actuator for driving in a specified region and a second actuator for driving outside the specified region. In this case, vibration when the specified stage moves over the movement reference surface on the second moving member as a reference can be prevented from being transmitted to the other stage which moves over the movement reference surface formed in the first reference member as a reference. At the same time, vibration also can be prevented from being transmitted via a driving device.

Furthermore, in the above embodiment, the case when a switching device is structured including the first and second moving devices driving the second reference member in an upward/downward direction is explained, but this invention is not limited to this construction. Instead of the first and second moving devices, a moving device driving the stage holding plate 44 in an upward/downward direction or a moving device driving both the first and second reference members in an upward/downward direction can also be used.

[Third Embodiment]

Next, a third embodiment of this invention is explained with reference to FIG. 17. Here, the same structure as in the first and second embodiments is identified by the same symbols, and their explanation is simplified or omitted.

In an exposure apparatus of the third embodiment, in the same manner as in the second embodiment, only the structure of the stage device as a wafer driving device is different from the exposure apparatus 10 of the first embodiment, but the other structure is the same.

Figure 17:
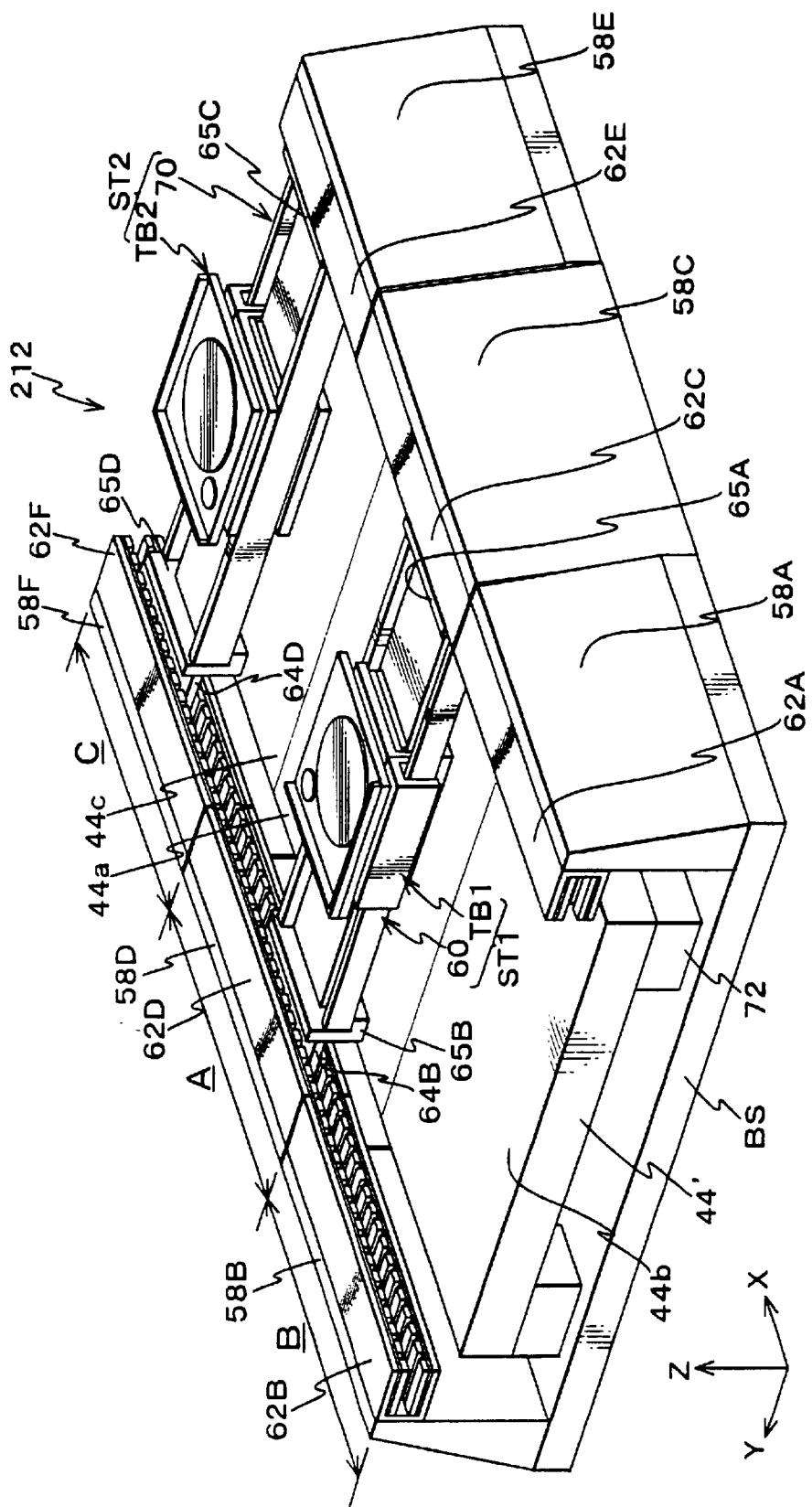
FIG. 17 is a schematic perspective view showing a stage device according to a third embodiment of the invention.

FIG. 17 shows a perspective view of a stage device 212 of the exposure apparatus of the third embodiment. This stage device 212 is provided with a stage holding plate 44' as a stage base supported over the base BS via a vibration control device 72, three pairs of stationary parts 62A, 62B, 62C, 62D, 62E, and 62F that are respectively supported by a pair of frames 58A, 58B, 58C, 58D, 58E, and 58F at a predetermined height over the base BS, a first stage ST1 that moves along two pairs of the stationary parts 62A–62D on the −X side, and a second stage ST2 that moves along two pairs of the stationary parts 62C–62F.

As shown in FIG. 17, the stage device 212 is divided into an A region, which is a specified region in which exposure is performed with respect to the wafer on the wafer tables TB1 and TB2, a B region, which is outside the specified region and is a region in which wafer replacement and alignment is performed on the wafer table TB1, and a C region which is outside the specified region and is a region in which wafer replacement and alignment is performed on the wafer table TB2.

The base BS has a substantially rectangular shape as seen from a plan view and forms convex portions in part of the vicinity of the center of both ends in the Y-axis direction. As seen from the top, frames 58C and 58D are engaged to these convex portions, respectively. These frames 58C and 58D are arranged in the bottom surface of the chamber 42.

The stage holding plate 44' has a rectangular shape as seen from a plan view that is half smaller than (i.e., 50% of) the base BS and is horizontally supported over the base BS via the vibration control device 72. The top surface of the stage holding plate 44' is divided into three divisions corresponding to the A–C regions. Furthermore, in detail, at the center in the X-axis direction of the stage holding plate 44', a first movement reference surface 44a is formed in correspondence to the A region, and a second movement reference surface 44b and a third movement reference surface 44c are respectively formed in correspondence to the respective B and C regions on both sides in the X-axis direction. In this case, the surface accuracy of the first movement reference surface 44a is processed with high accuracy, and the surface accuracy of the second movement reference surface 44b and the third movement reference surface 44c is slightly more roughly processed than the surface accuracy of the first movement reference surface 44a.

The main reason why the difference of the surface accuracy is arranged for the respective movement reference surface is that there is a difference between the required positional stability and positional controllability required for a stage for exposure versus for replacement·alignment. While controlling (including stability) the position of a stage with high accuracy is required during exposure, controlling (including stability) the position of a stage need not be as precise during wafer replacement and alignment. In this case, as the surface accuracy of the second and third movement reference surfaces 44b and 44c can be made more rough, the processing of them can be simplified, and as a result, the stage holding plate 44' itself can be more easily manufactured.

The stationary parts 62A–62F are respectively constituted by magnet pole units having a plurality of field magnets generating an alternating magnet field inside the space with respect to the X-axis direction. In correspondence to this, as movable parts 64A and 64B (however, in FIG. 17, the movable part 64A of the −Y side is hidden in the stationary part 62C) arranged in both ends in the longitudinal direction of the moving body 60 and movable parts 64C and 64D (however, in FIG. 17, the movable part 64C of the −Y side is hidden in the stationary part 62E) arranged in both ends in the longitudinal direction of the moving body 70, an armature unit is used in which a plurality of undepicted armature coils are arranged at a predetermined interval in the X-axis direction.

In this embodiment, a first X-axis linear motor, functioning as a first actuator that drives the first stage ST1 in the X-axis direction within the A region, is constituted by the movable parts 64A and 64B and the stationary parts 62C and 62D. A second X-axis linear motor, functioning as a second actuator that drives the second stage ST2 in the X-axis direction within the A region, is constituted by the movable parts 64C and 64D and the stationary parts 62C and 62D.

Additionally, a third X-axis linear motor, functioning as a third actuator driving the first stage ST1 within the B region in the X-axis direction, is constituted by the movable parts 64A and 64B and the stationary parts 62A and 62B. A fourth X-axis linear motor, functioning as a fourth actuator driving the second stage ST2 within the C region in the X-axis direction, is constituted by the movable parts 64C and 64D and the stationary parts 62E and 62F.

In this case, the first and third X-axis linear motors use the same movable parts 62A and 62B, but use different stationary parts. The second and fourth X-axis linear motors use the same movable parts 62C and 62D, but use different stationary parts. Furthermore, the first and second X-axis linear motors use the same stationary parts 62C and 62D, but use different movable parts.

In the same manner as in the first and second embodiments, the first and second stages ST1 and ST2 are non-contactingly supported over the stage holding plate 44' by undepicted bearing devices arranged at the same locations. The first and second stages ST1 and ST2 do not require the bearing device 73A and 73B and the bearing devices 73C and 73D.

Furthermore, in this embodiment, the stage controller 38 adjusts a balance between a vacuum preload force and a hydrostatic pressure of pressurized gas of the bearing devices 51A, 51B, and 78A so that a clearance of the bearing surfaces of the bearing devices 51A, 51B, and 78A with respect to the movement reference surface becomes large, compared to the case when the first stage ST1 is driven over the first movement reference surface 44a, when the first stage ST1 is driven over the second movement reference surface 44b. In the same manner, when the second stage ST2 is driven over the third movement reference surface 44c, the stage controller 38 adjusts a balance between a vacuum preload force and a hydrostatic force of pressurized gas of the bearing devices 51C, 51D, and 78B so that a clearance of a bearing surface of the bearing devices 51C, 51D, and 78B with respect to the movement reference surface becomes large, compared to the case when the second stage ST2 is driven over the first movement reference surface 44a.

The structure of the stage device, the exposure apparatus, and the like is the same as in the first and second embodiments.

According to the exposure apparatus and the stage device 212, which were thus structured in the third embodiment, the desired positional controllability required for both stages can be maintained in the A region in which controlling (including stability) of the position of a stage with high accuracy is required, and in the B and C regions in which controlling (including stability) the position of a stage with high accuracy need not be as precise.

Furthermore, the surface accuracy of only the first movement reference surface 44a among the respective first, second, and third movement reference surfaces 44a, 44b, and 44c in the stage holding plate 44' can be made high, so even if the movement reference surface which becomes a reference when the first and second stages ST1 and ST2 are moved is formed in one stage holding plate 44', the reference surface of the stage holding plate 44' can be more easily processed.

Furthermore, the stage controller 38 controls the bearing devices 51C, 51D and 78B and the bearing devices 51A, 51B, and 78A so that a clearance between the first movement reference surface 44a and the first and second stages ST1 and ST2 become small when the first and second stages ST1 and ST2 move in the specified region (A region). Therefore, controlling the position of the stages ST1 and ST2 can be improved when they move in the A region.

On the contrary, the stage controller 38 controls the bearing devices 51C, 51D, and 78B and the bearing devices 51A, 51B, and 78A so that a clearance between the respective second and third movement reference surfaces 44b and 44c and the first and second stages ST1 and ST2 becomes larger when the first and second stages ST1 and ST2 move outside the specified region (i.e., into the B and C regions). Therefore, the first and second stages ST1 and ST2 can be prevented from contacting the movement reference surfaces 44b and 44c, which have a lower surface accuracy. That is, in this embodiment, a clearance change device which changes the clearance of the first stage and the movement reference surface is constituted by the stage controller 38 and the bearing devices 51A, 51B, and 78A, and a clearance change device that changes a clearance of the second stage and the movement reference surface is constituted by the stage controller 38 and the bearing devices 51C, 51D, and 78B.

Furthermore, when the first stage ST1 is driven by the first X-axis linear motor along the first movement reference surface 44a, the second stage ST2 is driven by the fourth X-axis linear motor along the third movement reference surface 44c. When the second stage ST2 is driven by the second X-axis linear motor along the first movement reference surface 44a, the first stage ST1 is driven by the third X-axis linear motor along the second movement reference surface 44b. Thus, vibration when one stage moves is not transmitted to the other stage via actuators, so controlling the position of both stages can be further improved.

In this stage device 212, even though there are four X-axis linear motors, three pairs of stationary parts and two pairs of movable parts are sufficient, so the entire stage device can be made more light-weight. The invention is not limited to this construction; rather, the first, second, third and fourth actuators can be individually arranged. In this case, vibration when one stage moves is not transmitted to the other stage via actuators, so controlling the position of both stages can be further improved.

In the third embodiment, a pair of stationary parts 62C and 62D positioned at the center in the X-axis direction and frames 58C and 58D supporting the stationary parts 62C and 62D are arranged independently from the other stationary parts 62A, 62B, 62E, and 62F and frames 58A, 58B, 58E, and 58F. Therefore, even if exposure and wafer replacement·alignment are simultaneously performed on two wafer tables, vibration of one stage is not transmitted to the other stage via the stationary parts of the linear motors, so highly precise controlling the position of the respective stages can be maintained.

This invention can be applied to a stage device having a single stage. In this case as well, a first state in which a stage can move along a first movement reference surface can be easily be switched to a second state in which a stage can move along a second movement reference surface in the same manner as in the first and second embodiments. In this case as well, there will be no problem with stage movement even if a first reference member on which a first movement reference surface is formed is physically distant from a second reference member on which a second movement reference surface is formed. Because of this, compared to a case when first and second movement reference surfaces are formed on a common (single) reference member, an area of the reference surface of the respective reference members can be made smaller. Thus, for example, when a holding plate is used as first and second reference members, the respective reference surfaces can be processed with high accuracy. Thus, processing difficulty of the reference surface can be overcome. At the same time, stage stability in the case of movement by using the first and second reference surfaces as references can be suitably obtained. In addition, positional controllability can also be maintained.

In this case as well, a first reference member on which a first reference surface is formed whose stage positional controllability with high accuracy is required is constituted by a holding plate, and a second reference member on which a second movement reference surface is formed whose stage positional controllability with as high of an accuracy is not required is constituted by a pair of guides. Thus, a holding plate can be made smaller, and its processing can be simplified. Of course, controlling the position of stages with high accuracy, which is required, can be constantly satisfied, and at the same time, the entire stage device can be made more light-weight, compared to a case when both movement reference surfaces are formed on a single holding plate.

The stage device of this invention can also be used as a reticle (mask) driving device. In this case as well, the same effects can be obtained as when the invention is applied to a wafer driving device.

The stage device of this invention can also be applied to a stationary type exposure apparatus such as a stepper in which exposure is performed in a state in which a mask and a substrate are maintained in a stationary state. Even in this embodiment, controlling the position of a substrate stage holding a substrate can be improved by a stage device, so positioning the substrate with high accuracy held by a stage can be improved, positioning adjusting time can be shortened, and exposure accuracy and throughput can be improved.

The stage device of this invention also can be applied to a proximity exposure apparatus that transfers a pattern of a mask onto a substrate by contacting the mask with the substrate without using a projection optical system therebetween.

The invention is also applicable not only to an exposure apparatus for use in fabrication of semiconductor devices, but also to an exposure apparatus that transfers a device pattern onto a glass plate so as to produce displays, such as liquid crystal displays and plasma displays, an exposure apparatus that transfers a device pattern onto a ceramic wafer so as to produce thin-film magnetic heads, and an exposure apparatus for use in producing image pickup devices, such as CCDs, and micromachines.

The invention is also applicable not only to microdevices such as semiconductor devices, but also to an exposure apparatus that transfers a circuit pattern onto a glass substrate, a silicon wafer, and the like in order to manufacture a reticle or a mask for use in an optical exposure apparatus, an EUV (Extreme Ultraviolet) exposure apparatus, an X-ray exposure apparatus, an electron beam exposure apparatus, and the like. In an exposure apparatus using DUV (Deep Ultraviolet) light, VUV (Vacuum Ultraviolet) light, and the like, a transmissive reticle is generally used, and a reticle substrate is made of quartz glass, quartz glass doped with fluorine, fluorite, magnesium fluoride, or quartz crystal. In the proximity exposure apparatus or the electron beam exposure apparatus, a transmissive mask (a stencil mask or a membrane mask) is used. In the EUV exposure apparatus, a reflective mask is used, and a silicon wafer or the like is used as a mask substrate.

The stage device used in the exposure apparatus of the invention is also widely applicable to other substrate processing apparatus (for example, a laser repair apparatus or a substrate inspection apparatus) and a sample positioning device in other precision machines.

Furthermore, while the projection optical system is of a reduction type in the above embodiments, it may be of a 1× (unity) magnification type or of a magnification type.

The exposure apparatus of the invention may employ not only the projection optical system, but also a charged particle beam optical system, such as an X-ray optical system or an electron optical system. For example, in the case of using an electron optical system, the electron optical system includes an electron lens and a polarizer, and thermoelectron-emitting lanthanum hexaborite ($LaB_6$) or tantalum (Ta) is used as an electron gun. Of course, the optical path through which an electron beam passes is placed in a vacuum.

In addition, when this invention is applied to the exposure apparatus using an electron optical system, a structure using a mask can be used, and a structure on which a pattern is formed on a substrate by direct drawing due to an electron beam without using a mask. That is, this invention can be applied to any of a pencil beam method, a variable formation beam-type electron optical system, a cell projection-type electron optical system, a blanking aperture array type of EBDW (EB direct-writing type), and an EBPS (EB projection system).

Furthermore, in the exposure apparatus of this invention, as an exposure illumination light beam, in addition to the far ultraviolet and vacuum ultraviolet regions, a wavelength range of approximately 5–30 nm of EUV light in a soft X ray region can also be used. In addition, for example, an ArF excimer laser light beam, an $F_2$ laser light beam, or the like can be used as vacuum ultraviolet light. Alternatively, a harmonic wave may be used which is obtained by amplifying single-wavelength laser light in an infrared region or a visible region emitted from a DFB semiconductor laser or a fiber laser by, for example, a fiber amplifier doped with erbium (or both erbium and ytterbium) and wavelength-converting the laser light into ultraviolet light by using nonlinear optical crystal.

Method of Manufacturing a Device

The following explains embodiments of a method of manufacturing a device that uses the exposure apparatus and the exposure method in a lithography process.

Figure 18:
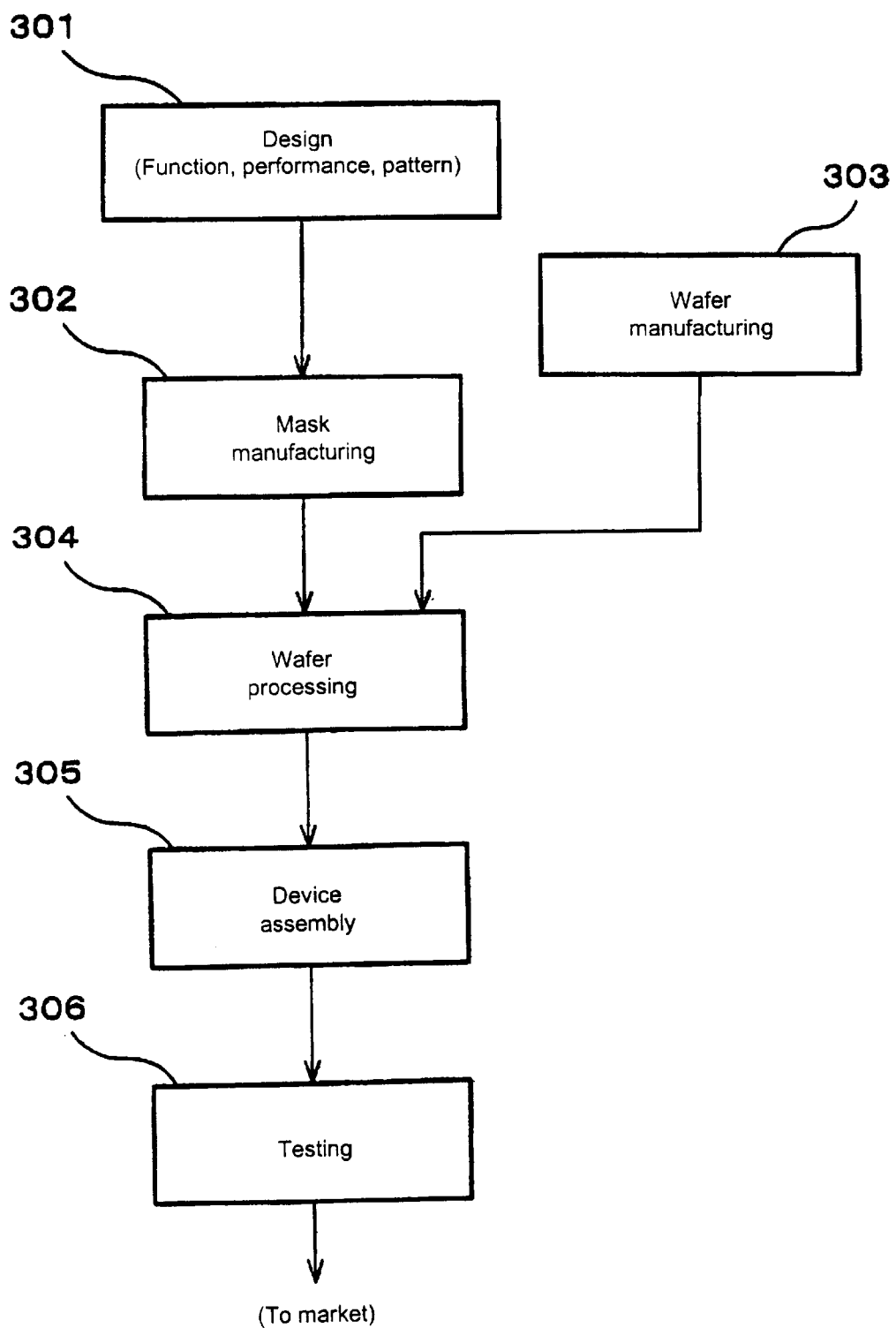
FIG. 18 is a flowchart explaining an embodiment of a method of manufacturing a device according to this invention.

FIG. 18 shows a flowchart of a process for manufacturing a device (e.g., a semiconductor chip such as an IC or an LSI, a liquid crystal panel, a CCD, a thin film magnetic head, a micromachine, or the like). As shown in FIG. 18, first, in step 301 (design step), functional design of a device (for example, a circuit design of a semiconductor device or the like) is performed, and pattern designing is performed to realize the function. Subsequently, in step 302 (mask manufacturing step), a mask is manufactured on which is formed a circuit pattern that has been designed. Meanwhile, in step 303 (wafer manufacturing step), a wafer is manufactured by using a material such as silicon.

Next, in step 304 (wafer processing step), using the wafer and the mask that have been prepared in steps 301–303, as discussed later, an actual circuit or the like is formed on the wafer by a lithographic technique. Next, in step 305 (device assembly step), using the wafer that has been processed in step 304, a device is assembled. In this step 305, processing such as assembly processing (dicing and bonding) and packaging processing (chip packaging) can be performed as needed.

Finally, in step 306 (testing step), an operation confirmation test, resistance test, and/or the like is performed for the device that has been manufactured in step 305. After the process, this device is completed and can be sent to the market.

Figure 19:
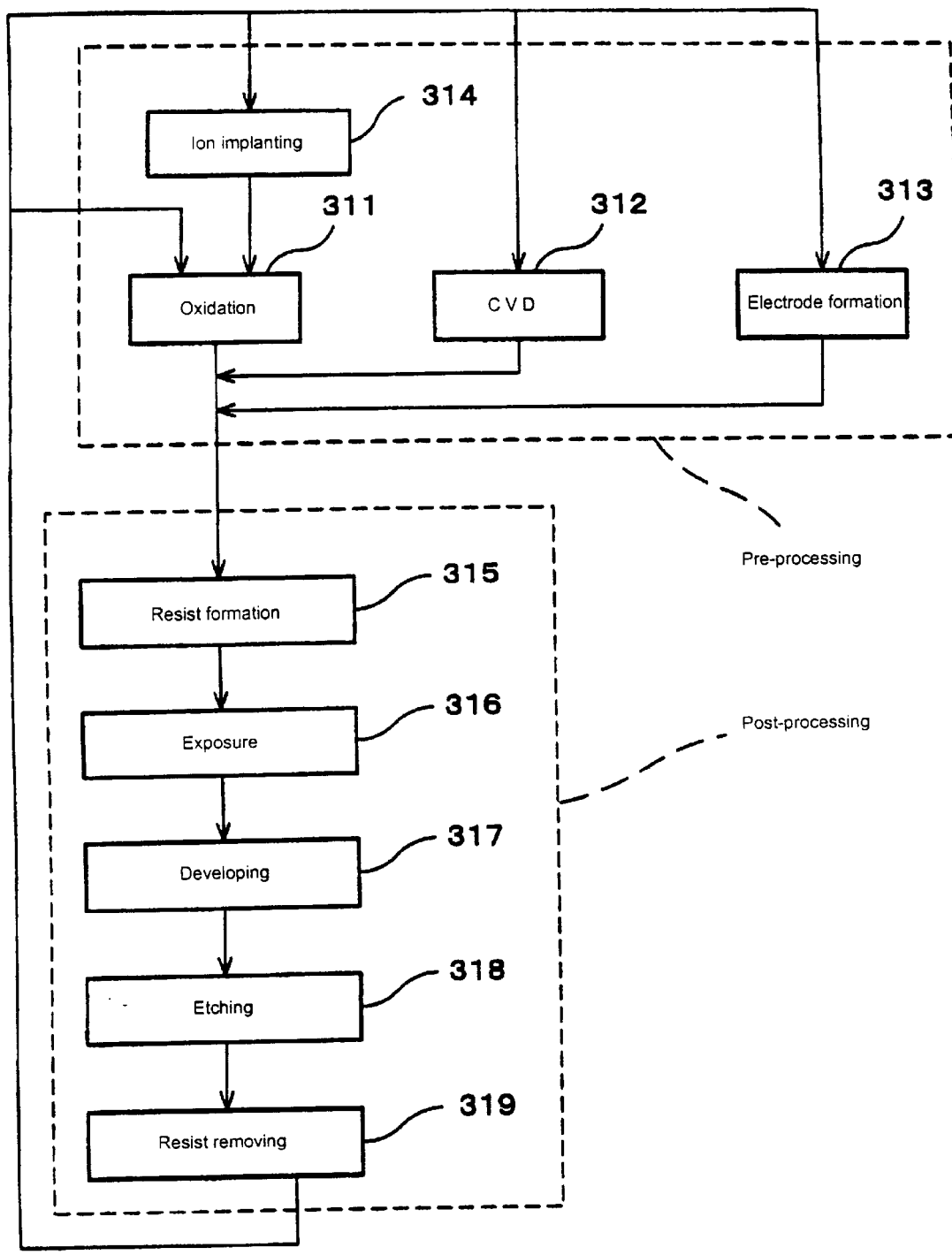
FIG. 19 is a flowchart showing processes performed in step 304 of FIG. 18.

FIG. 19 shows a detailed flowchart of the above-mentioned step 304 in the case of manufacturing a semiconductor device. In FIG. 19, the surface of the wafer is oxidized in step 311 (oxidation step). In step 312 (CVD step), an insulating film is formed on the wafer surface. In step 313 (electrode formation step), an electrode is formed by deposition on the wafer. In step 314 (ion embedding or implanting step), ions are embedded in the wafer. The respective steps 311 through 314 each form a pre-processing step of the wafer process, and are selected and performed according to the necessary processing.

In each step of the wafer process, when the pre-processing is completed, the following post-processing is performed. In the post-processing, first in step 315 (resist formation step), a sensitive material is coated on the wafer, and in the following step 316 (exposure step), the circuit pattern of the mask is exposed onto the wafer by the exposure apparatus and the exposure method described above. Next, in step 317 (development step), the exposed wafer is developed, and in step 318 (etching step), the parts of the exposed member other than the parts where resist still remains are removed by etching. Then, in step 319 (resist removal step), the resist for that etching is completed, and that which is no longer needed is removed.

As the pre-processing and post-processing are repeated, many layers of circuit patterns are formed on the wafer.

If the method of manufacturing a device of this embodiment explained above is used, the exposure apparatus of the respective embodiments is used in the exposure step (step 316). Therefore, productivity of a device with high integration can be improved as exposure accuracy is improved by controlling the position of a stage, and throughput can be improved by a simultaneous parallel process. Furthermore, exposure is performed by using an vacuum-ultraviolet exposure illumination light beam with a high resolution, and therefore productivity of a microdevice with high integration can also be improved for this purpose.

While the invention has been described with reference to preferred embodiments thereof, it is to be understood that the invention is not limited to the preferred embodiments or constructions. To the contrary, the invention is intended to cover various modifications and equivalent arrangements. In addition, while the various elements of the preferred embodiments are shown in various combinations and configurations, which are exemplary, other combinations and configurations, including more, less or only a single element, are also within the spirit and scope of the invention.

What is claimed is:

1. A stage device comprising:
   a movable stage to hold an object;
   a first reference member having a first movement reference surface that movably supports the movable stage and is used as a reference when the movable stage moves;
   a second reference member having a second movement reference surface, different from the first movement reference surface; and
   a switching device that switches between a first state in which the stage can move along the first movement reference surface, and a second state in which the stage can move along the second movement reference surface.

2. The stage device of claim 1, wherein the first reference member is a holding plate and the second reference member is a pair of guides.

3. The stage device of claim 1, wherein the switching device includes an actuator that moves at least one of the first and second reference members in a direction perpendicular to a direction in which the first and second movement reference surfaces extend.

4. The stage device of claim 1, wherein the switching device includes an actuator that moves at least one of the first and second reference members in a direction perpendicular to a direction in which the first and second movement reference surfaces extend, and a driver that drives the movable stage along the first and second movement reference surfaces.

5. The stage device of claim 4, wherein the actuator includes at least one of a mechanical actuator, an electromagnetic actuator, an actuator that converts electrical power to mechanical power, and an actuator using a vacuum.

6. The stage device of claim 1, wherein the switching device switches between the first state in which the movable stage is supported over the first reference member due to a balance of a vacuum preload force and a hydrostatic pressure of pressurized gas between the movable stage and the first reference member, and the second state in which the movable stage is supported over the second reference member due to a balance of a vacuum preload force and a hydrostatic pressure of pressurized gas between the movable stage and the second reference member.

7. The stage device of claim 1, wherein a roughness of the second movement reference surface is greater than a roughness of the first movement reference surface.

8. The stage device of claim 1, wherein the first reference member is located in a first region, the second reference member is located in a second region that partially overlaps the first region, and the movable stage is movable within the first and second regions such that when the movable stage is in the first state and is located in one part of the first region, the movable stage is only supported with respect to the first movement reference surface, and when the movable stage is in the second state and is located in one part of the second region, the movable stage is only supported with respect to the second movement reference surface.

9. An exposure apparatus that exposes a substrate with an energy beam to transfer a predetermined pattern onto the substrate, the exposure apparatus comprising:
   the stage device of claim 1, the substrate is the object held by the movable stage;
   wherein the first reference member is located in a region where the substrate moves during exposure of the substrate, and at least a part of the second reference member is located in a region where at least one of alignment of the substrate and substrate replacement is performed with respect to the movable stage.

10. A method of manufacturing a device including a lithography process that performs exposure using the exposure apparatus of claim 9.

11. The stage device of claim 1, further comprising:
    a first driver that moves the movable stage along the first movement reference surface; and
    a second driver that is different from the first driver to move the movable stage along the second movement reference surface.

12. A stage device comprising:
    a first stage that moves within a first region that includes a specified region;
    a second stage that moves within a second region that includes the specified region;
    a first reference member having a first movement reference surface located in the specified region, the first movement reference surface used as a reference surface by the first and second stages when the first and second stages are located in the specified region;
    at least one second reference member having a second movement reference surface located outside of the specified region, the second movement reference surface used as a reference surface by a specified stage, the specified stage being at least one stage of the first and second stages; and
    a switching device that switches between a first state in which the specified stage can move along the first movement reference surface in the specified region, and a second state in which the specified stage can move along the second movement reference surface outside of the specified region.

13. The stage device of claim 12, wherein two of the second reference members are arranged, respectively corresponding to the first and second stages.

14. The stage device of claim 12, wherein the first reference member is a holding plate and the second reference member is a pair of guides.

15. The stage device of claim 12, wherein the switching device includes an actuator that moves at least one of the first and second reference members in a direction perpendicular to a direction in which the first and second movement reference surfaces extend.

16. The stage device of claim 12, wherein the switching device includes an actuator that moves at least one of the first and second reference members in a direction perpendicular to a direction in which the first and second movement reference surfaces extend, and a driver that drives the specified stage along the first and second movement reference surfaces.

17. The stage device of claim 16, wherein the actuator includes at least one of a mechanical actuator, an electromagnetic actuator, an actuator that converts electrical power to mechanical power, and an actuator using a vacuum.

18. The stage device of claim 16, wherein the driver includes a first actuator that drives the specified stage within the specified region and a second actuator that drives the specified stage outside of the specified region.

19. The stage device of claim 12, wherein the switching device switches between the first state in which the specified stage is supported over the first reference member due to a balance of a vacuum preload force and a hydrostatic pressure of pressurized gas between the specified stage and the first reference member, and the second state in which the specified stage is supported over the second reference member due to a balance of a vacuum preload force and a hydrostatic pressure of pressurized gas between the specified stage and the second reference member.

20. The stage device of claim 12, wherein a roughness of the second movement reference surface is greater than a roughness of the first movement reference surface.

21. An exposure apparatus that exposes a substrate with an energy beam to transfer a predetermined pattern onto the substrate, the exposure apparatus comprising:

the stage device of claim 12, wherein the substrate is held by the first and second stages; and wherein the specified region is a moving region of the first and second stages during exposure of the substrate, and at least part of a region outside the specified region is a moving region of the first and second stages when at least one of alignment of the substrate and substrate replacement is performed on the first and second stages.

22. The exposure apparatus of claim 21, wherein the first and second stages each have a moving table on which the substrate is mounted, and a moving guide that drives the moving table in a first direction and can move in a second direction perpendicular to the first direction; and further comprising:

a controller that causes one of the moving tables on which alignment of the substrate is completed to wait near a position at which exposure is performed while the substrate on the other moving table is being exposed.

23. A method of manufacturing a device including a lithography process that performs exposure using the exposure apparatus of claim 21.

24. A stage device comprising:

a first stage that moves within a first region that includes a specified region;

a second stage that moves within a second region that includes the specified region; and a stage base having a first movement reference surface, a second movement reference surface and a third movement reference surface mounted thereon, the first movement reference surface is used as a reference when the first and second stages move within the specified region, and the second and third movement reference surfaces are positioned on opposite sides of the first movement reference surface, the second and third reference surfaces are used as references when the first and second stages move outside of the specified region;

wherein a surface accuracy of the second and third movement reference surfaces is rougher than a surface accuracy of the first movement reference surface.

25. The stage device of claim 24, further comprising:

a clearance changing device that changes a clearance between the first and second stages and the first movement reference surface when the first and second stages move within the specified region and a clearance between the first and second stages and the second and third movement reference surfaces when the first and second stages move outside of the specified region.

26. The stage device of claim 24, further comprising:

first and second actuators that respectively drive the first and second stages along the first movement reference surface; and third and fourth actuators that are arranged independently from the first and second actuators and respectively drive the first and second stages along the second and third movement reference surfaces.

27. The stage device of claim 26, wherein:

the first and third actuators are linear motors that share a common movable part and have different stationary parts;

the second and fourth actuators are linear motors that share a common movable part and have different stationary parts; and the first and second actuators use the same stationary part.

28. An exposure apparatus that exposes a substrate with an energy beam to transfer a predetermined pattern onto the substrate, the exposure apparatus comprising:

the stage device of claim 24, wherein the substrate is held by the first and second stages; and wherein the specified region is a moving region of the first and second stages during exposure of the substrate, and at least part of a region outside the specified region is a moving region of the first and second stages when at least one of alignment of the substrate and substrate replacement is performed on the first and second stages.

29. The exposure apparatus of claim 28, wherein the first and second stages each have a moving table on which the substrate is mounted, and a moving guide that drives the moving table in a first direction and can move in a second direction perpendicular to the first direction; and further comprising:

a controller that causes one of the moving tables on which alignment of the substrate is completed to wait near a position at which exposure is performed while the substrate on the other moving table is being exposed.

30. A method of manufacturing a device including a lithography process that performs exposure using the exposure apparatus of claim 28.

31. A method of moving an object held by a stage, the method comprising:

providing a first reference member having a first movement reference surface that movably supports the movable stage and is used as a reference when the stage moves the object in a specified region;

providing a second reference member having a second movement reference surface, different from the first movement reference surface; and switching between a first state in which the stage can move along the first movement reference surface, and a second state in which the stage can move along the second movement reference surface.

32. The method of claim 31, further comprising:

providing a first driver that moves the movable stage along the first movement reference surface; and providing a second driver that is different from the first driver to move the movable stage along the second movement reference surface.

33. The method of claim 31, wherein the first reference member is a holding plate and the second reference member is a pair of guides.

34. The method of claim 31, wherein the switching step includes moving at least one of the first and second reference members in a direction perpendicular to a direction in which the first and second movement reference surfaces extend when the stage is switched between the first and second states.

35. The method of claim 31, wherein the switching step switches between the first state in which the stage is supported over the first reference member due to a balance of a vacuum preload force and a hydrostatic pressure of pressurized gas between the stage and the first reference member, and the second state in which the stage is supported over the second reference member due to a balance of a vacuum preload force and a hydrostatic pressure of pressurized gas between the stage and the second reference member.

36. The method of claim 31, wherein a roughness of the second movement reference surface is greater than a roughness of the first movement reference surface.

37. The method of claim 31, wherein the first reference member is located in a first region that includes the specified region, the second reference member is located in a second region that partially overlaps the first region, and the stage is movable within the first and second regions such that when the stage is in the first state and is located in the specified region, the stage is only supported with respect to the first movement reference surface, and when the stage is in the second state and is located in one part of the second region, the stage is only supported with respect to the second movement reference surface.

38. The method of claim 31, further comprising exposing a substrate held as the object on the stage with an energy beam to transfer a predetermined pattern onto the substrate.

39. The method of claim 38, wherein the first reference member is located in a region where the substrate moves during the exposure of the substrate, and at least a part of the second reference member is located in a region where at least one of alignment of the substrate and substrate replacement is performed with respect to the stage.

40. A stage device comprising:

a movable stage for holding an object;

first reference means for movably supporting the movable stage and acting as a reference when the movable stage moves;

second reference means, different from the first reference means, for movably supporting the movable stage and acting as a reference when the movable stage moves over the second reference means;

first moving means for moving the movable stage over the first reference means;

second moving means for moving the movable stage over the second reference means; and switching means for switching between a first state in which the movable stage moves along the first reference means, and a second state in which the movable stage moves along the second reference means.

41. A stage device comprising:

a first stage that moves within a first region that includes a specified region;

a second stage that moves within a second region that includes the specified region;

first reference means located in the specified region, the first reference means for movably supporting the first and second stages and acting as a reference when the first and second stages are located in the specified region;

second reference means located outside of the specified region, the second reference means acting as a reference and for supporting a specified stage, the specified stage being at least one stage of the first and second stages;

first moving means for moving the specified stage over the first reference means;

second moving means for moving the specified stage over the second reference means; and switching means for switching between a first state in which the specified stage moves along the first reference means in the specified region, and a second state in which the specified stage moves along the second reference means outside of the specified region.

* * * * *